(12) United States Patent　(10) Patent No.: US 12,696,561 B2

Kubo et al.　(45) Date of Patent: Jul. 28, 2026

(54) SOLID-STATE IMAGING DEVICE AND METHOD FOR MANUFACTURING SAME

(71) Applicant: SONY SEMICONDUCTOR SOLUTIONS CORPORATION, Kanagawa (JP)

(72) Inventors: Norihiro Kubo, Kanagawa (JP); Ikumi Takeda, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 269 days.

(21) Appl. No.: 18/253,634

(22) PCT Filed: Nov. 11, 2021

(86) PCT No.: PCT/JP2021/041593
　§ 371 (c)(1),
　(2) Date: May 19, 2023

(87) PCT Pub. No.: WO2022/113757

PCT Pub. Date: Jun. 2, 2022

(65) Prior Publication Data

US 2024/0014229 A1　Jan. 11, 2024

(30) Foreign Application Priority Data

Nov. 30, 2020　(JP) ................................. 2020-198723

(51) Int. Cl.
　*H10F 39/00*　(2025.01)
　*H10F 39/18*　(2025.01)
(52) U.S. Cl.
　CPC ....... *H10F 39/8037* (2025.01); *H10F 39/014* (2025.01); *H10F 39/18* (2025.01); *H10F 39/8033* (2025.01)

(58) Field of Classification Search
　CPC .... H10F 39/8037; H10F 39/014; H10F 39/18; H10F 39/8033; H10F 39/199;
　(Continued)

(56) References Cited

U.S. PATENT DOCUMENTS 10,741,593 B1 * 8/2020 Mabuchi .............. H04N 25/771
2011/0187911 A1 8/2011 Shinohara
(Continued)

FOREIGN PATENT DOCUMENTS

JP 2010-114273 5/2010
JP 2011-159756 8/2011
(Continued)

OTHER PUBLICATIONS

International Search Report and Written Opinion prepared by the Japan Patent Office on Feb. 1, 2022, for International Application No. PCT/JP2021/041593, 2 pgs.

*Primary Examiner* — Twyler L Haskins
*Assistant Examiner* — John H Morehead, III
(74) *Attorney, Agent, or Firm* — SHERIDAN ROSS P.C.

(57) ABSTRACT

To suppress deterioration of imaging characteristics. A solid-state imaging device includes a photoelectric conversion section provided inside a semiconductor substrate, the photoelectric conversion section being configured to generate electric charges in accordance with an amount of received light, a plurality of vertical transfer gates arranged between the photoelectric conversion section and one principal surface of the semiconductor substrate in a depth direction of the semiconductor substrate and spaced apart from each other in a direction along a substrate surface of the semiconductor substrate, the plurality of vertical transfer gates each being configured to control transfer of the electric charges generated by the photoelectric conversion section, and an electric charge storage section disposed between the (Continued)

plurality of vertical transfer gates, the electric charge storage section being configured to store the electric charges transferred by the plurality of vertical transfer gates.

22 Claims, 43 Drawing Sheets

(58) Field of Classification Search
CPC ................. H10F 39/813; H10F 39/802; H10F 39/80373; H10F 30/221; H10F 77/14
See application file for complete search history.

(56) References Cited

U.S. PATENT DOCUMENTS

2013/0314575 A1    11/2013    Shinohara

| | | | | |
|---|---|---|---|---|
| 2015/0243763 | A1* | 8/2015 | Cheng | H10D 64/514 |
| | | | | 438/300 |
| 2016/0343751 | A1* | 11/2016 | Sze | H10F 39/8053 |
| 2017/0200759 | A1* | 7/2017 | Ihara | H10F 39/807 |
| 2018/0294300 | A1 | 10/2018 | Ishida et al. | |
| 2018/0294304 | A1* | 10/2018 | Janssens | H10F 39/18 |
| 2019/0378864 | A1* | 12/2019 | Innocent | H04N 25/532 |
| 2020/0135781 | A1* | 4/2020 | Nakagawa | H10F 39/80373 |
| 2020/0235146 | A1* | 7/2020 | Yoshita | H10F 39/80373 |
| 2020/0381465 | A1* | 12/2020 | Lin | H10F 39/8063 |

FOREIGN PATENT DOCUMENTS

| | | |
|---|---|---|
| JP | 2018-190797 | 11/2018 |
| KR | 20090127828 A | 12/2009 |
| KR | 20200002815 A | 1/2020 |
| WO | WO 2017/057277 | 4/2017 |

* cited by examiner

SOLID-STATE IMAGING DEVICE AND METHOD FOR MANUFACTURING SAME

CROSS REFERENCE TO RELATED APPLICATIONS

This application is a national stage application under 35 U.S.C. 371 and claims the benefit of PCT Application No. PCT/JP2021/041593, having an international filing date of 11 Nov. 2021, which designated the United States, which PCT application claimed the benefit of Japanese Patent Application No. 2020-198723, filed 30 Nov. 2020, the entire disclosures of each of which are incorporated herein by reference.

TECHNICAL FIELD

An embodiment according to the present disclosure relates to a solid-state imaging device and a method for manufacturing the same.

BACKGROUND ART

A solid-state imaging device of a complementary metal-oxide-semiconductor (CMOS) type has a configuration where one pixel includes a photodiode (hereinafter, referred to as PD) and a plurality of MOS transistors, and the plurality of pixels is arranged in a required pattern. The PD is a photoelectric conversion element that generates and stores signal electric charges according to an amount of received light, and the plurality of MOS transistors is configured to transfer the signal electric charges from the PD. In such pixels, the signal electric charges are produced by illuminated light, and the signal electric charges thus produced are output as a pixel signal for each pixel. The pixel signal output as described above is processed by a predetermined signal processing circuit and is output to the outside as a video signal.

Recent progress in pixel miniaturization may require a pixel sharing system in order to provide a necessary PD area. In the pixel sharing system, for example, some MOS transistors are shared by a plurality of pixels. This pixel sharing system makes the capacity of floating diffusion (hereinafter, referred to as FD) larger, and conversion efficiency decreases accordingly. That is, the saturation electric charge capacity (Qs) and the conversion efficiency have a trade-off relation. Therefore, it has been proposed to form an embedded PD and read out signal electric charges stored in the PD through a vertical transfer gate electrode (see Patent Document 1).

CITATION LIST

Patent Document

Patent Document 1: Japanese Patent Application Laid-Open No. 2010-114273

SUMMARY OF THE INVENTION

Problems to be Solved by the Invention

Recent multi-functionalization of CMOS image sensors, however, causes an increase in the number of MOS transistors required in one pixel. Therefore, even if the embedded PD is employed, the MOS transistors cannot be contained in one pixel, and there may be no choice but to employ pixel sharing. As a result, the conversion efficiency decreases due to the above-described trade-off relation. Furthermore, in a case where the FD is provided next to the vertical transfer gate electrode, the electric charges generated by the PD normally flow in a direction orthogonal to a substrate surface and then flow in a direction parallel to the substrate surface through the vertical transfer gate electrode. That is, it is necessary to bend a transfer direction of the electric charges. In this case, a transfer path becomes long, which makes the transfer prone to failure. As described above, the pixel miniaturization or the increase in the number of MOS transistors in one pixel causes deterioration of imaging characteristics of the CMOS image sensor.

It is therefore an object of the present disclosure to provide a solid-state imaging device capable of suppressing deterioration of imaging characteristics, and a method for manufacturing the same.

Solutions to Problems

In order to solve the above-described problems, according to the present disclosure, provided is a solid-state imaging device including:

a photoelectric conversion section provided inside a semiconductor substrate, the photoelectric conversion section being configured to generate electric charges in accordance with an amount of received light;

a plurality of vertical transfer gates arranged between the photoelectric conversion section and one principal surface of the semiconductor substrate in a depth direction of the semiconductor substrate and spaced apart from each other in a direction along a substrate surface of the semiconductor substrate, the plurality of vertical transfer gates each being configured to control transfer of the electric charges generated by the photoelectric conversion section; and an electric charge storage section disposed between the plurality of vertical transfer gates, the electric charge storage section being configured to store the electric charges transferred by the plurality of vertical transfer gates.

The solid-state imaging device may further include a plurality of planar transfer gates arranged on the one principal surface of the semiconductor substrate along the one principal surface, the plurality of planar transfer gates being each electrically connected to a corresponding one of the plurality of vertical transfer gates.

The plurality of planar transfer gates may be arranged to electrically connect to each other so as to cover at least a part of an outer periphery of the electric charge storage section as viewed from a normal direction of the substrate surface of the semiconductor substrate.

As viewed from the normal direction, an outer edge of the plurality of planar transfer gates electrically connected to each other may have a polygonal shape.

According to the present disclosure, provided is a solid-state imaging device including:

a photoelectric conversion section provided inside a semiconductor substrate, the photoelectric conversion section being configured to generate electric charges in accordance with an amount of received light;

a plurality of transfer gates arranged between the photoelectric conversion section and one principal surface of the semiconductor substrate in a depth direction of the semiconductor substrate and spaced apart from each other in a direction along a substrate surface of the semiconductor substrate, the plurality of vertical transfer gates each being configured to control transfer of the electric charges generated by the photoelectric conversion section, the plurality of vertical transfer gates being arranged apart from each other with an electric charge transfer region through which the electric charges generated by the photoelectric conversion section are transferred interposed between the plurality of vertical transfer gates; and an electric charge storage section disposed adjacent to the one principal surface of the semiconductor substrate relative to the plurality of vertical transfer gates, the electric charge storage section being configured to store the electric charges transferred from the electric charge transfer region.

The solid-state imaging device may further include a semiconductor layer disposed on a side of the one principal surface remote from the plurality of vertical transfer gates, and the electric charge storage section may be disposed inside the semiconductor layer.

A crystal orientation of a semiconductor crystal of the semiconductor layer may correspond to a crystal orientation of a semiconductor crystal of the semiconductor substrate.

The plurality of vertical transfer gates may be arranged at positions deeper than the one principal surface in the semiconductor substrate, and the electric charge storage section may be disposed between the one principal surface and surfaces of the plurality of vertical transfer gates adjacent to the one principal surface.

The photoelectric conversion section may be provided so as to partially protrude into the electric charge transfer region between the plurality of vertical transfer gates.

A material of the electric charge transfer region may be higher in mobility of the electric charges than a material of the semiconductor substrate.

The plurality of vertical transfer gates may be arranged to electrically connect to each other so as to cover at least a part of an outer periphery of the electric charge storage section as viewed from a normal direction of the substrate surface of the semiconductor substrate.

The electric charge storage section may be disposed inside an outer edge of the photoelectric conversion section as viewed from a normal direction of the substrate surface of the semiconductor substrate.

The electric charge storage section may be disposed approximately at a center of the photoelectric conversion section as viewed from the normal direction.

The electric charge storage section and the plurality of vertical transfer gates may be provided for each photoelectric conversion section.

According to the present disclosure, provided is a method for manufacturing a solid-state imaging device, the method including:

forming a photoelectric conversion section inside a semiconductor substrate, the photoelectric conversion section being configured to generate electric charges in accordance with an amount of received light;

forming a plurality of transfer gates arranged between the photoelectric conversion section and one principal surface of the semiconductor substrate in a depth direction of the semiconductor substrate and spaced apart from each other in a direction along a substrate surface of the semiconductor substrate, the plurality of vertical transfer gates each being configured to control transfer of the electric charges generated by the photoelectric conversion section, the plurality of vertical transfer gates being arranged apart from each other with an electric charge transfer region through which the electric charges generated by the photoelectric conversion section are transferred interposed between the plurality of vertical transfer gates; and forming an electric charge storage section disposed adjacent to the one principal surface of the semiconductor substrate relative to the plurality of vertical transfer gates, the electric charge storage section being configured to store the electric charges transferred from the electric charge transfer region.

The method for manufacturing a solid-state imaging device may further include:

forming, before forming the electric charge storage section, a semiconductor layer disposed on a side of the one principal surface remote from the plurality of vertical transfer gates; and forming the electric charge storage section inside the semiconductor layer.

The method for manufacturing a solid-state imaging device may further include epitaxially growing a semiconductor crystal to form the semiconductor layer.

The method for manufacturing a solid-state imaging device may further include: forming the plurality of vertical transfer gates at positions deeper than the one principal surface in the semiconductor substrate; and forming, after forming the plurality of vertical transfer gates, the electric charge storage section between the one principal surface and surfaces of the plurality of vertical transfer gates adjacent to the one principal surface.

The method for manufacturing a solid-state imaging device may further include forming, before forming the plurality of transfer gates, a material layer higher in mobility of the electric charges than a material of the semiconductor substrate in the electric charge transfer region.

The method for manufacturing a solid-state imaging device may further include forming the plurality of vertical transfer gates arranged to electrically connect to each other so as to cover an outer periphery of the electric charge storage section as viewed from a normal direction of the substrate surface of the semiconductor substrate.

The method for manufacturing a solid-state imaging device may further include forming the electric charge storage section inside an outer edge of the photoelectric conversion section as viewed from a normal direction of the semiconductor substrate.

The method for manufacturing a solid-state imaging device may further include forming the photoelectric conversion section by ion implantation.

BRIEF DESCRIPTION OF DRAWINGS

FIG. 3 is a schematic plan view of an example of a configuration of the solid-state imaging device according to the first embodiment.

FIG. 4 is a cross-sectional view of an example of a cross-sectional structure of the solid-state imaging device according to the first embodiment.

FIG. 15 is a schematic plan view of a ninth modification of the configuration of the solid-state imaging device according to the first embodiment.

FIG. 16 is a schematic plan view of a tenth modification of the configuration of the solid-state imaging device according to the first embodiment.

FIG. 17 is a cross-sectional view of an example of a cross-sectional structure of the solid-state imaging device in FIG. 16.

FIG. 19 is a cross-sectional view of an example of a cross-sectional structure of the solid-state imaging device according to the second embodiment.

MODE FOR CARRYING OUT THE INVENTION

Hereinafter, embodiments of a solid-state imaging device will be described with reference to the drawings. Main components of the solid-state imaging device will be mainly described below, but the solid-state imaging device may include components or functions that are not depicted or described. The following description is not intended to exclude such components or functions that are not depicted or described.

First Embodiment

[Overall Structure of Solid-State Imaging Device]

First, an overall structure of a CMOS solid-state imaging device to be described below, that is, a CMOS image sensor, will be described with reference to FIG. 1.

Figure 1:
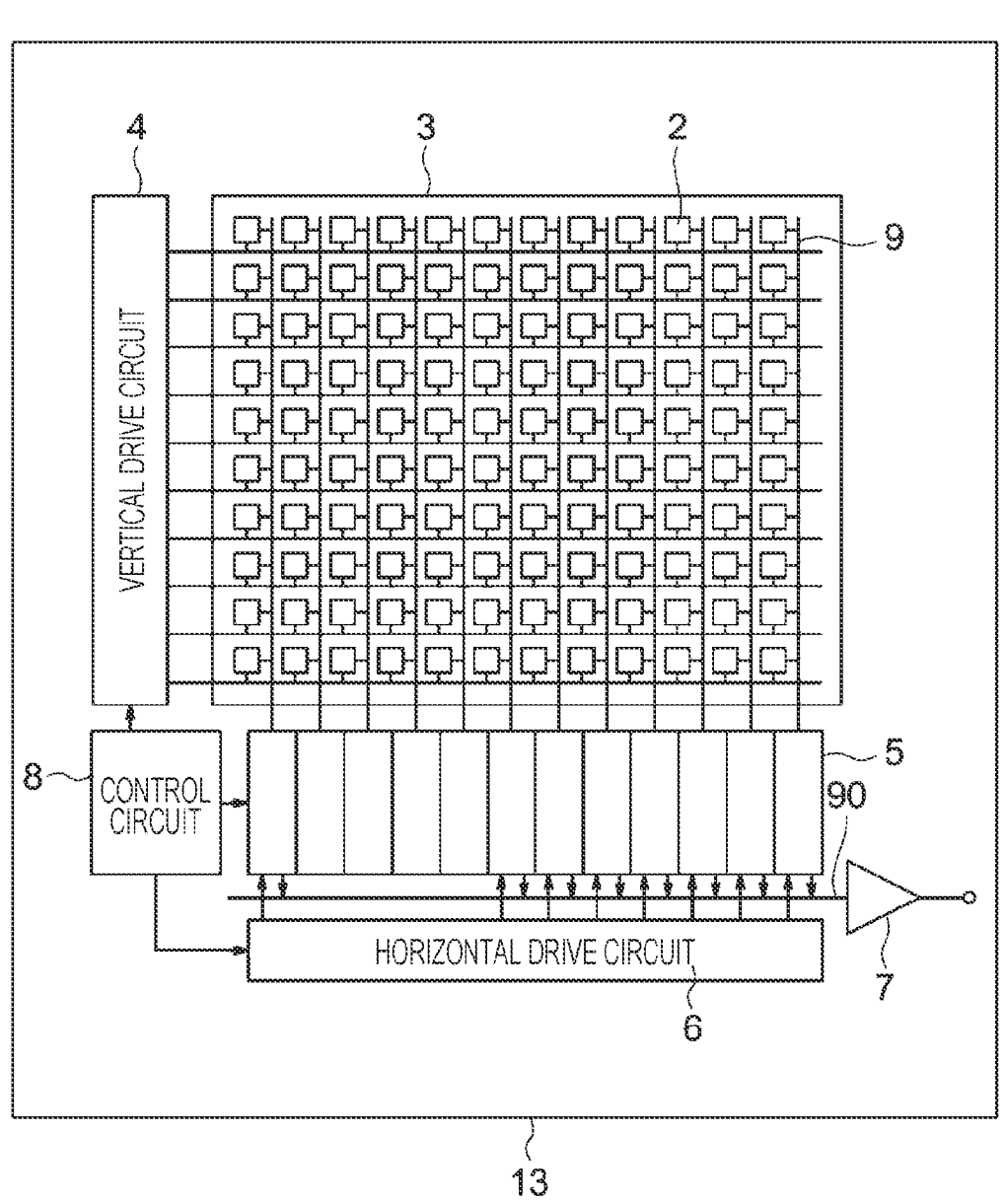
FIG. 1 is an overall configuration diagram of a solid-state imaging device according to a first embodiment.

A solid-state imaging device 1 depicted in FIG. 1 includes, for example, an imaging region 3 including a plurality of pixels 2 arranged on a semiconductor substrate 13 made from Si, a vertical drive circuit 4 as a peripheral circuit of the imaging region 3, a column signal processing circuit 5, a horizontal drive circuit 6, an output circuit 7, a control circuit 8, and the like.

The pixels 2 each include a photodiode serving as a photoelectric conversion element and a plurality of MOS transistors, and are regularly arranged in a two-dimensional array on the semiconductor substrate 13.

The imaging region 3 includes the plurality of pixels 2 regularly arranged in a two-dimensional array. Then, the imaging region 3 includes an effective pixel region that can actually receive light and store signal electric charges generated by photoelectric conversion, and a black reference pixel region that is formed around the effective pixel region and outputs optical black serving as a reference of a black level.

The control circuit 8 generates, on the basis of a vertical synchronization signal, a horizontal synchronization signal, and a master clock, a clock signal, a control signal, or the like in accordance with which the vertical drive circuit 4, the column signal processing circuit 5, the horizontal drive circuit 6, and the like operate. Then, the clock signal, the control signal, or the like generated by the control circuit 8 is input to the vertical drive circuit 4, the column signal processing circuit 5, the horizontal drive circuit 6, and the like.

The vertical drive circuit 4 includes, for example, a shift register, and selectively scans each pixel 2 in the imaging region 3 on a row-by-row basis in a vertical direction. Then, a pixel signal based on the signal electric charges generated according to the amount of received light in the photodiode of each pixel 2 is supplied to the column signal processing circuit 5 through a vertical signal line 9.

For example, the column signal processing circuit 5 is disposed for each column of the pixels 2, and performs, for each pixel column, signal processing such as noise elimination or signal amplification on signals output from the pixels 2 of one row using signals from the black reference pixel region (formed around the effective pixel region, although not depicted). A horizontal selection switch (not depicted) is provided between an output stage of the column signal processing circuit 5 and a horizontal signal line 90.

The horizontal drive circuit 6 includes, for example, a shift register, and sequentially selects each of the column signal processing circuits 5 by sequentially outputting a horizontal scanning pulse to cause the column signal processing circuit 5 to output the pixel signal to the horizontal signal line 90.

The output circuit 7 performs signal processing on the signal sequentially supplied from each of the column signal processing circuits 5 through the horizontal signal line 90, and outputs the signal thus processed.

[Configuration of Pixel]

Next, a configuration example of the pixel 2 will be described with reference to FIG. 2.

Figure 2:
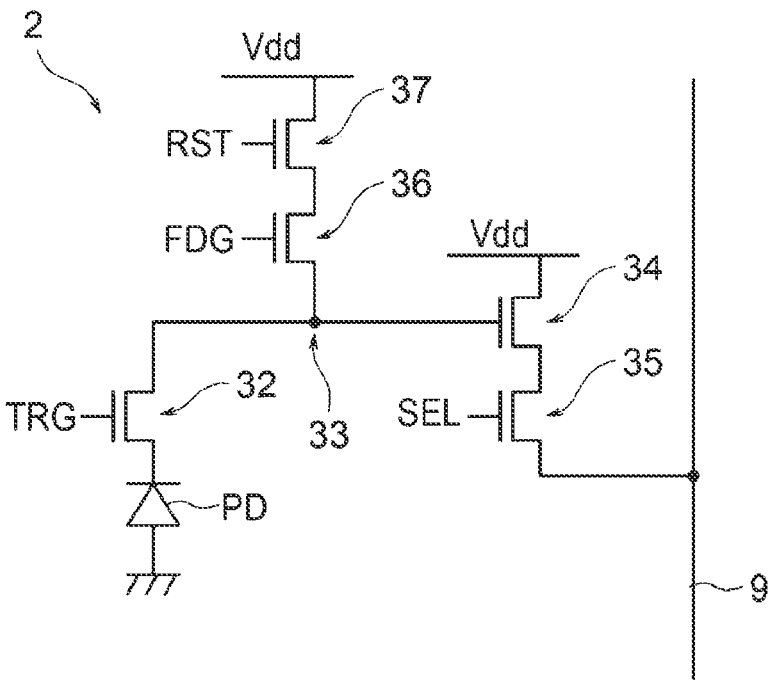
FIG. 2 is a circuit diagram depicting an example of a configuration of a pixel according to the first embodiment.

FIG. 2 is a circuit diagram depicting an example of the configuration of the pixel 2 according to the first embodiment.

As depicted in FIG. 2, the pixel 2 includes a photodiode PD, a transfer transistor 32, a floating diffusion (FD) section 33, an amplification transistor 34, a selection transistor 35, a connection transistor 36, and a reset transistor 37.

The photodiode PD is a photoelectric conversion section that converts incident light into electric charges by photoelectric conversion and stores the electric charges, and has an anode terminal grounded and a cathode terminal connected to the transfer transistor 32.

The transfer transistor 32 is driven in accordance with a transfer signal TRG supplied from the vertical drive circuit 4, and when the transfer transistor 32 is turned on, the electric charges stored in the photodiode PD are transferred to the FD section 33.

The FD section 33 is a floating diffusion region that is connected to a gate electrode of the amplification transistor 34 and has a predetermined storage capacity, and stores the electric charges transferred from the photodiode PD.

The amplification transistor 34 outputs a pixel signal having a level (that is, a potential of the FD section 33) corresponding to the electric charges stored in the FD section 33 to the vertical signal line 9 through the selection transistor 35. That is, the configuration where the FD section 33 is connected to the gate electrode of the amplification transistor 34 causes the FD section 33 and the amplification transistor 34 to function as a conversion section that converts the electric charges generated in the photodiode PD into a pixel signal having a level corresponding to the electric charges.

The selection transistor 35 is driven in accordance with a selection signal SEL supplied from the vertical drive circuit 4, and when the selection transistor 35 is turned on, the pixel signal output from the amplification transistor 34 can be output to the vertical signal line 9.

The connection transistor 36 is formed to connect the FD section 33 and the reset transistor 37, and can change the storage capacity for the electric charges converted into the pixel signal by the amplification transistor 34. That is, the connection transistor 36 is driven in accordance with a connection signal supplied from the vertical drive circuit 4 to switch from on to off or from off to on, thereby changing the storage capacity of the FD section 33. As a result, conversion efficiency in the amplification transistor 34 changes. That is, in a case where the connection transistor 36 is off, the storage capacity of the FD section 33 becomes small, and the conversion efficiency in the amplification transistor 34 becomes high. On the other hand, in a case where the connection transistor 36 is on, the storage capacity of the FD section 33 becomes large, and the conversion efficiency in the amplification transistor 34 becomes low.

The reset transistor 37 is driven in accordance with a reset signal RST supplied from the vertical drive circuit 4. When the reset transistor 37 is turned on, the electric charges stored in the FD section 33 are discharged to a drain power supply Vdd through the reset transistor 37 and the connection transistor 36, so as to reset the FD section 33.

The pixel 2 configured as described above can change the conversion efficiency in the amplification transistor 34 by turning on/off the connection transistor 36. It is therefore possible for the solid-state imaging device 1 to capture an image with appropriate brightness by changing the conversion efficiency in accordance with an exposure condition of a subject, for example.

[Configuration of Transfer Transistor and Peripheral Portion of Transfer Transistor]

Next, the photodiode PD, the transfer transistor 32, and the FD section 33 will be described in detail with reference to FIGS. 3 and 4. Note that, in FIG. 3 and subsequent drawings, the FD section 33 may also be referred to as a "floating diffusion region 11".

Figure 3:
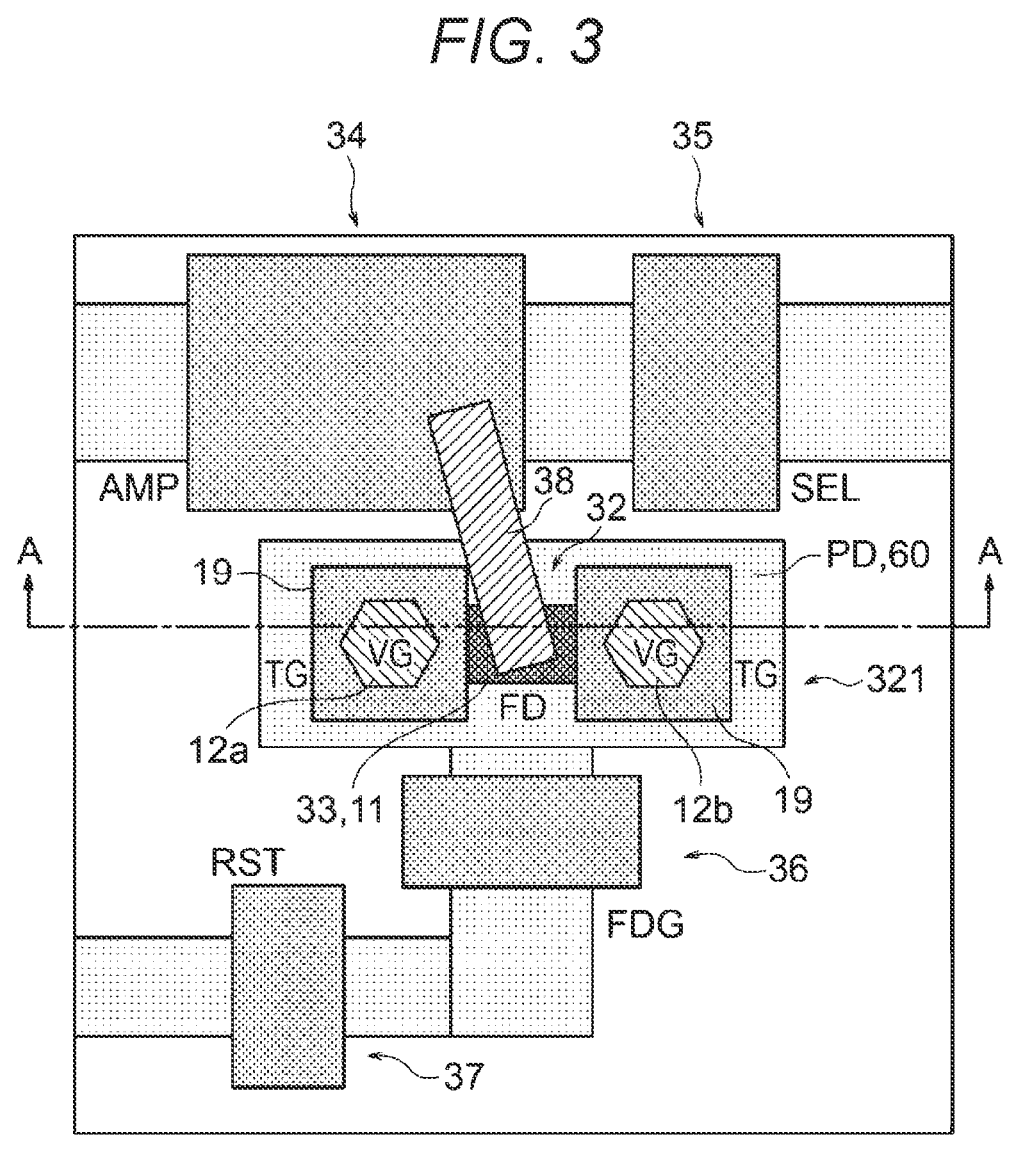

FIG. 3 is a schematic plan view of an example of a configuration of the solid-state imaging device 1 according to the first embodiment. FIG. 3 is a plan view of a main part of one pixel.

FIG. 3 depicts an example of arrangement of the photodiode PD, the transfer transistor 32, the FD section 33, the amplification transistor 34, the selection transistor 35, the connection transistor 36, and the reset transistor 37 depicted in FIG. 2.

Note that a photodiode region 60 depicted in FIG. 3 indicates a region where the photodiode PD is provided in a plan view of the photodiode PD provided in the semiconductor substrate 13 (as viewed from a normal direction of a substrate surface of the semiconductor substrate 13).

In the example depicted in FIG. 3, the photodiode region 60 has an approximately rectangular shape. The shape of the photodiode region 60, however, is not limited to such an approximately rectangular shape, and may be any type of shape such as a square shape or a polygonal shape.

The transfer transistor 32 is formed approximately at a center position of the photodiode PD. The transfer transistor 32 has a transfer gate 321. The transfer gate 321 includes two vertical gate electrodes 12a and 12b and a planar gate electrode 19.

As described with reference to FIG. 4, the vertical gate electrodes 12a and 12b are provided so as to extend in a depth direction from the semiconductor substrate 13 toward the photodiode PD.

The vertical gate electrodes 12a and 12b are arranged inside an outer edge of the photodiode region 60 as viewed from above. More specifically, the vertical gate electrodes 12a and 12b are arranged at a center of the photodiode region 60 as viewed from above. Furthermore, providing the two vertical gate electrodes 12a and 12b allows an increase in electric charge transfer efficiency.

The planar gate electrode 19 is provided on one principal surface S1 of the semiconductor substrate 13 with a gate insulating film 18 interposed between the planar gate electrode 19 and the one principal surface S1. The planar gate electrode 19 is integrally formed with each of the vertical gate electrodes 12a and 12b.

The FD section 33 is disposed inside the outer edge of the photodiode region 60 as viewed from above. More specifically, the FD section 33 is disposed approximately at a center of the photodiode region 60 as viewed from above. The FD section 33 is provided between the two vertical gate electrodes 12a and 12b. Furthermore, the FD section 33 is connected to the gate electrode of the amplification transistor 34 through an FD connection wire 38.

Figure 4:
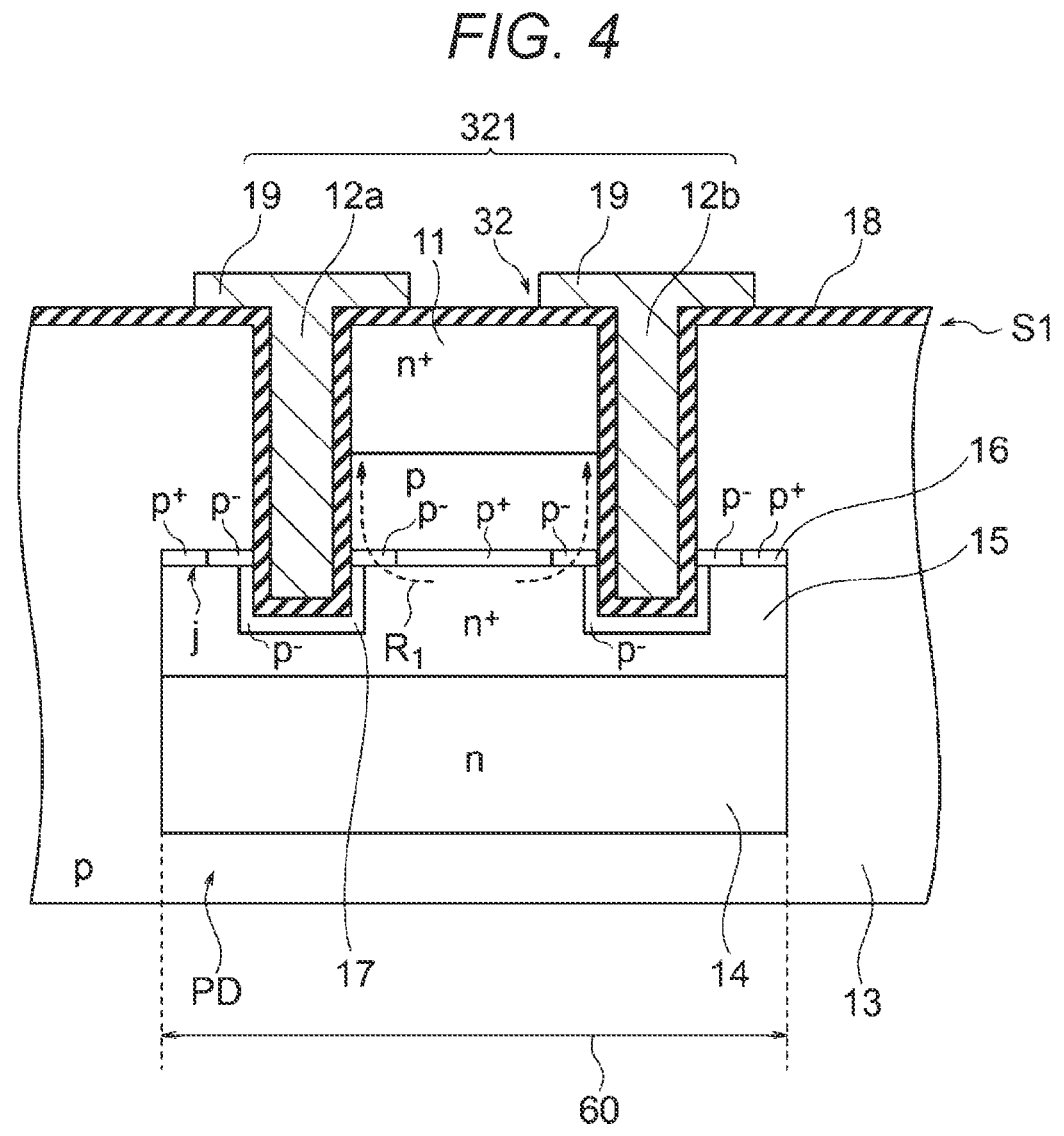

FIG. 4 is a cross-sectional view of an example of a cross-sectional structure of the solid-state imaging device 1 according to the first embodiment. FIG. 4 is a cross-sectional view of an example of a schematic configuration of the pixel 2 taken along a line A-A in FIG. 3.

As depicted in FIG. 4, the solid-state imaging device 1 according to the first embodiment includes the semiconductor substrate 13, the photodiode PD, and the transfer transistor 32, the photodiode PD and the transfer transistor 32 constituting each pixel formed in the semiconductor substrate 13.

The semiconductor substrate 13 is, for example, a p-type silicon substrate.

The photodiode PD includes, inside the semiconductor substrate 13, a doped n-type region (n region) 14, a heavily doped n-type region (n+ region) 15, and a heavily doped p-type region (p+ region) 16 that are formed in the order from a back surface side to a front surface side of the semiconductor substrate 13. The photodiode PD primarily includes a pn junction j that is an interface between the p+ region 16 and the n+ region 15.

The transfer transistor 32 is a MOS transistor that transfers the signal electric charges stored in the photodiode PD. The transfer transistor 32 includes the floating diffusion region 11 provided adjacent to the front surface side of the semiconductor substrate 13, and the vertical gate electrodes 12a and 12b formed in the depth direction from the front surface side of the semiconductor substrate 13 through the gate insulating film 18. The vertical gate electrodes 12a and 12b are formed so as to be in contact with the floating diffusion region 11 with the gate insulating film 18 interposed between the vertical gate electrodes 12a and 12b and the floating diffusion region 11 and to extend to a position deeper than the pn junction j of the photodiode PD. The vertical gate electrodes 12a and 12b and the planar gate electrode 19 included in the transfer gate 321 are made from, for example, polycrystalline silicon.

The transfer transistor 32 has a transfer channel formed so as to extend, in the depth direction of the semiconductor substrate 13 along the vertical gate electrodes 12a and 12b, from the pn junction j constituting the photodiode PD to the floating diffusion region 11.

The two vertical gate electrodes 12a and 12b are arranged between the photodiode PD and the one principal surface S1 in the depth direction of the semiconductor substrate 13 and are arranged apart from each other in a direction along the substrate surface of the semiconductor substrate 13.

The two planar gate electrodes 19 are arranged on the one principal surface S1 of the semiconductor substrate 13 along the one principal surface S1 and are each electrically connected to a corresponding one of the two vertical gate electrodes 12a and 12b.

The floating diffusion region 11 is formed by a heavily doped n-type region (n+) in a region adjacent to the front surface side of the semiconductor substrate 13 between the vertical gate electrodes 12a and 12b. The floating diffusion region 11 is shared by the two vertical gate electrodes 12a and 12b. In the example depicted in FIG. 4, the floating diffusion region 11 is provided so as to be in contact with the vertical gate electrodes 12a and 12b with the gate insulating film 18 interposed between the floating diffusion region 11 and the vertical gate electrodes 12a and 12b.

Furthermore, the solid-state imaging device 1 is, for example, a back-side illumination solid-state imaging device in which the back surface side of the semiconductor substrate 13 is illuminated with light.

As described above, the embedded photodiode PD is formed in the depth direction of the semiconductor substrate 13, and the signal electric charges stored in the photodiode PD are read out through the vertical gate electrodes 12a and 12b. This prevents, even with pixel miniaturization, a reduction in saturation electric charge capacity (Qs) and sensitivity of the photodiode PD. Furthermore, such back-side illumination allows the side illuminated with light to have neither a MOS transistor nor a wiring layer, so that it is possible to make an opening area larger.

[Driving Method]

A driving method applied to the solid-state imaging device 1 according to the present embodiment having the above-described configuration will be described.

First, a side where an on-chip lens of the solid-state imaging device is formed is illuminated with light L. Light condensed by the on-chip lens impinges on the photodiode PD in the semiconductor substrate 13.

The light incident on the photodiode PD is photoelectrically converted in the n region 14 and the pn junction j to generate signal electric charges in the photodiode PD. The signal electric charges thus generated are stored in a potential well formed in the n+ region 15. In the solid-state imaging device 1 according to the present embodiment, a negative voltage is applied to the vertical gate electrodes 12a and 12b during the storage of signal electric charges. Accordingly, a p− region 17 formed around bottoms of the vertical gate electrodes 12a and 12b and a bottom of the gate insulating film 18 causes holes to be pinned to the bottoms of the vertical gate electrodes 12a and 12b with the gate insulating film 18 interposed between the holes and the bottoms. As described above, the holes thus pinned cause hole pinning, so that dark current noise entering from the bottoms of the vertical gate electrodes 12a and 12b and the bottom of the gate insulating film 18 can be confined within the p− region 17 during the storage of signal electric charges. It is therefore possible to reduce dark current reaching the photodiode PD.

After the end of the storage of signal electric charges, a positive voltage is applied to the vertical gate electrodes 12a and 12b. Note that, for example, the same potential is applied to the two vertical gate electrodes 12a and 12b. Accordingly, the signal electric charges stored in the photodiode PD are transferred to the floating diffusion region 11 as indicated by an arrow R1 in FIG. 4. As a result, the signal electric charges are read out to the floating diffusion region 11. Here, as depicted in FIG. 4, the signal electric charges are transferred nearly vertically from the photodiode PD to the floating diffusion region 11. It is therefore possible to make a transfer path of the signal electric charges in the embedded photodiode PD shorter and thus enhance transfer characteristics.

Comparative Example

Figure 5:
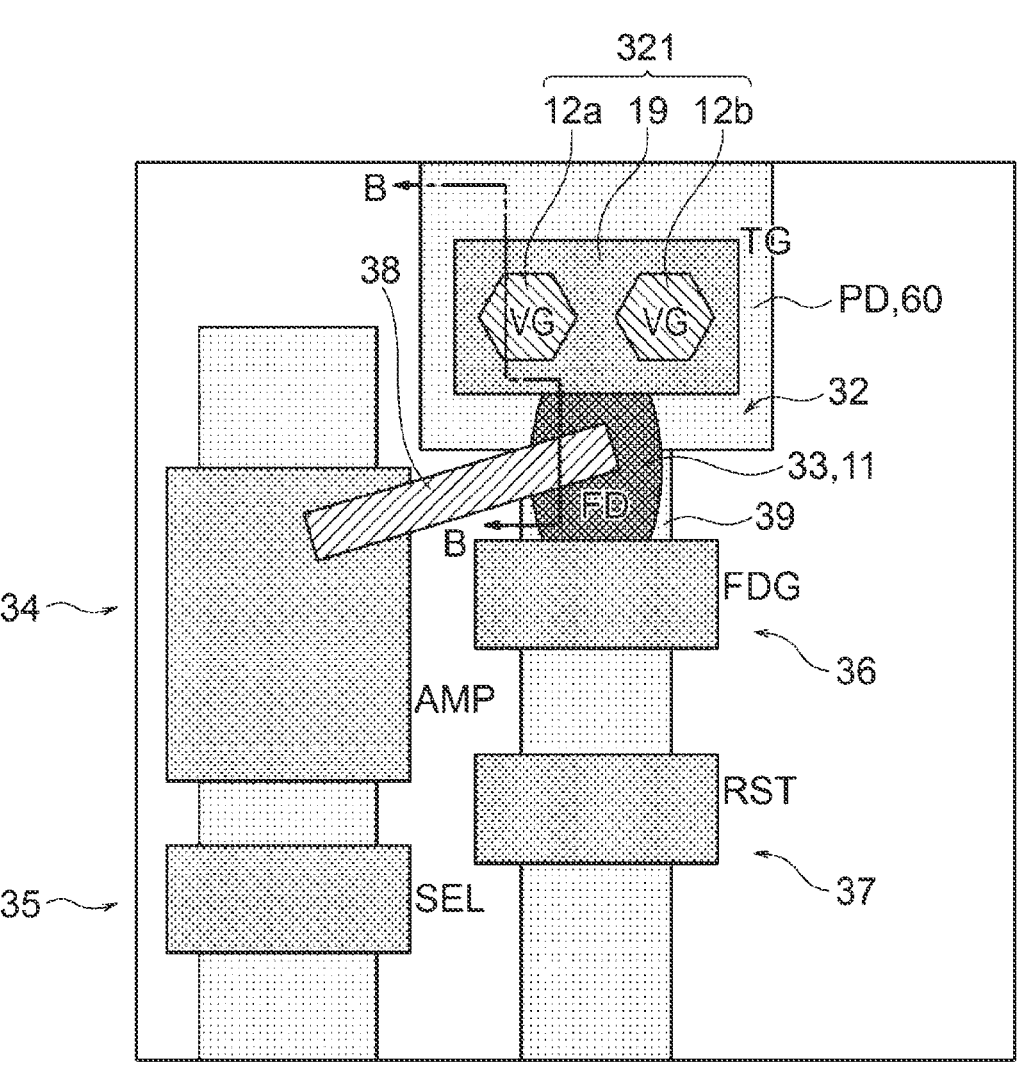
FIG. 5 is a schematic plan view of an example of a configuration of a solid-state imaging device according to a comparative example.

FIG. 5 is a schematic plan view of an example of a configuration of a solid-state imaging device 1 according to a comparative example. The comparative example is different from the first embodiment in the position of the FD section 33 (floating diffusion region 11). The positions of the other components including the photodiode PD, the transfer transistor 32, the amplification transistor 34, the selection transistor 35, the connection transistor 36, and the reset transistor 37 are approximately the same as in the first embodiment.

In the example depicted in FIG. 5, the floating diffusion region 11 is disposed in a diffusion layer 39 between the transfer transistor 32 and the connection transistor 36. Therefore, the floating diffusion region 11 is disposed at an end of the photodiode region 60.

Figure 6:
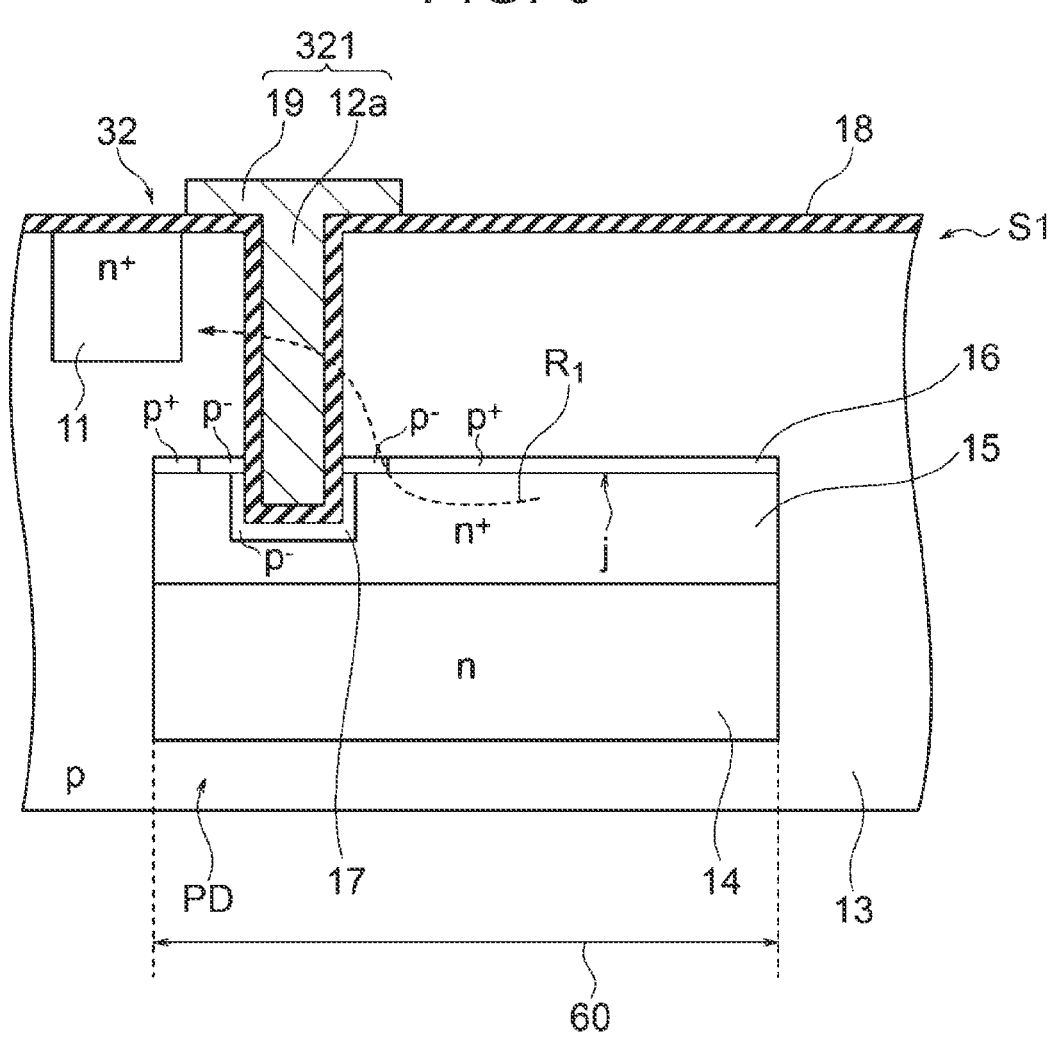
FIG. 6 is a cross-sectional view of an example of a cross-sectional structure of the solid-state imaging device according to the comparative example.

FIG. 6 is a cross-sectional view of an example of a cross-sectional structure of the solid-state imaging device 1 according to the comparative example. FIG. 6 is a cross-sectional view of an example of a schematic configuration of the pixel 2 taken along a line B-B in FIG. 5.

As described with reference to FIG. 5, the floating diffusion region 11 is disposed at the end of the photodiode region 60. Furthermore, the floating diffusion region 11 is disposed next to the vertical gate electrode 12a (in a horizontal direction).

When a positive voltage is applied to the vertical gate electrode 12a, signal electric charges are transferred to the floating diffusion region 11 as indicated by an arrow R1 in FIG. 6. Therefore, the signal electric charges flow vertically along the vertical gate electrode 12a and then flow laterally (in the horizontal direction) through the vertical gate electrode 12a. A transfer path of the electric charges is bent as described above, so that the transfer path becomes long, which makes the transfer prone to failure.

On the other hand, according to the first embodiment, the floating diffusion region 11 is disposed between the vertical gate electrodes 12a and 12b. Accordingly, as depicted in FIG. 4, the signal electric charges are transferred to the floating diffusion region 11 nearly vertically along the vertical gate electrodes 12a and 12b. This eliminates the need for transferring the signal electric charges in the horizontal direction, so that it is possible to make the transfer path shorter. It is therefore possible to make the transfer of the signal electric charges less prone to failure and suppress deterioration of imaging characteristics.

Furthermore, since it is not necessary to move the signal electric charges in the horizontal direction, a potential gradient for transferring the signal electric charges in the lateral direction need not be provided in the semiconductor substrate 13 below the transfer gate 321. The potential gradient is formed by, for example, an ion implantation process (ion implantation). It is therefore possible to eliminate, according to the first embodiment, the need of the ion implantation process for forming the potential gradient.

Furthermore, since it is not necessary to move the signal electric charges in the horizontal direction, it is possible to allocate a transfer margin to the saturation electric charge capacity Qs of the photodiode PD by increasing the area of the photodiode region 60, for example. It is therefore possible to increase the saturation electric charge capacity Qs of the photodiode PD.

Furthermore, not only the signal electric charges need not move in the horizontal direction, but also the arrangement space of the floating diffusion region 11 and the vertical gate electrodes 12a and 12b overlaps the photodiode region 60. It is therefore possible to arrange, in an easier manner, transistors other than the transfer transistor 32 in a pixel cell subjected to miniaturization. As a result, fine pixels including more transistors can be obtained.

Recent progress in pixel miniaturization may require a pixel sharing system in order to provide a necessary PD area. Such a pixel sharing system, however, causes an increase in the capacity of the FD section 33, and the conversion efficiency decreases accordingly. That is, the saturation electric charge capacity and the conversion efficiency have a trade-off relation. Therefore, an embedded photodiode has been proposed. Recent multi-functionalization of CMOS image sensors, however, causes an increase in the number of MOS transistors required in one pixel. Therefore, even if the embedded PD is employed, the MOS transistors cannot be contained in one pixel, and there may be no choice but to employ pixel sharing. As a result, the conversion efficiency decreases due to the above-described trade-off relation.

On the other hand, according to the first embodiment, it is possible to obtain a fine pixel including more transistors without using the pixel sharing system. It is therefore possible to perform design on the basis of non-pixel sharing system. That is, the floating diffusion region 11 and the vertical gate electrodes 12a and 12b are provided for each photodiode PD. As a result, it is possible to suppress a decrease in conversion efficiency due to the pixel sharing system.

Furthermore, as depicted in FIG. 3, according to the first embodiment, two transfer gates 321 are provided on the left and right of the floating diffusion region 11. It is therefore possible to manufacture the solid-state imaging device 1 robustly against misalignment in a left-right direction and variations in line width of the transfer gates 321 and makes the transfer less prone to failure. As a result, it is possible to enhance yield and image quality.

Furthermore, the floating diffusion region 11 and the vertical gate electrodes 12a and 12b are arranged inside the outer edge of the photodiode region 60 as viewed from above. It is therefore possible to cause the signal electric charges to transfer nearly vertically from the photodiode PD to the floating diffusion region 11 located immediately above the photodiode PD.

Modification of First Embodiment

Next, modifications of a structure of the transfer gates 321 and a structure of a peripheral portion of the transfer gates 321 will be described.

Figure 7:
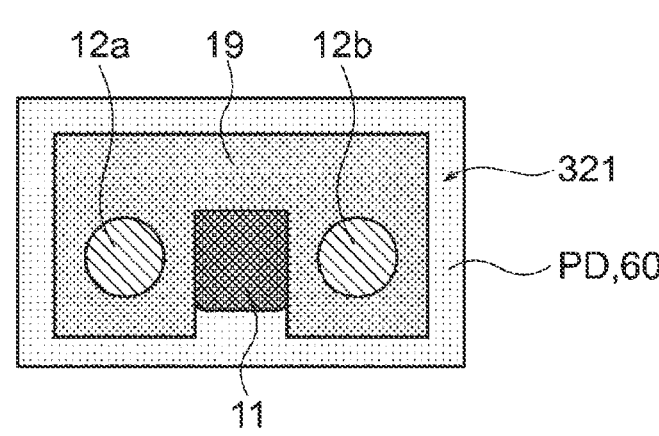
FIG. 7 is a schematic plan view of a first modification of the configuration of the solid-state imaging device according to the first embodiment.

FIG. 7 is a schematic plan view of a first modification of the configuration of the solid-state imaging device 1 according to the first embodiment. Note that FIG. 7 depicts a layout within the photodiode region 60.

In the example depicted in FIG. 7, as compared with FIG. 3 of the first embodiment, the two planar gate electrodes 19 corresponding to the two vertical gate electrodes 12a and 12b are connected to each other so as to have an approximately U shape as viewed from above. The floating diffusion region 11 is disposed in a U-shaped recess. That is, the planar gate electrodes 19 are electrically connected to each other so as to cover a part of an outer periphery of the floating diffusion region 11 as viewed from above. In the example depicted in FIG. 7, as in the first embodiment, the two vertical gate electrodes 12a and 12b are arranged inside the photodiode region 60, and the floating diffusion region 11 is disposed between the two vertical gate electrodes 12a and 12b.

Figure 8:
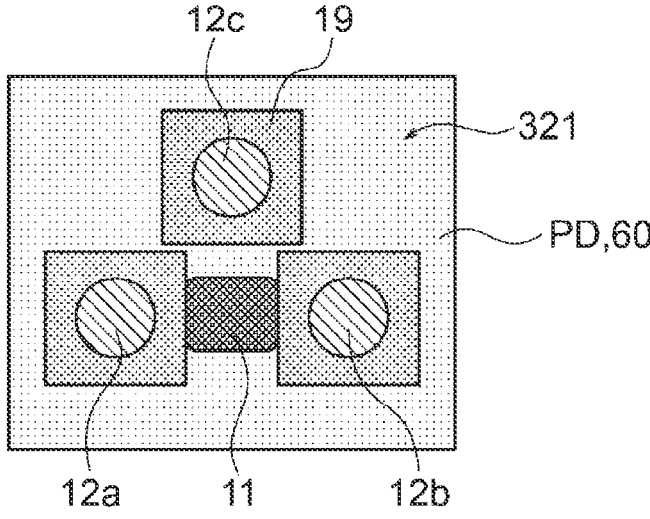
FIG. 8 is a schematic plan view of a second modification of the configuration of the solid-state imaging device according to the first embodiment.

FIG. 8 is a schematic plan view of a second modification of the configuration of the solid-state imaging device 1 according to the first embodiment.

In the example depicted in FIG. 8, as compared with FIG. 3 of the first embodiment, a vertical gate electrode 12 c is further provided inside the photodiode region 60. Furthermore, a planar gate electrode 19 integrally formed with the vertical gate electrode 12c is further provided. In the example depicted in FIG. 8, the vertical gate electrodes 12a to 12c are arranged in an approximately triangular shape. In the example depicted in FIG. 8, the three vertical gate electrodes 12a to 12c are arranged inside the photodiode region 60, and the floating diffusion region 11 is disposed between the two vertical gate electrodes 12a and 12b.

Figure 9:
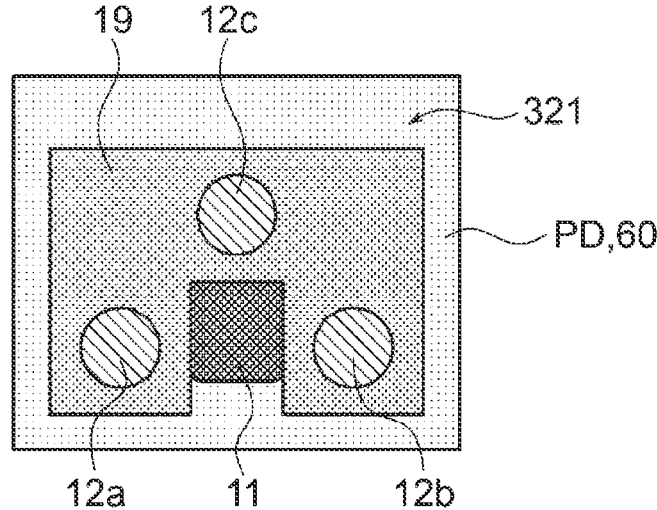
FIG. 9 is a schematic plan view of a third modification of the configuration of the solid-state imaging device according to the first embodiment.

FIG. 9 is a schematic plan view of a third modification of the configuration of the solid-state imaging device 1 according to the first embodiment.

In the example depicted in FIG. 9, as compared with FIG. 8 of the second modification, the three planar gate electrodes 19 corresponding to the three vertical gate electrodes 12a to 12c are connected to each other so as to have an approximately U shape as viewed from above. In the example depicted in FIG. 9, the three vertical gate electrodes 12a to 12c are arranged inside the photodiode region 60, and the floating diffusion region 11 is disposed between the two vertical gate electrodes 12a and 12b.

Figure 10:
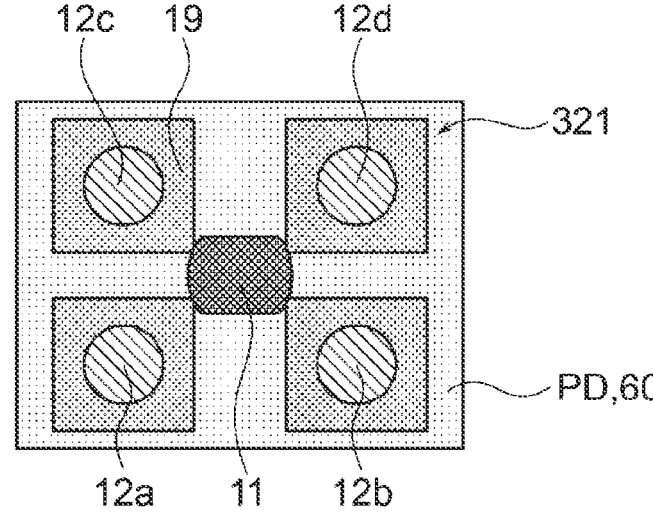
FIG. 10 is a schematic plan view of a fourth modification of the configuration of the solid-state imaging device according to the first embodiment.

FIG. 10 is a schematic plan view of a fourth modification of the schematic configuration of the solid-state imaging device 1 according to the first embodiment.

In the example depicted in FIG. 10, as compared with FIG. 3 of the first embodiment, two vertical gate electrodes 12c and 12d are further provided. Furthermore, a planar gate electrode 19 integrally formed with each of the two vertical gate electrodes 12c and 12d is further provided. The four vertical gate electrodes 12a to 12d are arranged in an X shape around the floating diffusion region 11. Therefore, the number of vertical gate electrodes is not limited to two, and may be three or more. In the example depicted in FIG. 10, the four vertical gate electrodes 12a to 12d are arranged inside the photodiode region 60, and the floating diffusion region 11 is disposed among the four vertical gate electrodes 12a to 12d.

Figure 11:
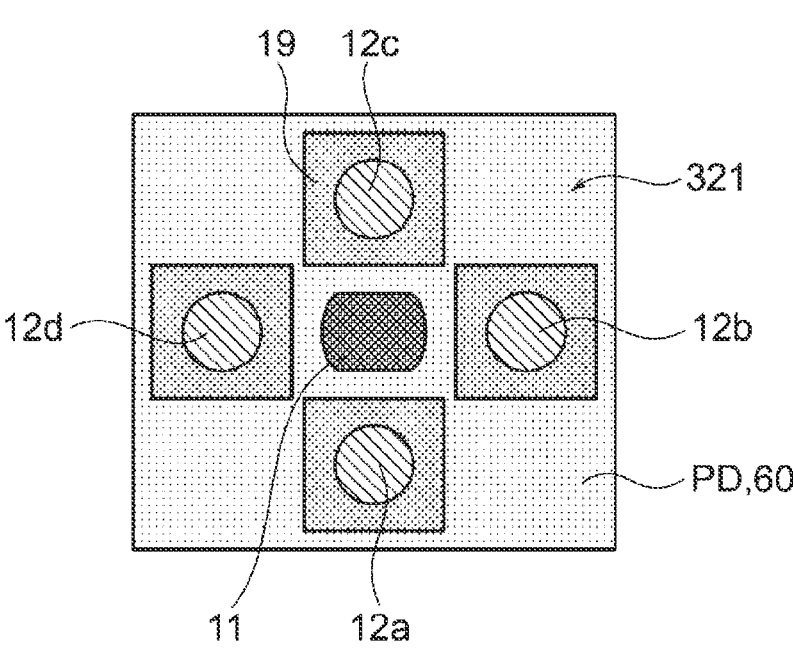
FIG. 11 is a schematic plan view of a fifth modification of the configuration of the solid-state imaging device according to the first embodiment.

FIG. 11 is a schematic plan view of a fifth modification of the configuration of the solid-state imaging device 1 according to the first embodiment.

In the example depicted in FIG. 11, as compared with FIG. 10 of the fourth modification, the four vertical gate electrodes 12a to 12d are arranged in a cross shape around the floating diffusion region 11. In the example depicted in FIG. 11, as in the fourth modification, the four vertical gate electrodes 12a to 12d are arranged inside the photodiode region 60, and the floating diffusion region 11 is disposed among the four vertical gate electrodes 12a to 12d.

Figure 12:
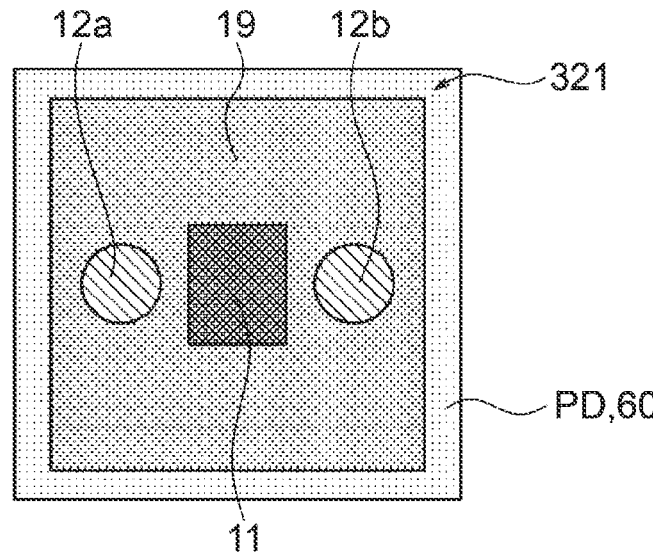
FIG. 12 is a schematic plan view of a sixth modification of the configuration of the solid-state imaging device according to the first embodiment.

FIG. 12 is a schematic plan view of a sixth modification of the configuration of the solid-state imaging device 1 according to the first embodiment.

In the example depicted in FIG. 12, as compared with FIG. 3 of the first embodiment, the planar gate electrodes 19 are arranged in an approximately rectangular frame shape as viewed from above so as to cover all the outer periphery of the floating diffusion region 11. Furthermore, the planar gate electrodes 19 connect the two vertical gate electrodes 12*a* and 12*b*. That is, the planar gate electrodes 19 are electrically connected to each other so as to cover the outer periphery of the floating diffusion region 11 as viewed from above. In the example depicted in FIG. 12, as in the first embodiment, the two vertical gate electrodes 12*a* and 12*b* are arranged inside the photodiode region 60, and the floating diffusion region 11 is disposed between the two vertical gate electrodes 12*a* and 12*b*.

Figure 13:
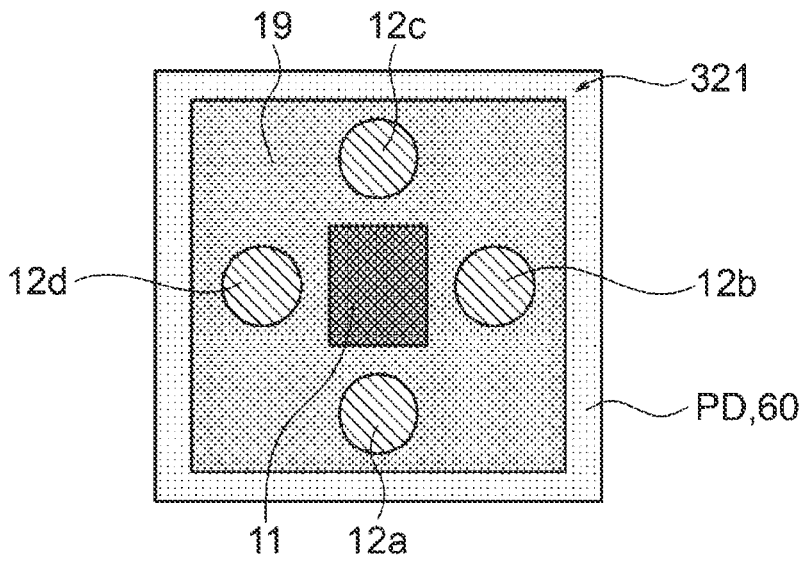
FIG. 13 is a schematic plan view of a seventh modification of the configuration of the solid-state imaging device according to the first embodiment.

FIG. 13 is a schematic plan view of a seventh modification of the configuration of the solid-state imaging device according to the first embodiment.

In the example depicted in FIG. 13, as compared with FIG. 12 of the sixth modification, vertical gate electrodes 12*c* and 12*d* are further provided. As in FIG. 11 of the fifth modification, the four vertical gate electrodes 12*a* to 12*d* are arranged in a cross shape around the floating diffusion region 11. In the example depicted in FIG. 13, the four vertical gate electrodes 12*a* to 12*d* are arranged inside the photodiode region 60, and the floating diffusion region 11 is disposed among the four vertical gate electrodes 12*a* to 12*d*.

Figure 14:
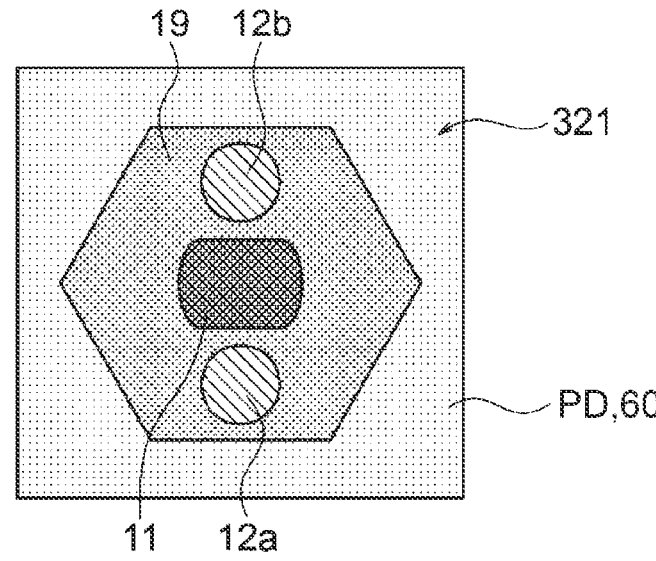
FIG. 14 is a schematic plan view of an eighth modification of the configuration of the solid-state imaging device according to the first embodiment.

FIG. 14 is a schematic plan view of an eighth modification of the configuration of the solid-state imaging device 1 according to the first embodiment.

In the example depicted in FIG. 14, as compared with FIG. 12 of the sixth modification, an outer edge of the planar gate electrodes 19 as viewed from above has a hexagonal shape. Note that the shape of the outer edge of the planar gate electrode 19 is not limited to the hexagonal shape, and may be a polygonal shape or an approximately circular shape. In the example depicted in FIG. 14, as in the first embodiment, the two vertical gate electrodes 12*a* and 12*b* are arranged inside the photodiode region 60, and the floating diffusion region 11 is disposed between the two vertical gate electrodes 12*a* and 12*b*.

Figures 15, 16:
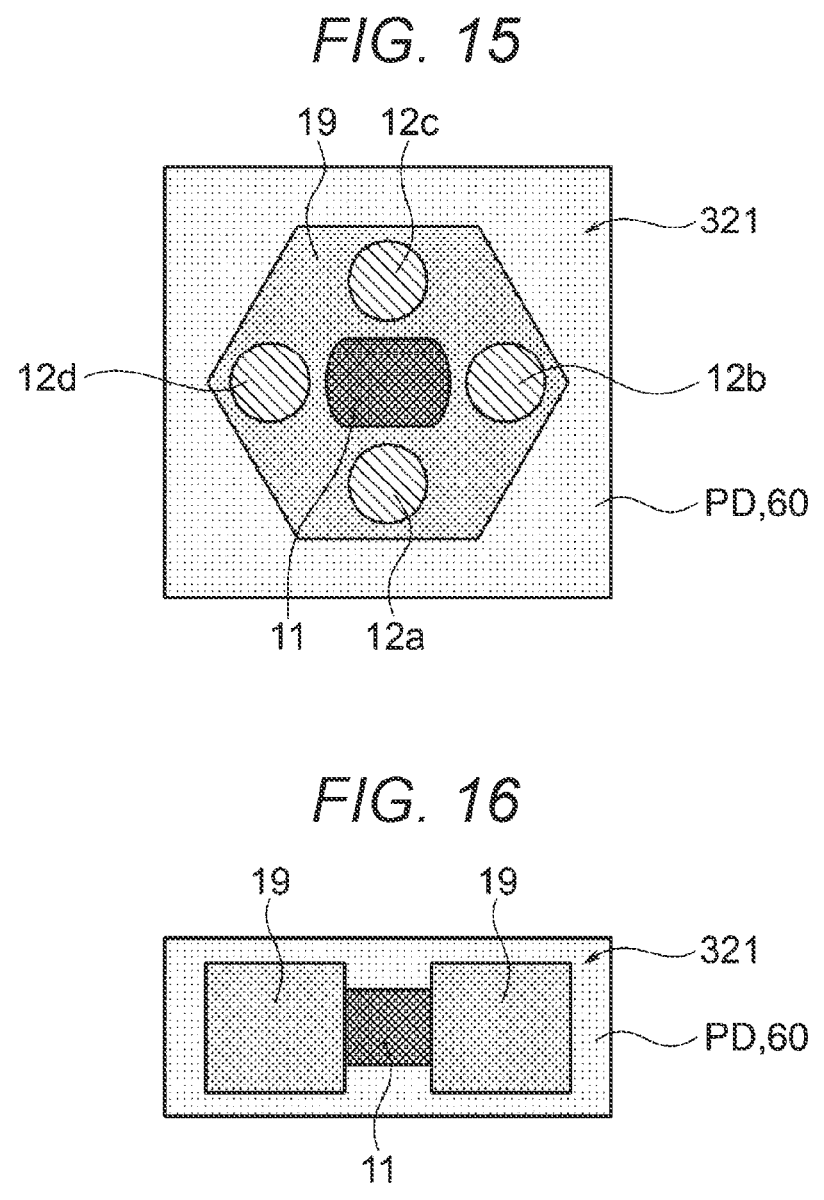

FIG. 15 is a schematic plan view of a ninth modification of the configuration of the solid-state imaging device 1 according to the first embodiment.

In the example depicted in FIG. 15, as compared with FIG. 14 of the eighth modification, vertical gate electrodes 12*c* and 12*d* are further provided. As in FIG. 11 of the fifth modification, the four vertical gate electrodes 12*a* to 12*d* are arranged in a cross shape around the floating diffusion region 11. In the example depicted in FIG. 15, the four vertical gate electrodes 12*a* to 12*d* are arranged inside the photodiode region 60, and the floating diffusion region 11 is disposed among the four vertical gate electrodes 12*a* to 12*d*.

FIG. 16 is a schematic plan view of a tenth modification of the configuration of the solid-state imaging device 1 according to the first embodiment.

In the example depicted in FIG. 16, as compared with FIG. 3 of the first embodiment, neither of the vertical gate electrodes 12*a* and 12*b* are provided.

Figure 17:
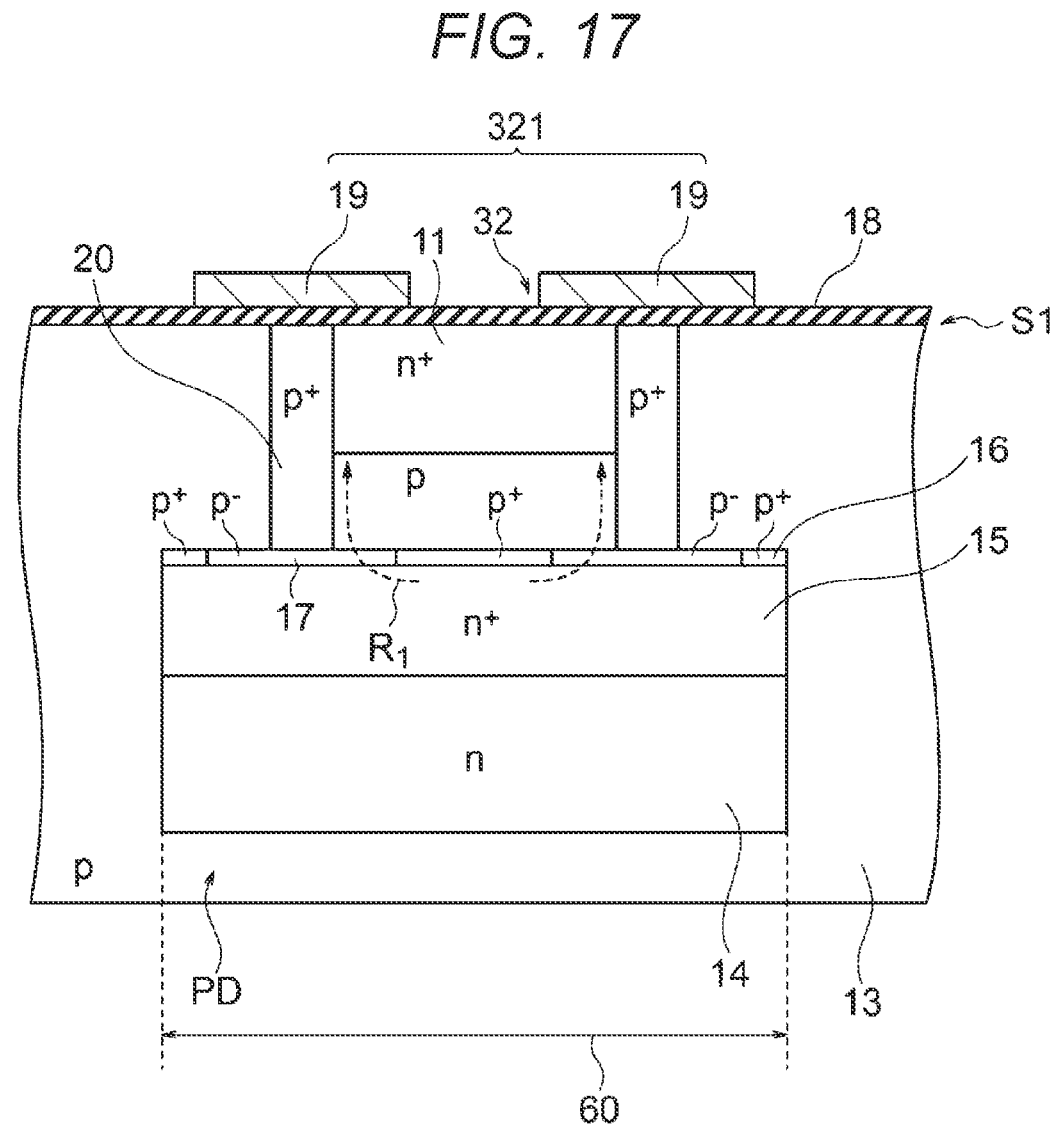

FIG. 17 is a cross-sectional view of an example of a cross-sectional structure of the solid-state imaging device 1 in FIG. 16.

In the example depicted in FIG. 17, a heavily doped p-type region (p+) 20 is provided in the depth direction from the gate insulating film 18 in contact with the planar gate electrodes 19 to the photodiode PD. More specifically, the p+ region 20 is provided such that impurity concentration becomes increasingly higher from the photodiode PD toward the one principal surface S1 (front surface). A gradient of the impurity concentration brings about a potential gradient. As described above, even in a case where neither of the vertical gate electrodes 12*a* and 12*b* are provided, adjusting the impurity concentration allows the signal electric charges generated by the photodiode PD to transfer to the floating diffusion region 11.

Note that the tenth modification may be combined with the first to ninth modifications. In this case, in the first to ninth modifications, the p+ region 20 is provided instead of the vertical gate electrodes 12*a* to 12*d*.

Second Embodiment

Figure 18:
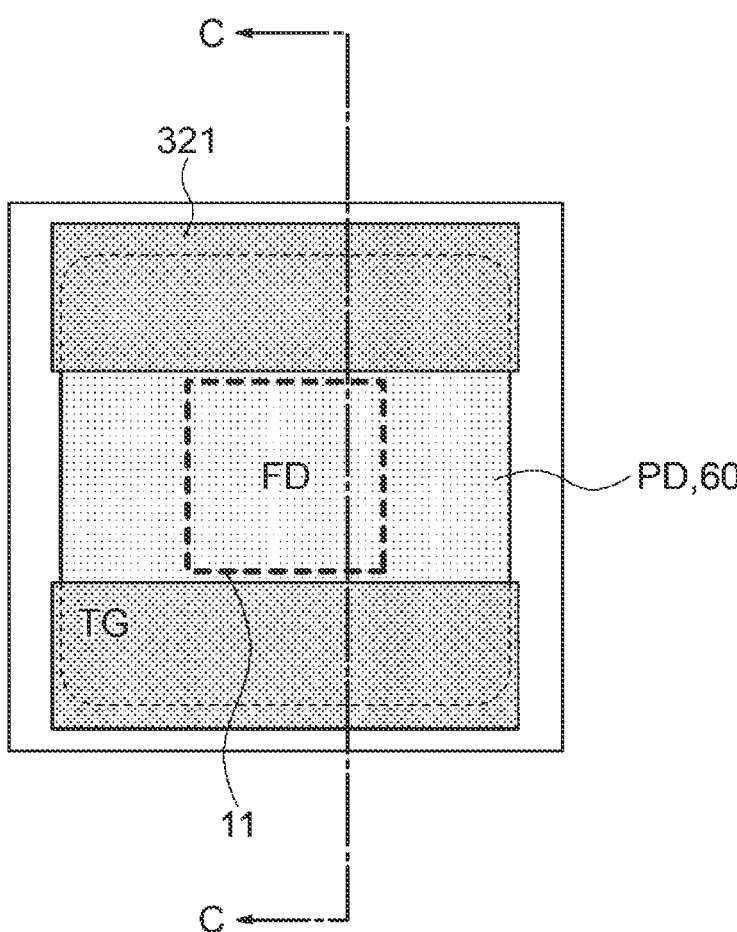
FIG. 18 is a schematic plan view of an example of a configuration of a solid-state imaging device according to a second embodiment.

FIG. 18 is a schematic plan view of an example of a configuration of a solid-state imaging device 1 according to a second embodiment. Note that FIG. 18 depicts a structure of the photodiode region 60 and a structure of a peripheral portion of the photodiode region 60. The second embodiment is different from the first embodiment in that the floating diffusion region 11 is disposed at a position different in height from the position of the transfer gates 321 (see FIG. 19). Note that the transfer gates 321 to be described below are provided in the depth direction in the semiconductor substrate 13, as with the vertical gate electrode of the first embodiment.

As in the first embodiment, the floating diffusion region 11 is disposed inside the outer edge of the photodiode region 60 as viewed from above. More specifically, the floating diffusion region 11 is disposed approximately at the center of the photodiode region 60 as viewed from above. Furthermore, the floating diffusion region 11 is disposed so as to be interposed between the transfer gates 321 as viewed from above.

In the example depicted in FIG. 18, the transfer gates 321 are arranged so as to partially protrude outward beyond the outer edge of the photodiode region 60. The transfer gates 321, however, are not necessarily arranged in this manner, and may be arranged inside the outer edge of the photodiode region 60 as in the first embodiment.

Figure 19:
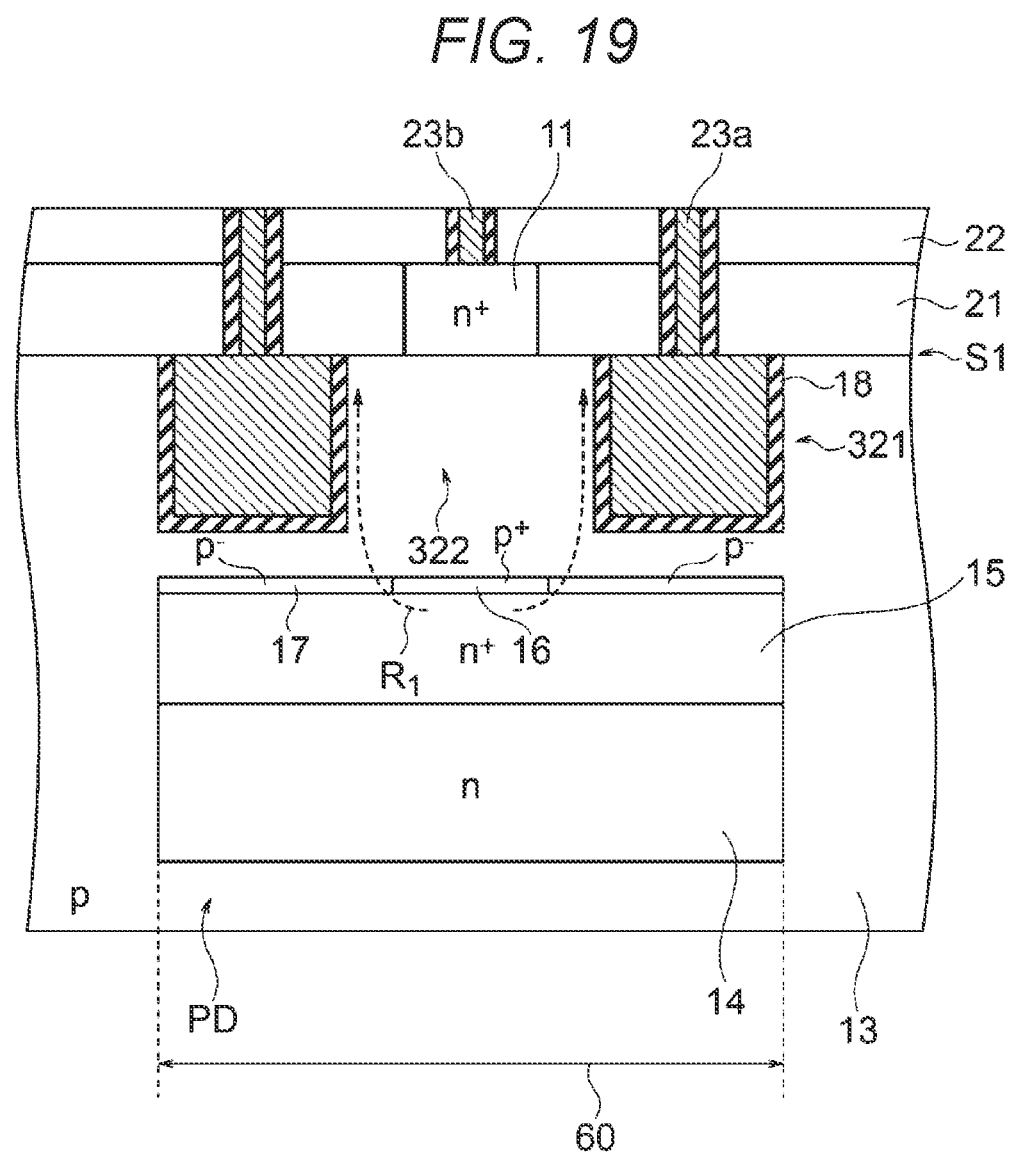

FIG. 19 is a cross-sectional view of an example of a cross-sectional structure of the solid-state imaging device 1 according to the second embodiment. FIG. 19 is a cross-sectional view of an example of a schematic configuration of the pixel 2 taken along a line C-C in FIG. 18.

As depicted in FIG. 19, the solid-state imaging device 1 further includes a semiconductor layer 21, an upper layer film 22, contacts 23*a* and 23*b*, and an electric charge transfer region 322.

The semiconductor layer 21 is provided above the one principal surface S1 of the semiconductor substrate 13. The semiconductor layer 21 is the same in material as the semiconductor substrate 13, for example. As the material of the semiconductor layer 21, for example, silicon (Si) is used.

The upper layer film 22 is provided above the semiconductor layer 21. The upper layer film 22 is, for example, an insulating film such as a silicon oxide film.

The contact 23*a* is provided extending through the semiconductor layer 21 and the upper layer film 22 to electrically connect to the transfer gate 321. A voltage is applied to the transfer gate 321 through the contact 23*a*. Furthermore, the contact 23*b* is provided extending through the upper layer film 22 to electrically connect to the floating diffusion region 11. A signal corresponding to the electric charges stored in the floating diffusion region 11 is output through the contact 23*b*. As a material of the contacts 23*a* and 23*b*, for example, a conductive material such as tungsten (W) is used.

The electric charge transfer region 322 is provided in a layer above the photodiode PD, and the electric charges generated in the photodiode PD are transferred through the electric charge transfer region 322. The signal electric charges having passed through the electric charge transfer region 322 are stored in the floating diffusion region 11.

The transfer gates 321 are arranged between the photodiode PD and the one principal surface S1 in the depth direction of the semiconductor substrate 13. The transfer gates 321 are provided above the photodiode PD such that the electric charge transfer region 322 is interposed between the transfer gates 321 in the horizontal direction and control transfer of the electric charges generated in the photodiode PD. That is, the transfer gates 321 are arranged apart from each other such that the electric charge transfer region 322 is interposed between the transfer gates 321. Therefore, the signal electric charges are transferred nearly vertically through the electric charge transfer region 322 along the transfer gates 321 as indicated by an arrow R1 in FIG. 19. It is therefore possible to make, as in the first embodiment, the transfer path of the signal electric charges in the embedded photodiode PD shorter. As a result, it is possible to make the transfer of the signal electric charges less prone to failure and thus enhance the transfer characteristics. Furthermore, as in the first embodiment, it is possible to arrange, in an easier manner, transistors other than the transfer transistor 32 in a pixel area subjected to miniaturization.

As described with reference to FIG. 18, the floating diffusion region 11 is disposed inside the outer edge of the photodiode region 60 as viewed from above and is disposed so as to be interposed between the transfer gates 321 as viewed from above. That is, the floating diffusion region 11 is disposed immediately above the electric charge transfer region 322, for example. Therefore, the signal electric charges are transferred nearly vertically from the photodiode PD to the floating diffusion region 11.

Furthermore, the floating diffusion region 11 is disposed adjacent to the one principal surface S1 of the semiconductor substrate 13 relative to the transfer gates 321. The semiconductor layer 21 is disposed on a side of the one principal surface S1 remote from the transfer gates 321. Therefore, the floating diffusion region 11 is provided inside the semiconductor layer 21. In the example depicted in FIG. 19, the floating diffusion region 11 is provided in a layer above the transfer gates 321.

Recent pixel miniaturization makes a distance between the photodiode PD and the floating diffusion region 11 shorter. This prevents a separation width (channel length) between the photodiode PD and the floating diffusion region 11 from being sufficiently wide, which may cause a short-channel effect. Furthermore, in a case where the floating diffusion region 11 is provided at the same height (layer) as the transfer gates 321, there is a possibility that the floating diffusion region 11 undergoes an excessive rise in voltage. In this case, there is a possibility that an FD white spot occurs.

On the other hand, according to the second embodiment, the floating diffusion region 11 is provided in the semiconductor layer 21 above the transfer gates 321. It is therefore possible to make the distance between the photodiode PD and the floating diffusion region 11 longer. As a result, it is possible to make the short-channel effect less prone to occur. Furthermore, it is possible to prevent the floating diffusion region 11 from undergoing an excessive rise in voltage. As a result, it is possible to make the FD white less prone to occur. It is therefore possible to suppress deterioration of imaging characteristics.

[Manufacturing Method]

FIGS. 20A to 20D are cross-sectional views of the solid-state imaging device 1 according to the second embodiment, depicting an example of a method for manufacturing the solid-state imaging device 1.

Figure 20A:
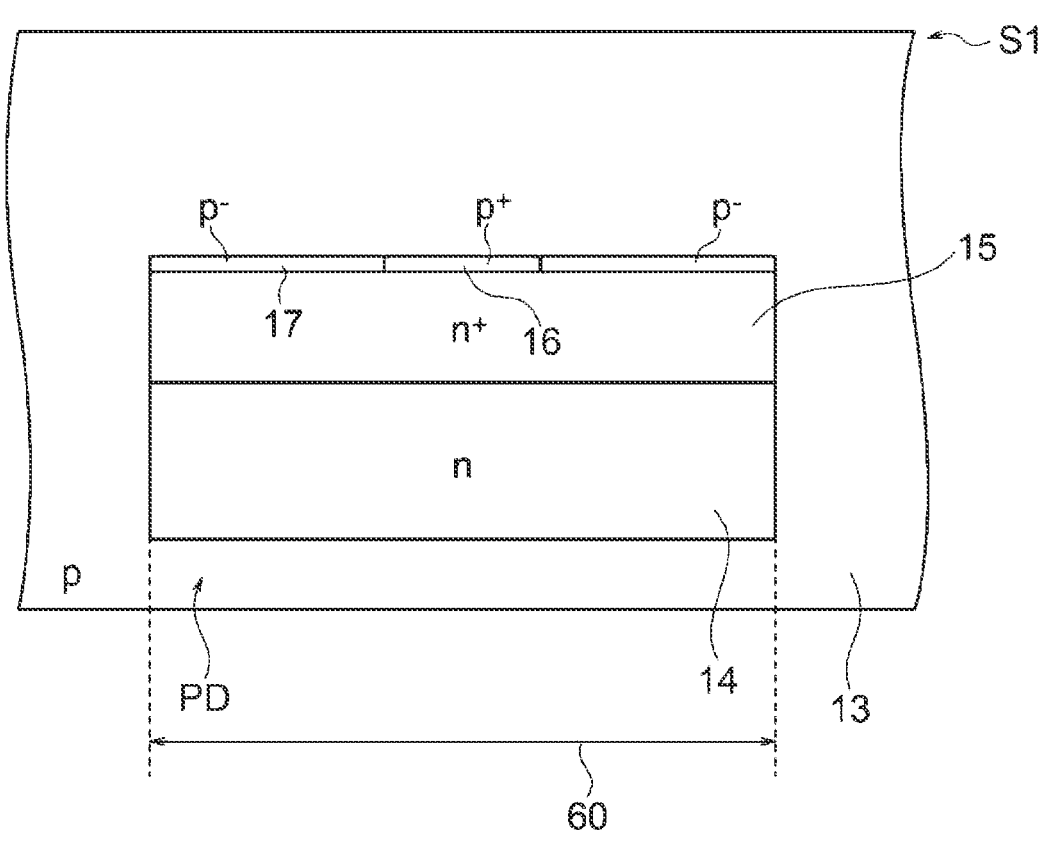
FIG. 20A is a cross-sectional view of the solid-state imaging device according to the second embodiment, depicting an example of a method for manufacturing the solid-state imaging device.

First, as depicted in FIG. 20A, the photodiode PD is formed inside the semiconductor substrate 13. The photodiode PD is formed by, for example, ion implantation.

Figure 20B:
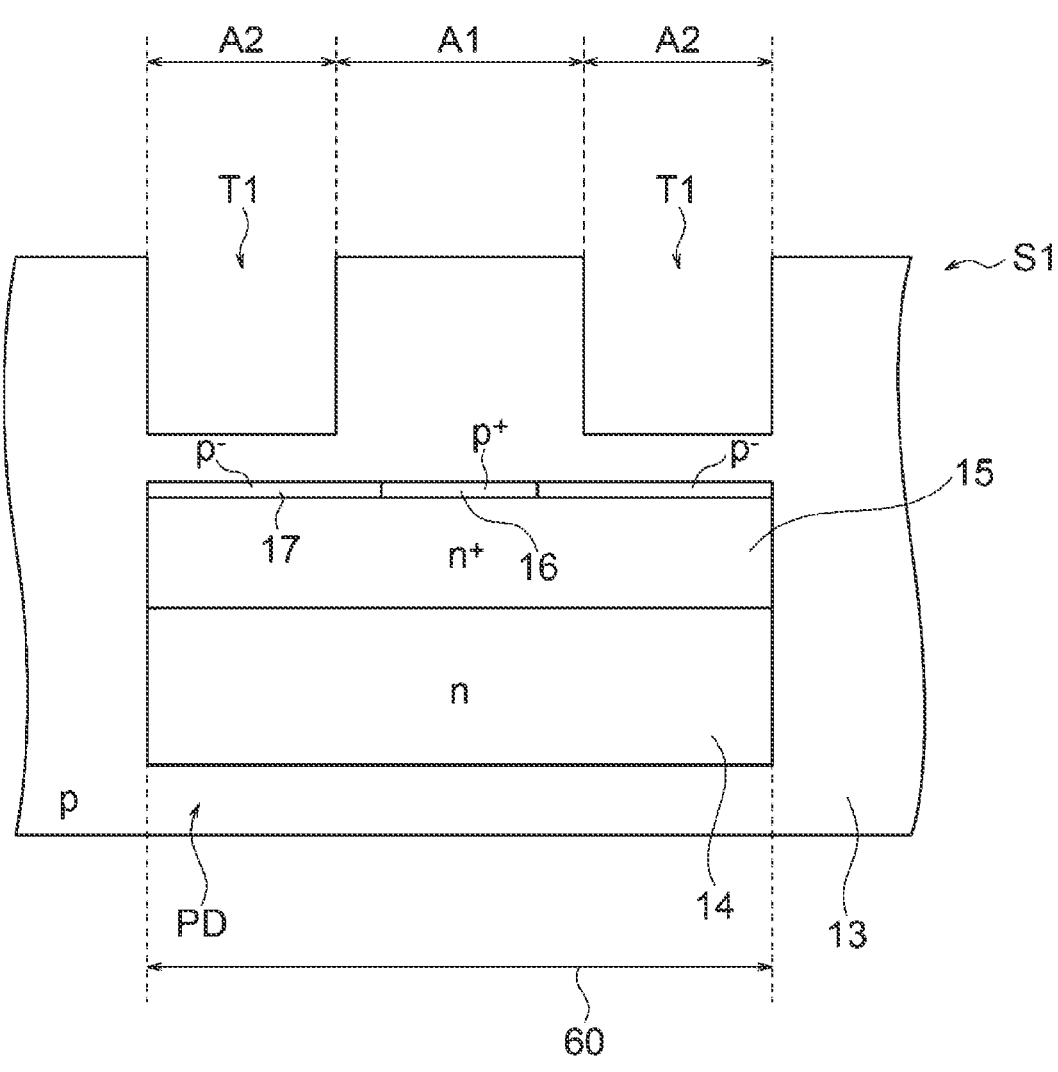
FIG. 20B is a cross-sectional view of the solid-state imaging device, depicting the example of the method for manufacturing the solid-state imaging device, following FIG. 20B.

Next, as depicted in FIG. 20B, a recess (trench) T1 is formed in the one principal surface S1. More specifically, the recess T1 is formed in second regions A2 between which a first region A1 is interposed as viewed from above. The first region A1 is a region inside the outer edge of the photodiode region 60 as viewed from above. The first region A1 is, for example, a region where the floating diffusion region 11 depicted in FIG. 18 is disposed. Furthermore, the second regions A2 are, for example, regions where the transfer gates 321 depicted in FIG. 18 are arranged. In the example depicted in FIG. 20B, the recess T1 is formed extending from the one principal surface S1 to a depth before reaching the photodiode PD.

Figure 20C:
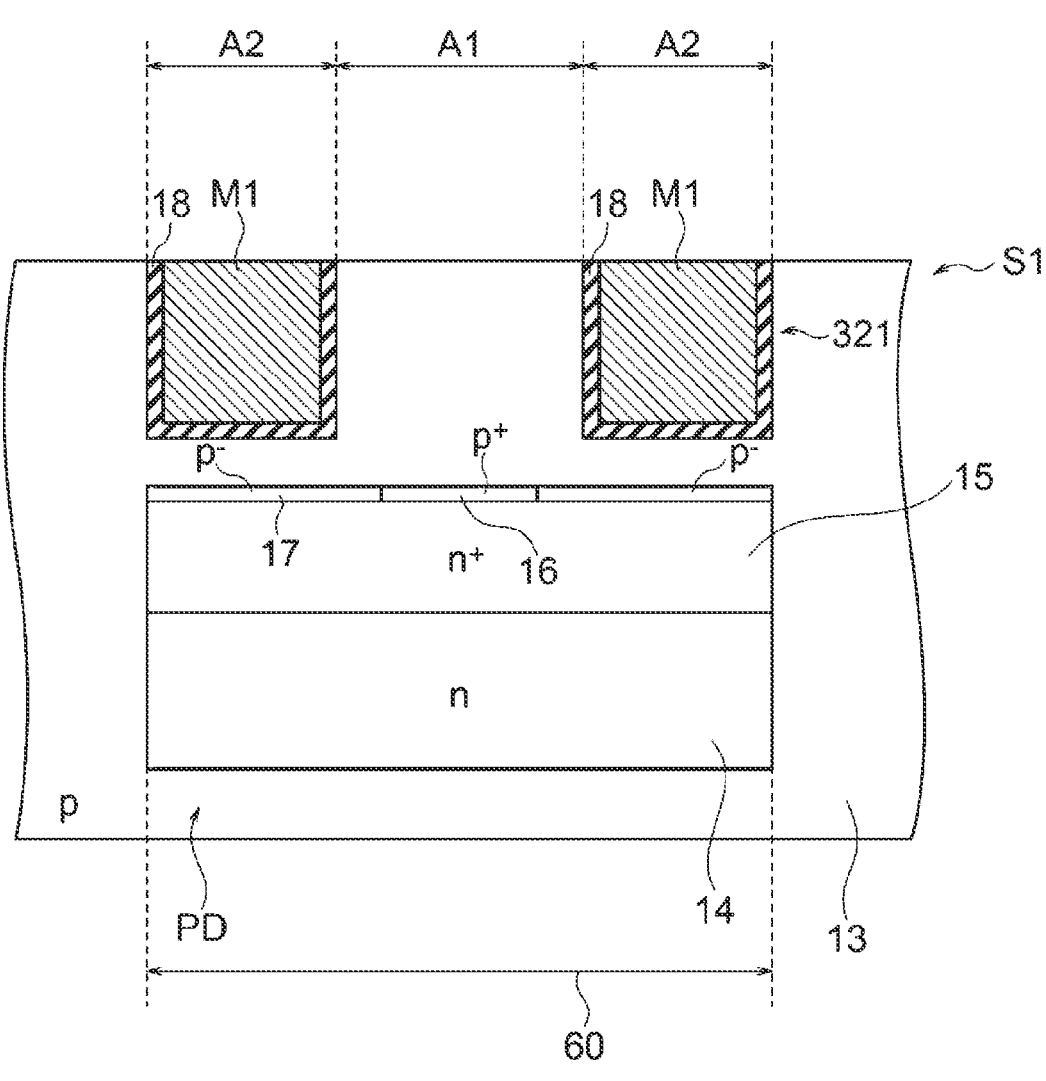
FIG. 20C is a cross-sectional view of the solid-state imaging device, depicting the example of the method for manufacturing the solid-state imaging device, following FIG. 20C.

Next, as depicted in FIG. 20C, a metal layer M1 is formed inside the recess T1. As a result, the embedded transfer gate 321 is formed. In the example depicted in FIG. 20C, the metal layer M1 is formed so as to fill up to the one principal surface S1. Note that the gate insulating film 18 is formed between the semiconductor substrate 13 and the metal layer M1. A material of the metal layer M1 is, for example, polysilicon. Next, doping with a p-type impurity is performed by ion implantation. Accordingly, the semiconductor substrate 13 between the photodiode PD and the one principal surface S1 becomes a doped p-type region. As a result, the photodiode PD and the floating diffusion region 11 are separated by the doped p-type region.

Figure 20D:
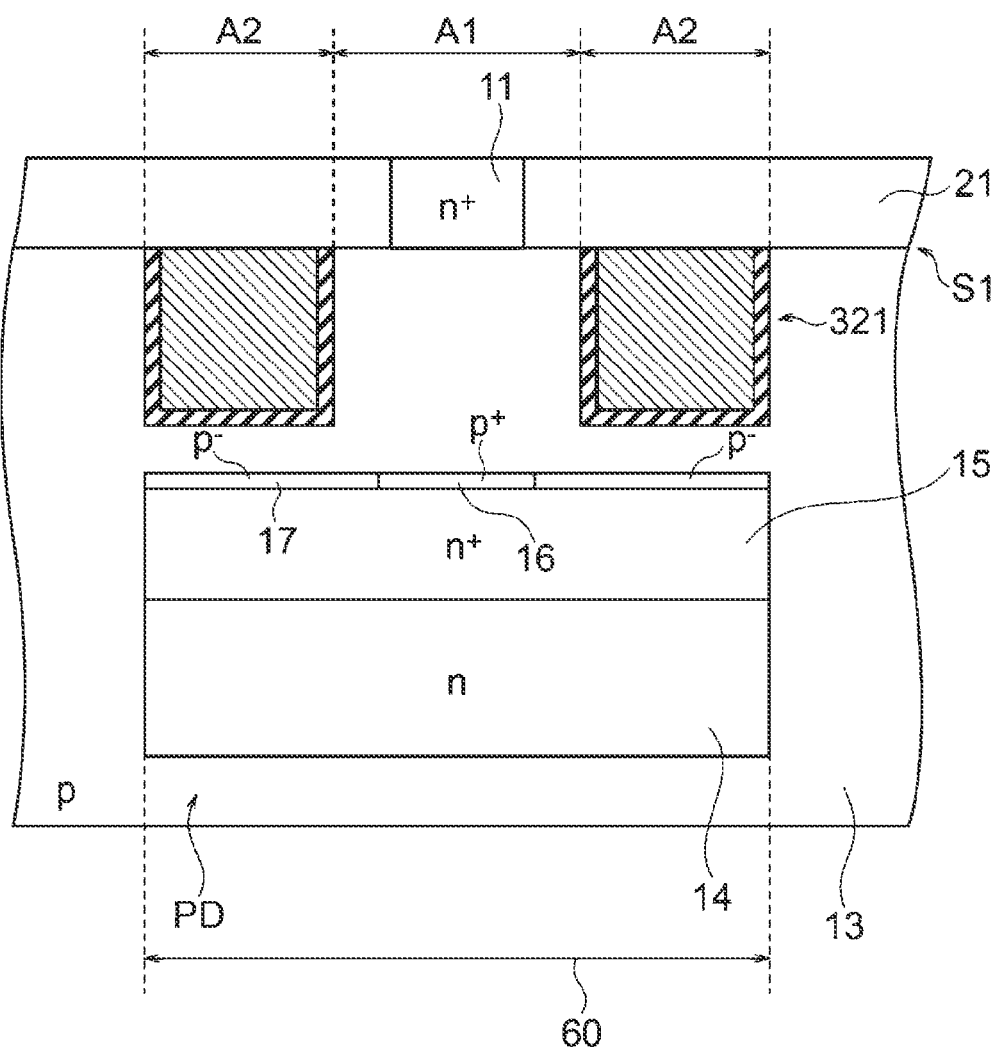
FIG. 20D is a cross-sectional view of the solid-state imaging device, depicting the example of the method for manufacturing the solid-state imaging device, following FIG. 20D.

Next, as depicted in FIG. 20D, the semiconductor layer 21 is formed above the one principal surface S1. For example, a semiconductor crystal is epitaxially grown to form the semiconductor layer 21. Accordingly, a crystal orientation of the semiconductor crystal of the semiconductor layer 21 corresponds to a crystal orientation of a semiconductor crystal of the semiconductor substrate 13. Next, the floating diffusion region 11 is formed in the first region A1 of the semiconductor layer 21. That is, the floating diffusion region 11 is formed in the first region A1 of the layer above the transfer gates 321. The floating diffusion region 11 is formed by, for example, ion implantation.

Thereafter, the upper layer film 22 is formed above the semiconductor layer 21, and the contacts 23a and 23b are formed, thereby reaching completion of the solid-state imaging device 1 depicted in FIG. 19.

As described above, according to the second embodiment, the transfer gates 321 are arranged such that the electric charge transfer region 322 is interposed between the transfer gates 321. The floating diffusion region 11 stores the signal electric charges transferred from the electric charge transfer region 322. It is therefore possible to make, as in the first embodiment, the transfer path of the signal electric charges in the embedded photodiode PD shorter. As a result, it is possible to make the transfer of the signal electric charges less prone to failure and thus enhance the transfer characteristics. Furthermore, as in the first embodiment, it is possible to arrange, in an easier manner, transistors other than the transfer transistor 32 in a pixel area subjected to miniaturization.

Furthermore, according to the second embodiment, the floating diffusion region 11 is provided in the layer above the transfer gates 321. It is therefore possible to make the short-channel effect less prone to occur and make the FD white spot to less prone to occur. It is therefore possible to suppress deterioration of imaging characteristics.

Modification of Second Embodiment

Next, modifications of a structure of the transfer gates 321 and a structure of a peripheral portion of the transfer gates 321 will be described.

Figure 21:
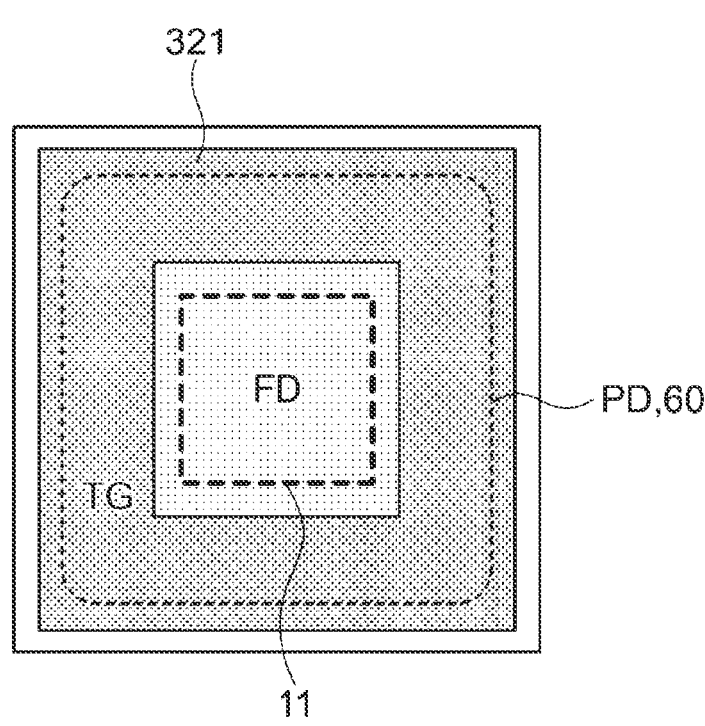
FIG. 21 is a schematic plan view of a first modification of the configuration of the solid-state imaging device according to the second embodiment.

FIG. 21 is a schematic plan view of a first modification of the configuration of the solid-state imaging device 1 according to the second embodiment.

In the example depicted in FIG. 21, as compared with FIG. 18 of the second embodiment, the transfer gates 321 are arranged in an approximately rectangular frame shape so as to cover all the outer periphery of the floating diffusion region 11 as viewed from above. That is, the transfer gates 321 are electrically connected so as to cover the outer periphery of the floating diffusion region 11 and the outer periphery of the electric charge transfer region 322 that overlaps the floating diffusion region 11 as viewed from above. The outer edge and the opening of the transfer gates 321 have an approximately square shape. In the example depicted in FIG. 21, as in the first embodiment, the electric charge transfer region 322 and the floating diffusion region 11 are arranged so as to be interposed between the transfer gates 321 as viewed from above.

Figure 22:
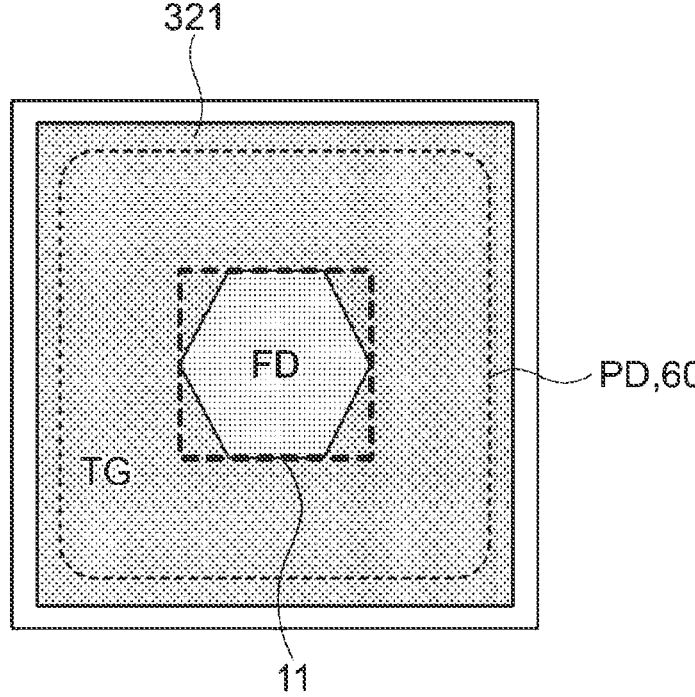
FIG. 22 is a schematic plan view of a second modification of the configuration of the solid-state imaging device according to the second embodiment.

FIG. 22 is a schematic plan view of a second modification of the configuration of the solid-state imaging device 1 according to the second embodiment.

In the example depicted in FIG. 22, as compared with FIG. 21 of the first modification, the opening of the transfer gates 321 has an approximately hexagonal shape. Note that the opening of the transfer gates 321 does not necessarily have a hexagonal shape, and may have a polygonal shape. In the example depicted in FIG. 22, as in the first embodiment, the electric charge transfer region 322 and the floating diffusion region 11 are arranged so as to be interposed between the transfer gates 321 as viewed from above.

Figures 23, 24:
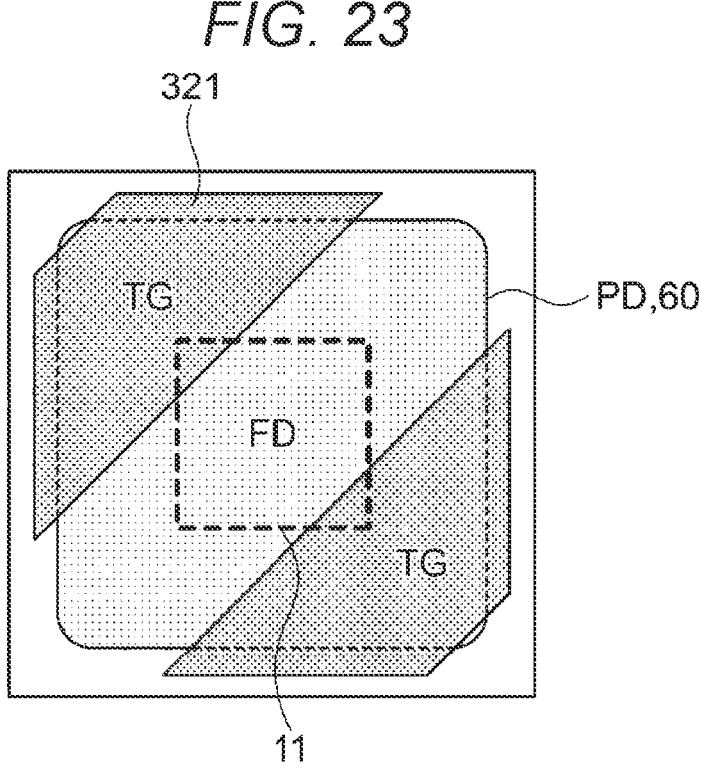
FIG. 23 is a schematic plan view of a third modification of the configuration of the solid-state imaging device according to the second embodiment.
FIG. 24 is a schematic plan view of a fourth modification of the configuration of the solid-state imaging device according to the second embodiment.

FIG. 23 is a schematic plan view of a third modification of the configuration of the solid-state imaging device 1 according to the second embodiment.

In the example depicted in FIG. 23, as compared with FIG. 21 of the first modification, the transfer gates 321 are arranged such that the floating diffusion region 11 is interposed between the transfer gates 321, that is, between the upper left and the lower right of FIG. 23. In the example depicted in FIG. 23, as in the first embodiment, the electric charge transfer region 322 and the floating diffusion region 11 are arranged so as to be interposed between the transfer gates 321 as viewed from above.

FIG. 24 is a schematic plan view of a fourth modification of the configuration of the solid-state imaging device according to the second embodiment.

In the example depicted in FIG. 24, as compared with FIG. 21 of the first modification, the opening of the transfer gates 321 has an approximately rectangular shape. Furthermore, two opposite sides of the opening are different in length from the other two sides. In the example depicted in FIG. 24, as in the first embodiment, the electric charge transfer region 322 and the floating diffusion region 11 are arranged so as to be interposed between the transfer gates 321 as viewed from above.

Figure 25:
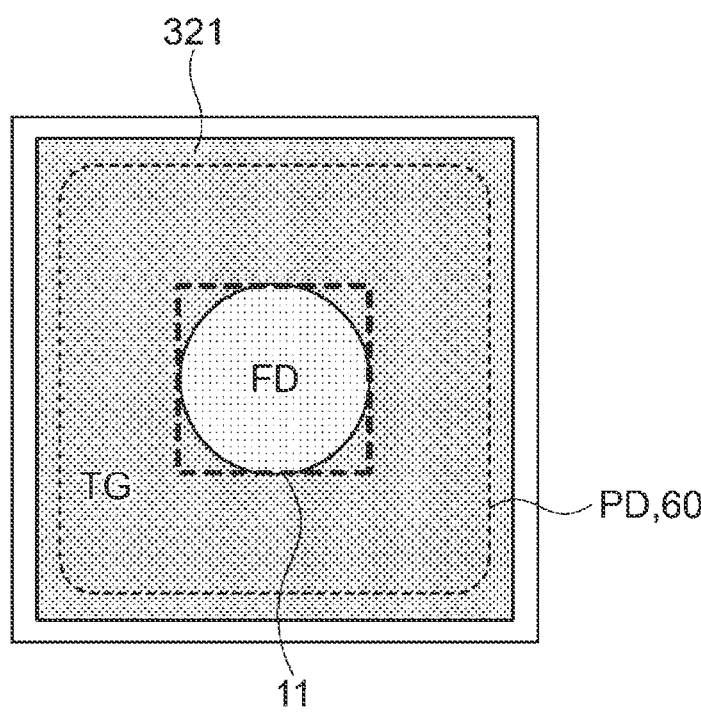
FIG. 25 is a schematic plan view of a fifth modification of the configuration of the solid-state imaging device according to the second embodiment.

FIG. 25 is a schematic plan view of a fifth modification of the configuration of the solid-state imaging device 1 according to the second embodiment.

In the example depicted in FIG. 25, as compared with FIG. 21 of the first modification, the opening of the transfer gates 321 has an approximately circular shape. In the example depicted in FIG. 25, as in the first embodiment, the electric charge transfer region 322 and the floating diffusion region 11 are arranged so as to be interposed between the transfer gates 321 as viewed from above.

Note that, in the examples depicted in FIGS. 21, 22, 24, and 25, the outer edge of the transfer gate 321 has an approximately square shape, but does not necessarily have such a square shape, and may have a polygonal shape or an approximately circular shape.

Furthermore, as depicted in FIGS. 22 to 25, the floating diffusion region 11 may overlap the transfer gate 321.

Next, modifications of a cross-sectional structure of the transfer gate 321 and a cross-sectional structure of the peripheral portion of the transfer gate 321 will be described.

Figure 26:
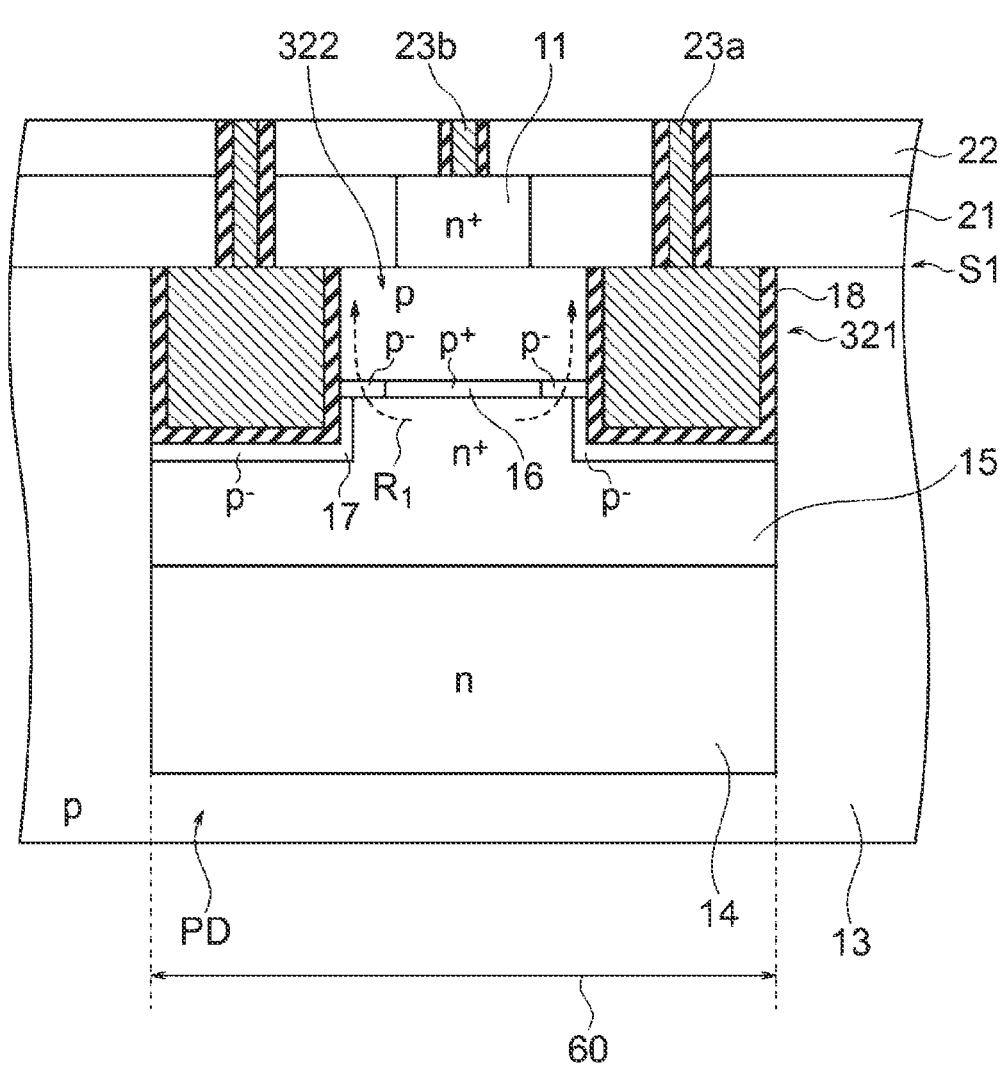
FIG. 26 is a cross-sectional view of a first modification of the cross-sectional structure of the solid-state imaging device according to the second embodiment.

FIG. 26 is a cross-sectional view of a first modification of the cross-sectional structure of the solid-state imaging device 1 according to the second embodiment.

In the example depicted in FIG. 26, as compared with FIG. 19 of the second embodiment, an upper portion of the photodiode PD is disposed so as to protrude into the electric charge transfer region 322 located between the transfer gates 321. It is therefore possible to make the region of the photodiode PD larger and makes the transfer of the signal electric charges to the floating diffusion region 11 easier. Note that when the photodiode PD is too close to the floating diffusion region 11, it may become difficult to turn the transfer transistor 32 off. Therefore, an interface position between the photodiode PD and the electric charge transfer region 322 is determined in accordance with required sensor performance or the like. In the example depicted in FIG. 26, as in the first embodiment, the floating diffusion region 11 is located above the transfer gates 321.

Figure 27:
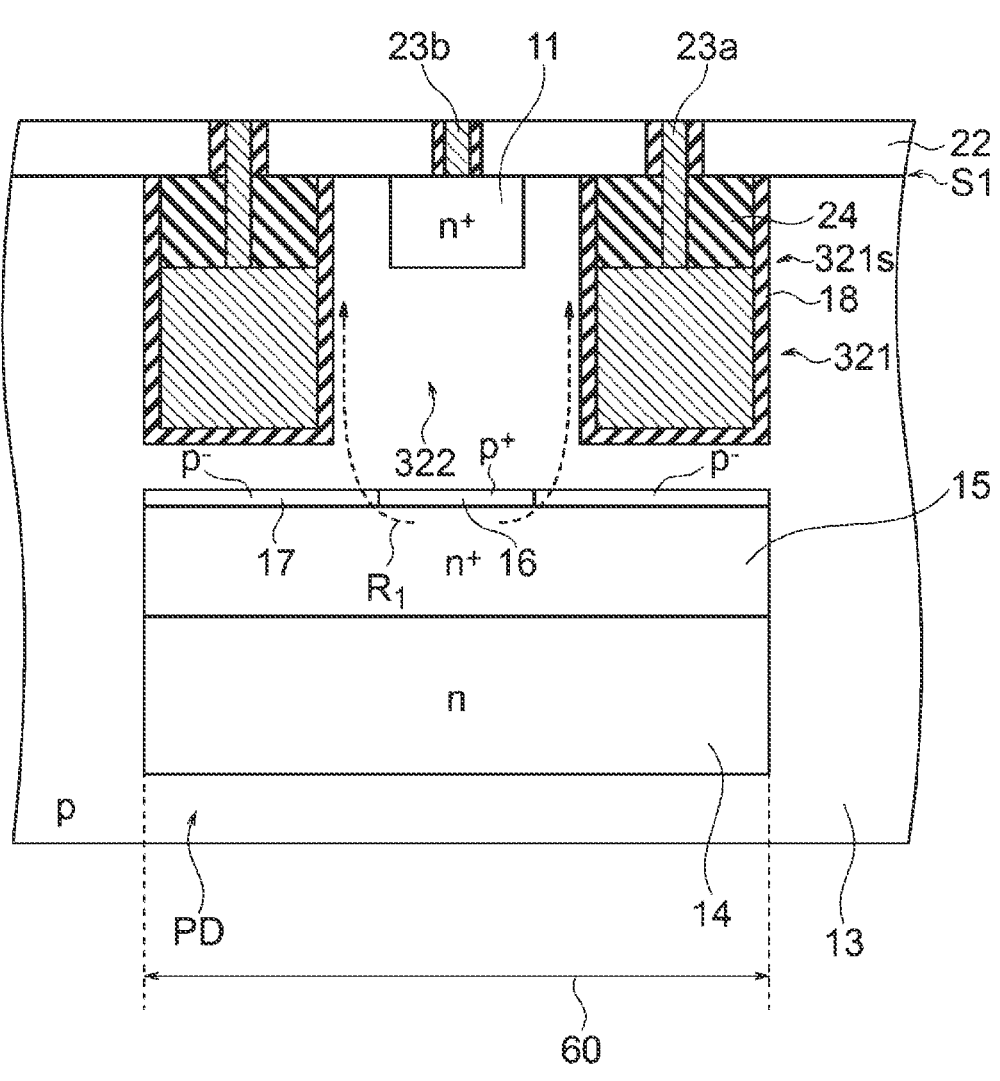
FIG. 27 is a cross-sectional view of a second modification of the cross-sectional structure of the solid-state imaging device according to the second embodiment.

FIG. 27 is a cross-sectional view of a second modification of the cross-sectional structure of the solid-state imaging device 1 according to the second embodiment.

In the example depicted in FIG. 27, as compared with FIG. 19 of the second embodiment, the floating diffusion region 11 is provided in the semiconductor substrate 13, that is, below the one principal surface S1. Note that, in the example depicted in FIG. 27, the semiconductor layer 21 is not provided.

The solid-state imaging device 1 depicted in FIG. 27 further includes an insulating layer 24. The insulating layer 24 is provided in the recess T1 together with the transfer gate 321. The transfer gate 321 is disposed at a position deeper than the one principal surface S1 in the semiconductor substrate 13. Therefore, in the example depicted in FIG. 27, the recess T1 is filled with the transfer gate 321 provided extending from the bottom to halfway of the recess T1, and the insulating layer 24 provided extending from an upper surface 321s of the transfer gate 321 to the one principal surface S1. A material of the insulating layer 24 is, for example, silicon oxide (SiO$_2$).

The floating diffusion region 11 is disposed between the one principal surface S1 and the upper surface 321s, adjacent to the one principal surface S1, of the transfer gate 321. In the example depicted in FIG. 27, the floating diffusion region 11 is provided at the same height as the insulating layer 24. In the example depicted in FIG. 27, as in the first embodiment, the floating diffusion region 11 is located above the transfer gate 321. Note that the floating diffusion region 11 need not necessarily be provided with the same thickness as the insulating layer 24 as depicted in FIG. 27.

FIGS. 28A to 28E are cross-sectional views of the solid-state imaging device 1 in FIG. 27, depicting an example of a method for manufacturing the solid-state imaging device 1.

Figure 28A:
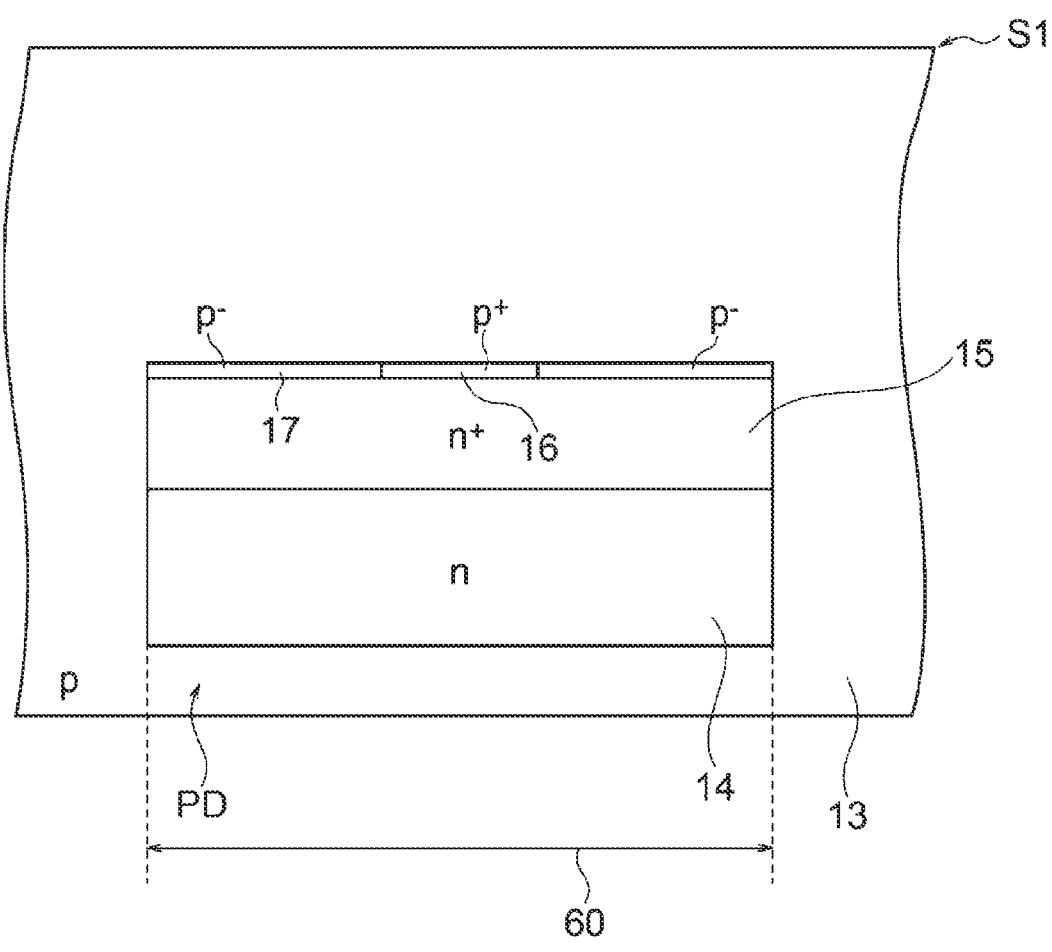
FIG. 28A is a cross-sectional view of the solid-state imaging device in FIG. 27, depicting an example of a method for manufacturing the solid-state imaging device.

First, as depicted in FIG. 28A, the photodiode PD is formed inside the semiconductor substrate 13. The photodiode PD is formed by, for example, ion implantation.

Figure 28B:
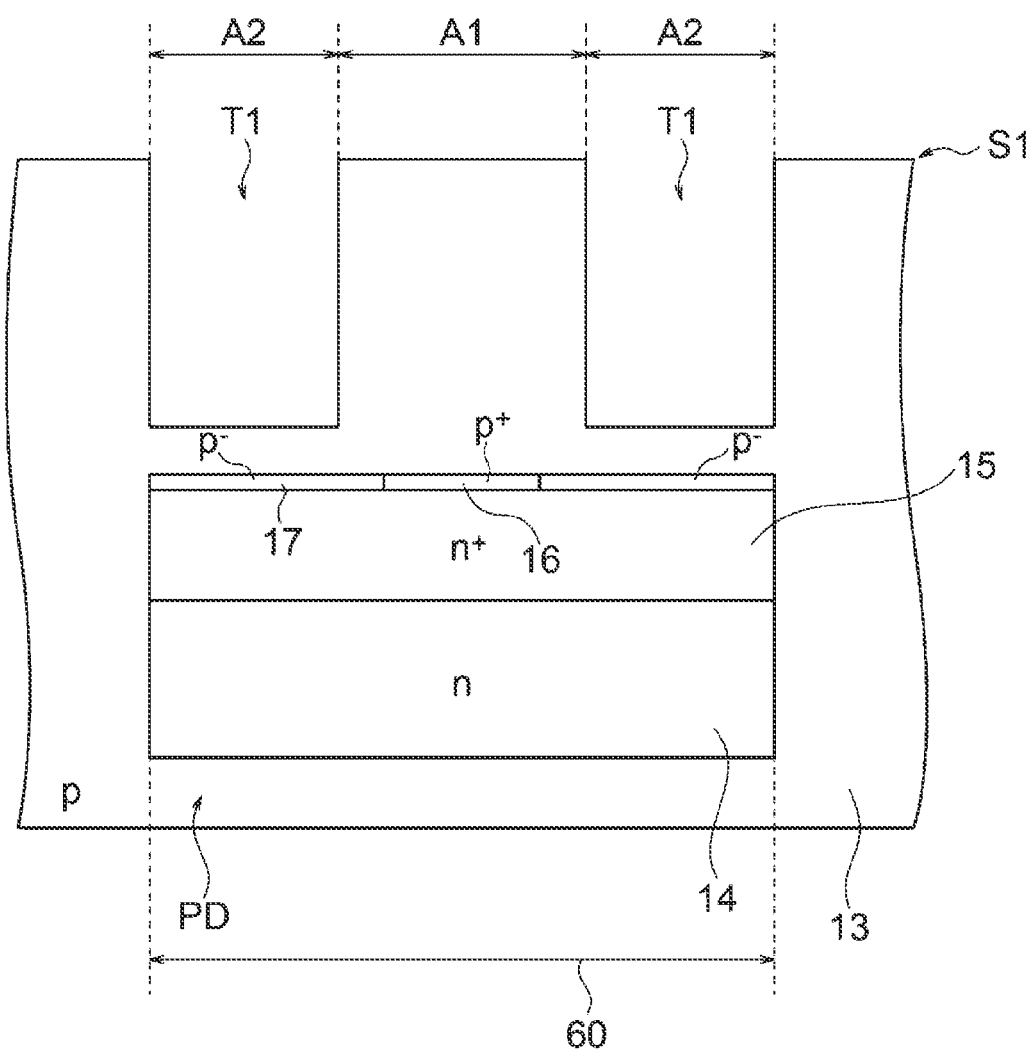
FIG. 28B is a cross-sectional view of the solid-state imaging device, depicting the example of the method for manufacturing the solid-state imaging device, following FIG. 28A.

Next, as depicted in FIG. 28B, the recess T1 is formed in the one principal surface S1. More specifically, in the one principal surface S1, the recess T1 is formed in the second regions A2 between which the first region A1 inside the outer edge of the photodiode region 60 as viewed from above is interposed. In the example depicted in FIG. 28B, the recess T1 is formed extending from the one principal surface S1 to a depth before reaching the photodiode PD.

Figure 28C:
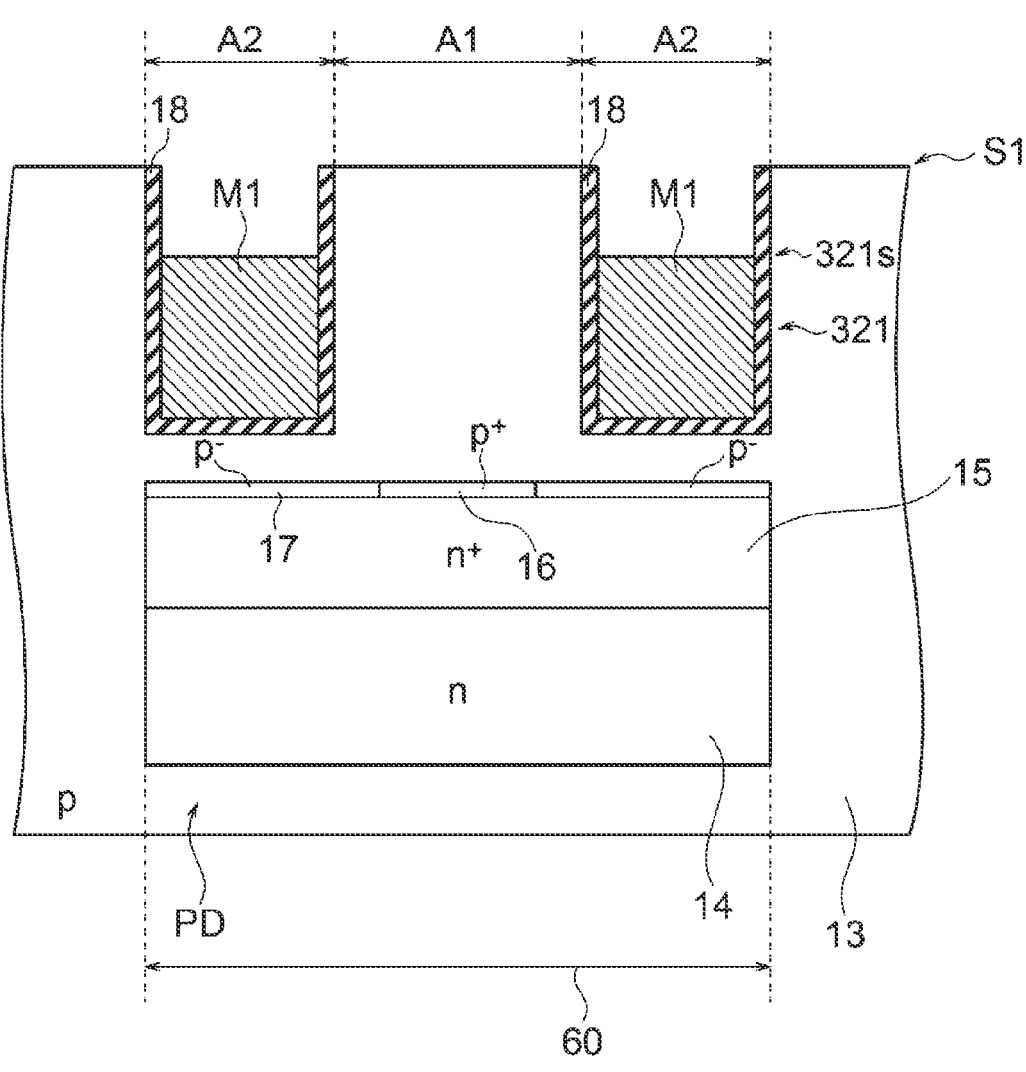
FIG. 28C is a cross-sectional view of the solid-state imaging device, depicting the example of the method for manufacturing the solid-state imaging device, following FIG. 28B.

Next, as depicted in FIG. 28C, the metal layer M1 is formed inside the recess T1. More specifically, the metal layer M1 is formed so as to fill the recess T1 up to a predetermined height lower than the one principal surface S1. Therefore, the metal layer M1 is formed such that the recess T1 is partially filled with the metal layer M1 so as for the metal layer M1 not to reach the height of the floating diffusion region 11 to be formed later. Accordingly, the transfer gate 321 is formed at a position deeper than the one principal surface S1 in the semiconductor substrate 13.

Figure 28D:
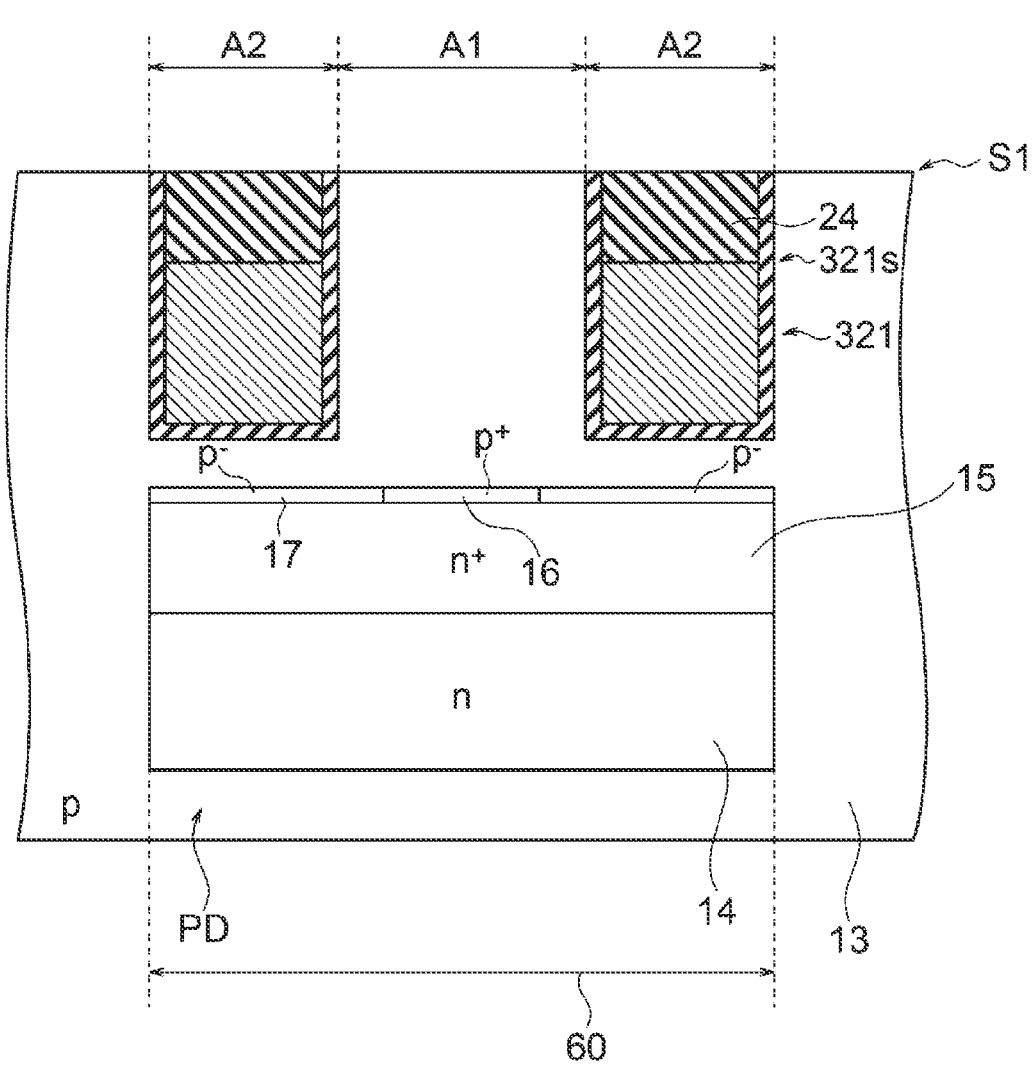
FIG. 28D is a cross-sectional view of the solid-state imaging device, depicting the example of the method for manufacturing the solid-state imaging device, following FIG. 28C.

Next, as depicted in FIG. 28D, the insulating layer 24 is formed above the transfer gate 321 so as to fill the recess T1 up to the one principal surface S1.

Figure 28E:
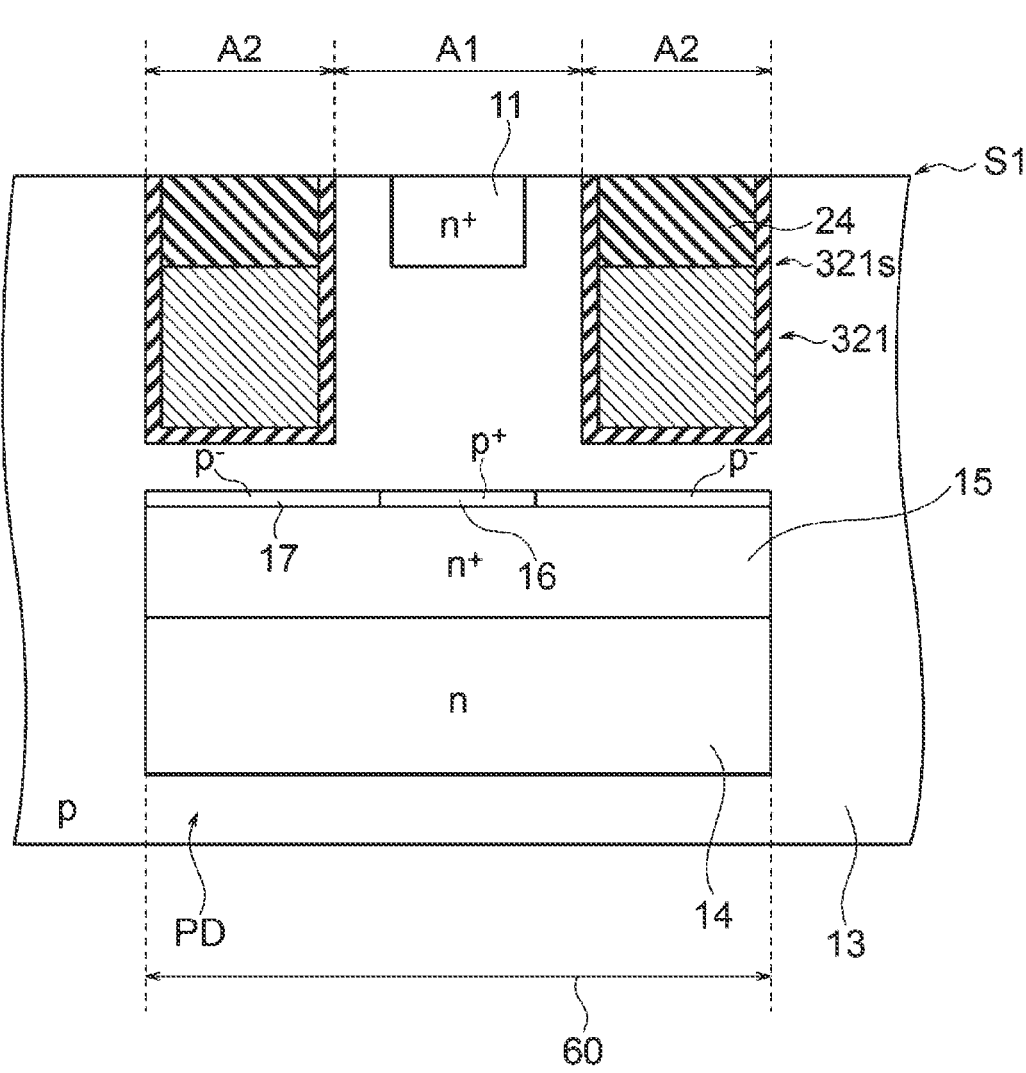
FIG. 28E is a cross-sectional view of the solid-state imaging device, depicting the example of the method for manufacturing the solid-state imaging device, following FIG. 28D.

Next, as depicted in FIG. 28E, the floating diffusion region 11 is formed in the semiconductor substrate 13. More specifically, the floating diffusion region 11 is formed in the first region A1 located between the one principal surface S1 and the upper surface 321s of the transfer gate 321.

Thereafter, the upper layer film 22 is formed above the one principal surface S1, and the contacts 23a and 23b are formed, thereby reaching completion of the solid-state imaging device 1 depicted in FIG. 27.

Figure 29:
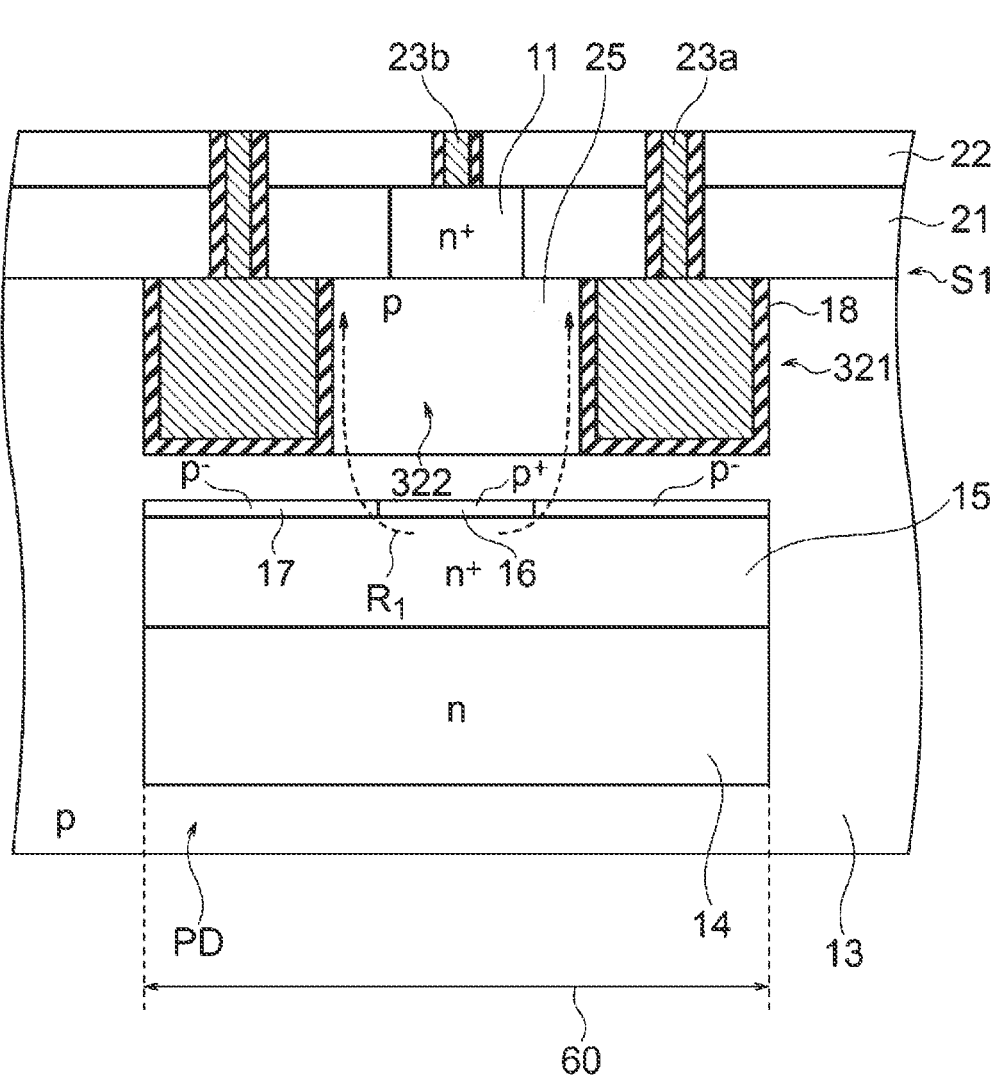
FIG. 29 is a cross-sectional view of a third modification of the cross-sectional structure of the solid-state imaging device according to the second embodiment.

FIG. 29 is a cross-sectional view of a third modification of the cross-sectional structure of the solid-state imaging device 1 according to the second embodiment.

In the example depicted in FIG. 29, as compared with FIG. 19 of the first embodiment, a layer different in material from the semiconductor substrate 13 is provided in the electric charge transfer region 322 between the transfer gates 321.

The solid-state imaging device 1 depicted in FIG. 29 further includes a material layer 25. The material layer 25 is provided in the electric charge transfer region 322. Therefore, the material layer 25 is disposed so as to be interposed between the transfer gate 321. Furthermore, the material layer 25 is provided between the photodiode PD and the floating diffusion region 11.

A material of the material layer 25 is higher in mobility of the electric charges than the material of the semiconductor substrate 13 (for example, Si). It is therefore possible to enhance the signal electric charge transfer efficiency. The material of the material layer 25 is, for example, InGaAs or SiGe.

FIGS. 30A to 30E are cross-sectional views of the solid-state imaging device 1 in FIG. 29, depicting an example of a method for manufacturing the solid-state imaging device 1.

First, as in FIG. 20A of the first embodiment, the photodiode PD is formed inside the semiconductor substrate 13.

Figure 30A:
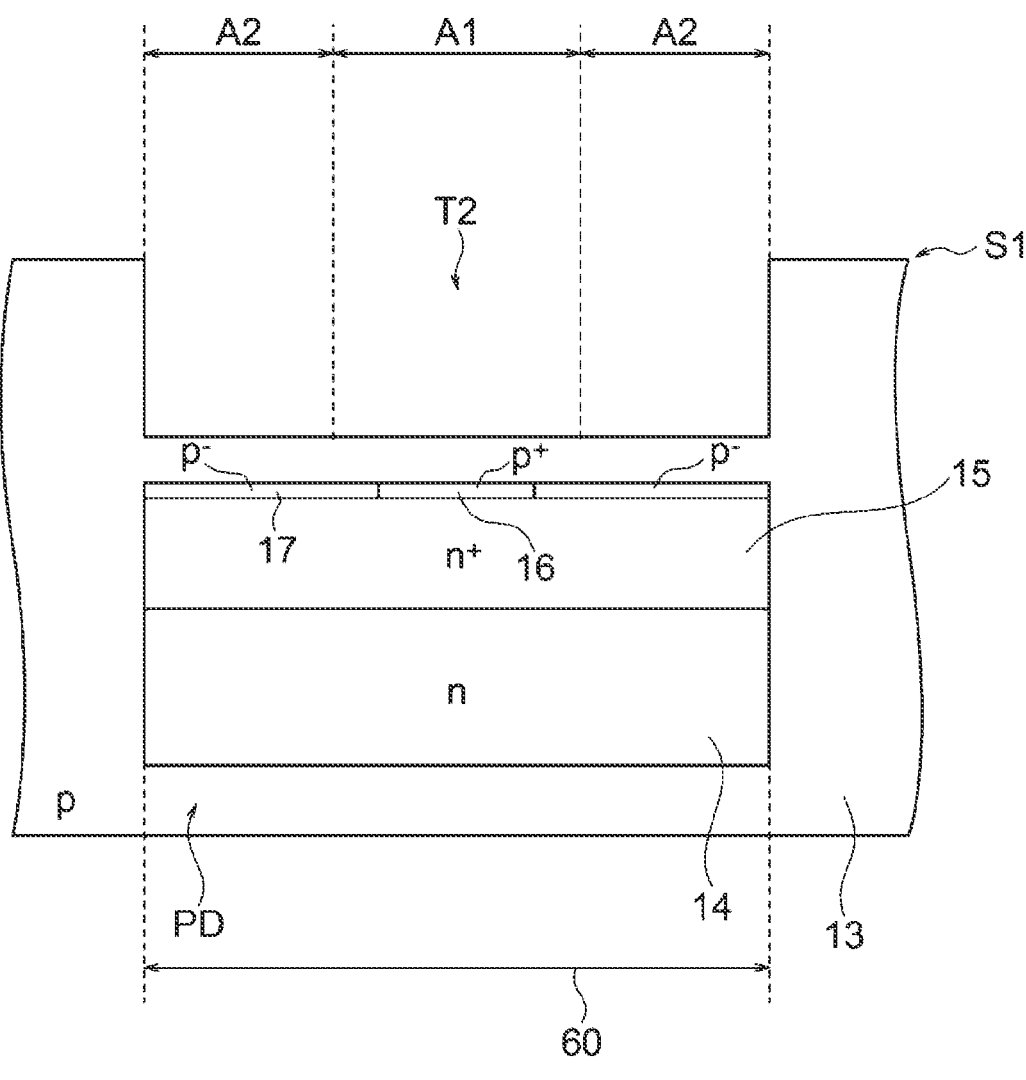
FIG. 30A is a cross-sectional view of the solid-state imaging device in FIG. 29, depicting an example of a method for manufacturing the solid-state imaging device.

Next, as depicted in FIG. 30A, a recess T2 is formed in the one principal surface S1 of semiconductor substrate 13. More specifically, the recess T2 is formed in both the first region A1 and the second regions A2 of the one principal surface S1.

Figure 30B:
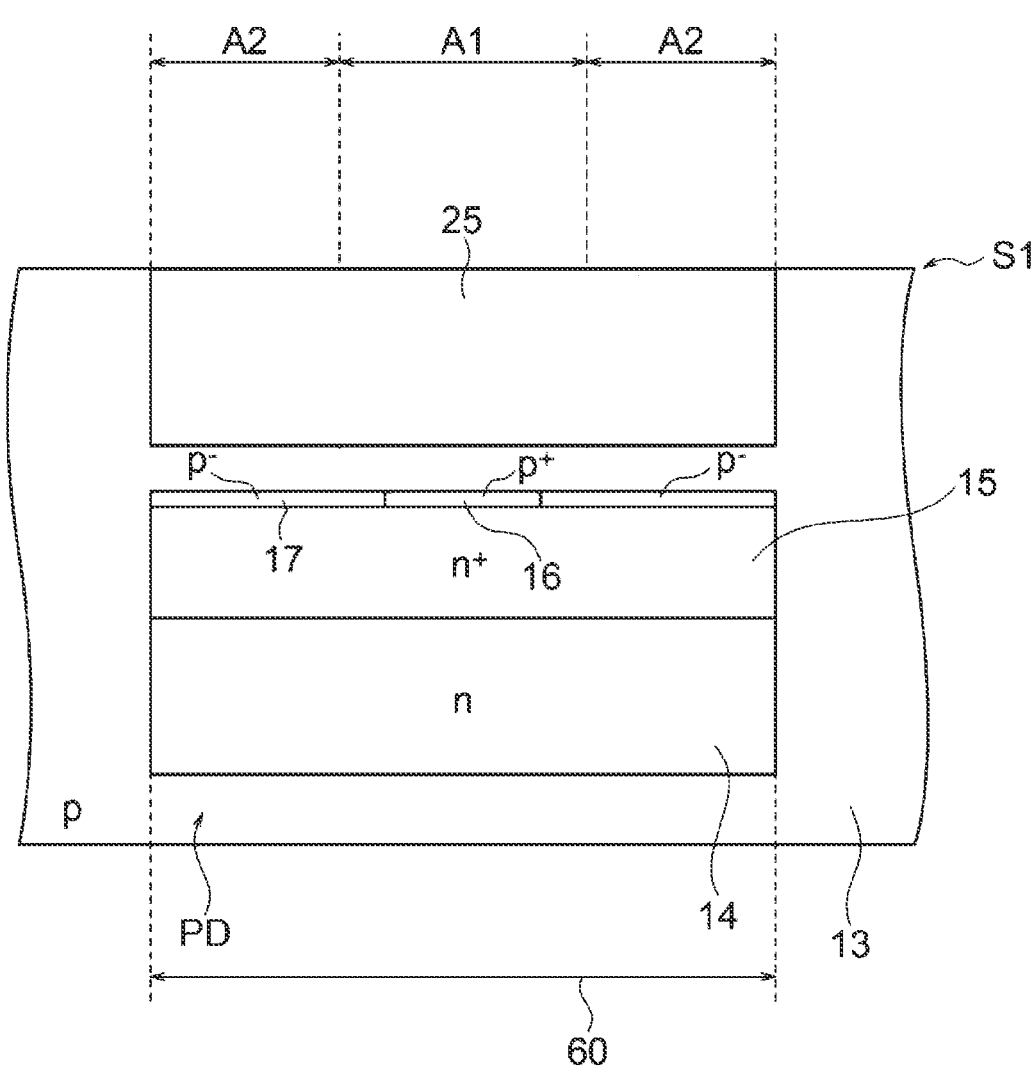
FIG. 30B is a cross-sectional view of the solid-state imaging device, depicting the example of the method for manufacturing the solid-state imaging device, following FIG. 30A.

Next, as depicted in FIG. 30B, the material layer 25 is formed inside the recess T2. The material layer 25 is formed by, for example, chemical vapor deposition (CVD).

Figure 30C:
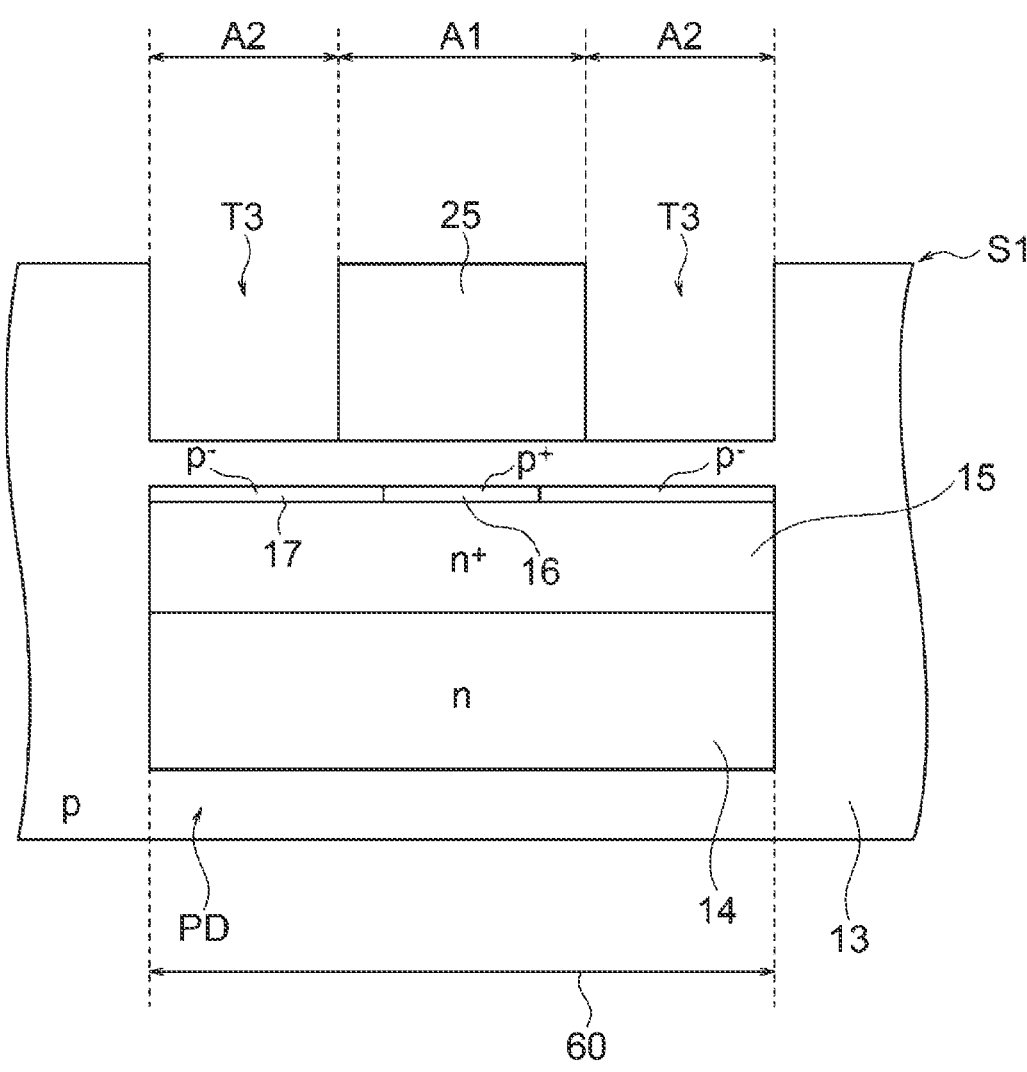
FIG. 30C is a cross-sectional view of the solid-state imaging device, depicting the example of the method for manufacturing the solid-state imaging device, following FIG. 30B.

Next, as depicted in FIG. 30C, a recess T3 is formed in the material layer 25. More specifically, the recess T3 is formed in the second regions A2 of the material layer 25. It is therefore possible to form the recess T3 at the same position as the recess T1 in FIG. 20B of the first embodiment. That is, the material layer 25 containing a material higher in mobility of the electric charges than the material of the semiconductor substrate 13 is formed in the electric charge transfer region 322.

Figure 30D:
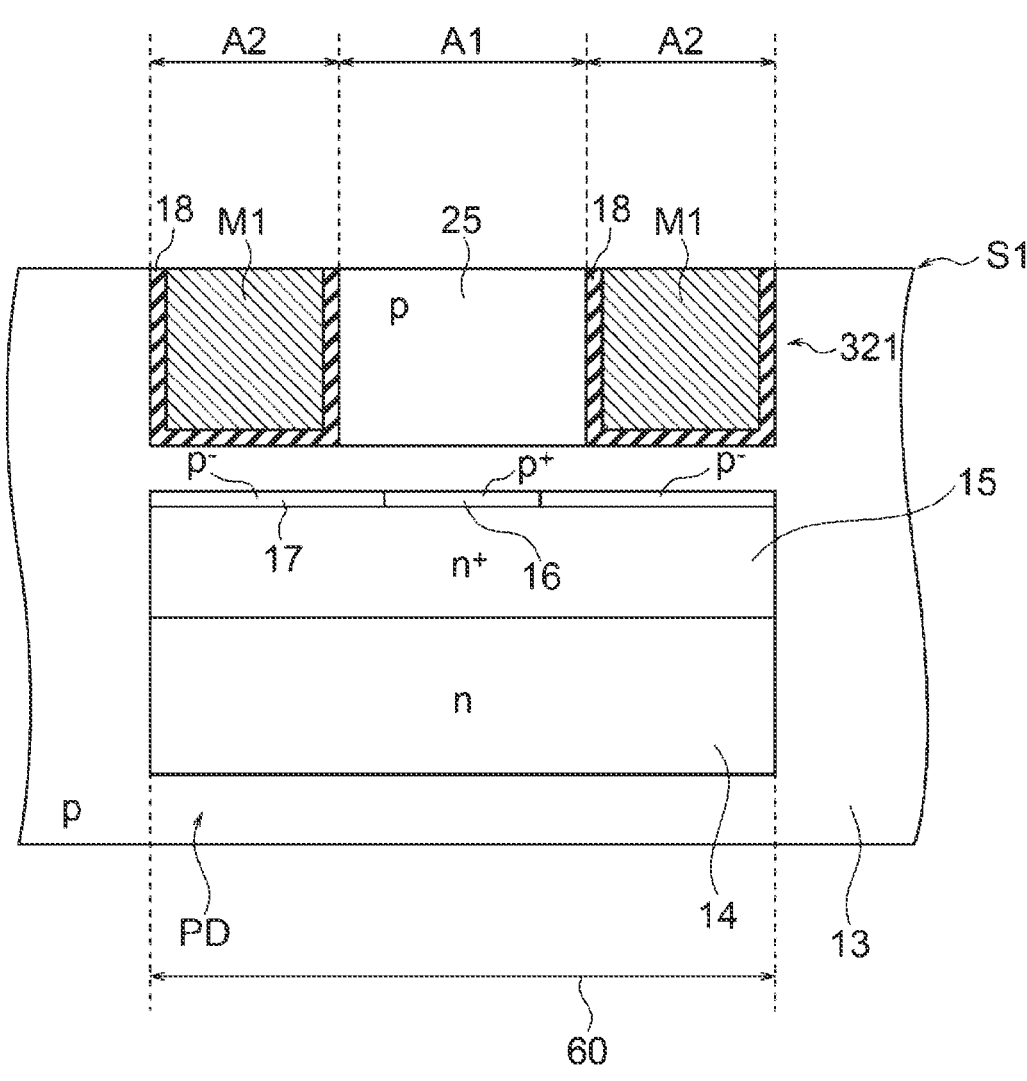
FIG. 30D is a cross-sectional view of the solid-state imaging device, depicting the example of the method for manufacturing the solid-state imaging device, following FIG. 30C.

Next, as depicted in FIG. 30D, the metal layer M1 is formed inside the recess T3. As a result, the transfer gate 321 is formed.

Figure 30E:
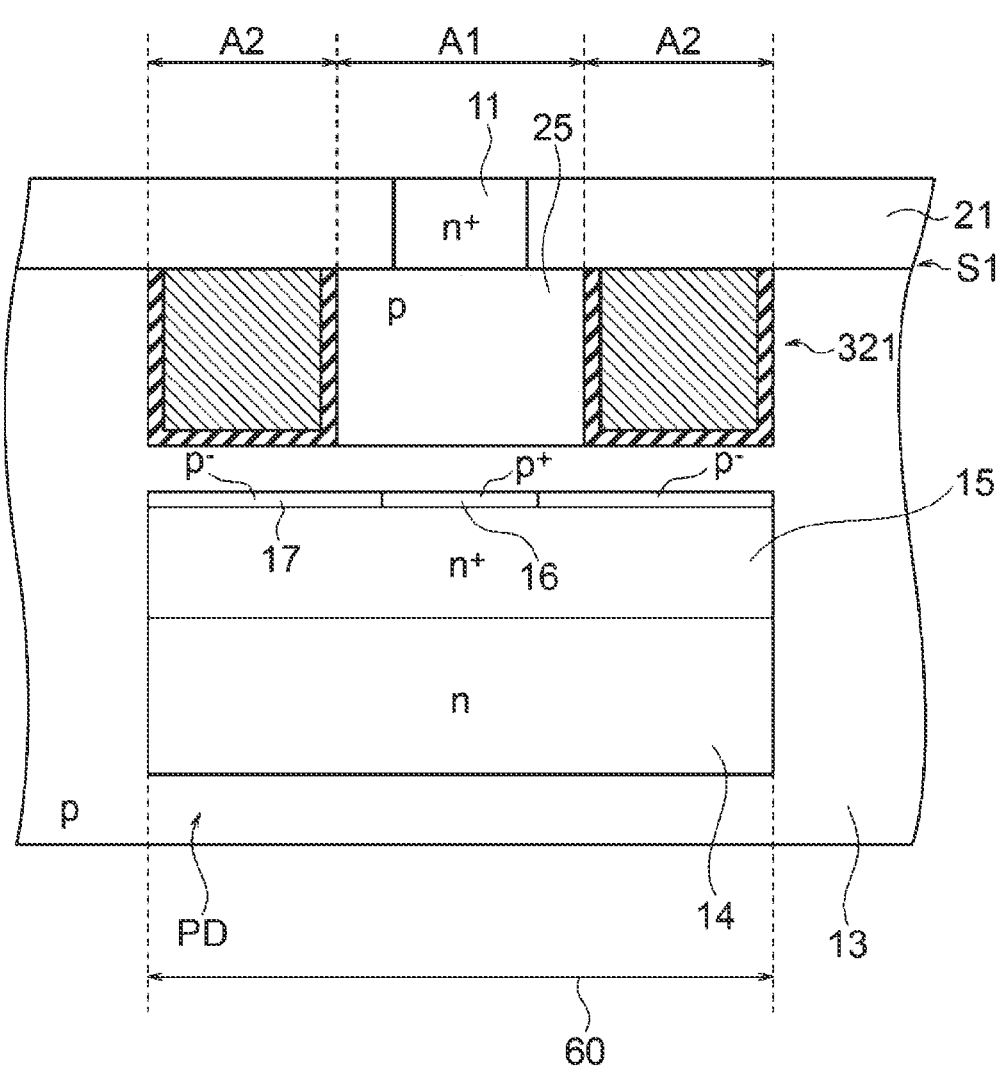
FIG. 30E is a cross-sectional view of the solid-state imaging device, depicting the example of the method for manufacturing the solid-state imaging device, following FIG. 30D.

Next, as depicted in FIG. 30E, the semiconductor layer 21 is formed above the one principal surface S1. Next, the floating diffusion region 11 is formed in the semiconductor layer 21.

Thereafter, the upper layer film 22 is formed above the semiconductor layer 21, and the contacts 23a and 23b are formed, thereby reaching completion of the solid-state imaging device 1 depicted in FIG. 29.

Figure 31:
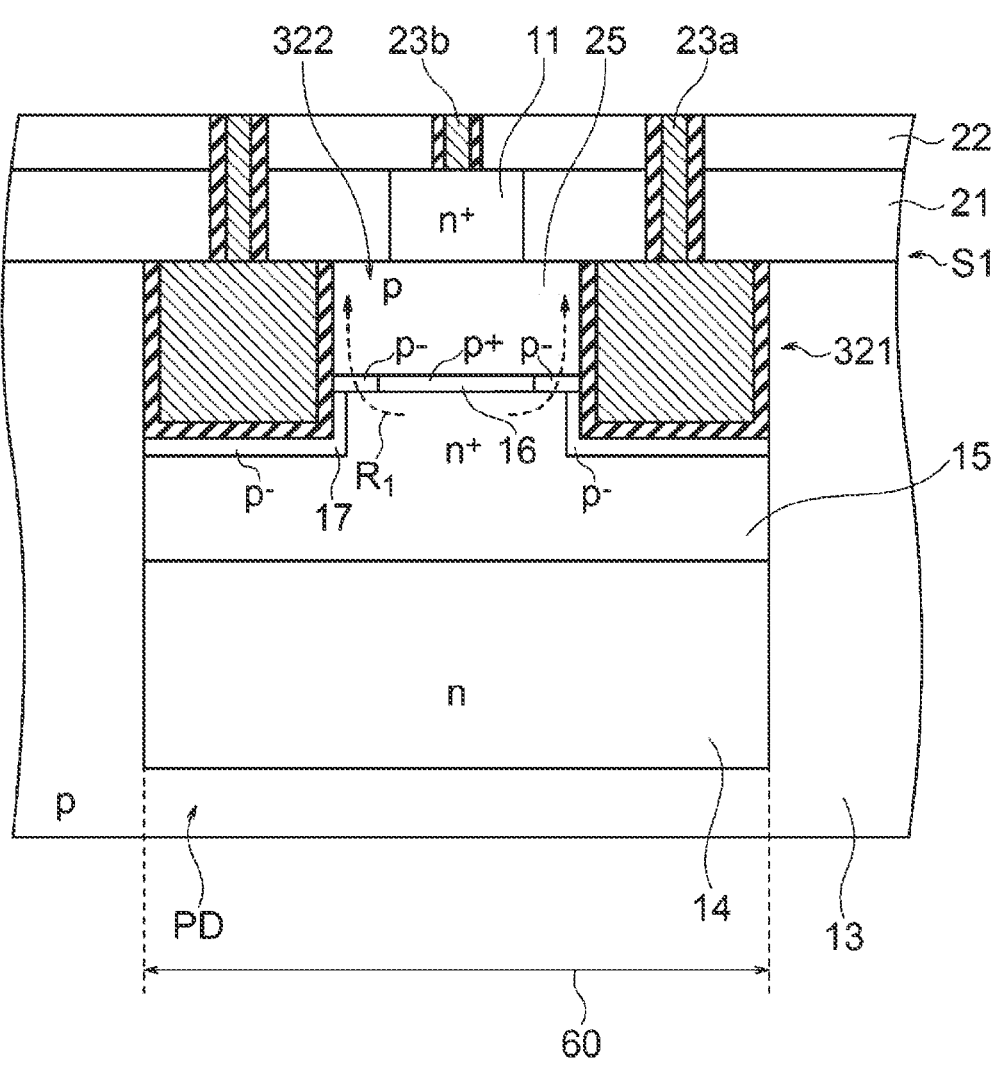
FIG. 31 is a cross-sectional view of a fourth modification of the cross-sectional structure of the solid-state imaging device according to the second embodiment.

FIG. 31 is a cross-sectional view of a fourth modification of the cross-sectional structure of the solid-state imaging device 1 according to the second embodiment.

In the example depicted in FIG. 31, as compared with FIG. 29 of the third modification, the photodiode PD is provided so as to protrude into the electric charge transfer region 322. Therefore, the fourth modification is a combination of the first modification depicted in FIG. 26 and the third modification depicted in FIG. 29.

Figure 32:
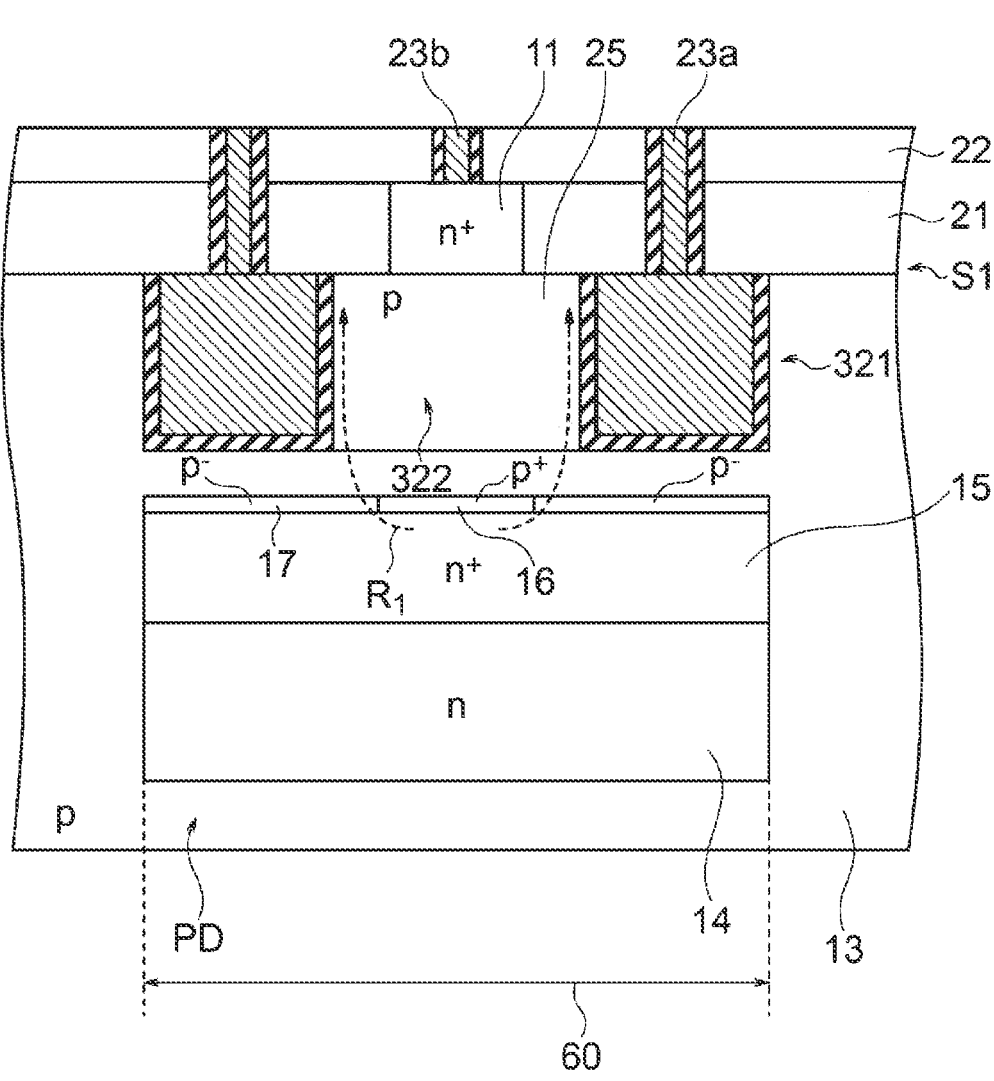
FIG. 32 is a cross-sectional view of a fifth modification of the cross-sectional structure of the solid-state imaging device according to the second embodiment.

FIG. 32 is a cross-sectional view of a fifth modification of the cross-sectional structure of the solid-state imaging device 1 according to the second embodiment.

In the example depicted in FIG. 32, as compared with FIG. 29 of the third modification, the semiconductor layer 21 is different material from the semiconductor substrate 13. The semiconductor layer 21 is, for example, the same in material as the material layer 25. It is therefore possible to enhance the electric charge transfer characteristics in the semiconductor layer 21.

Figure 33:
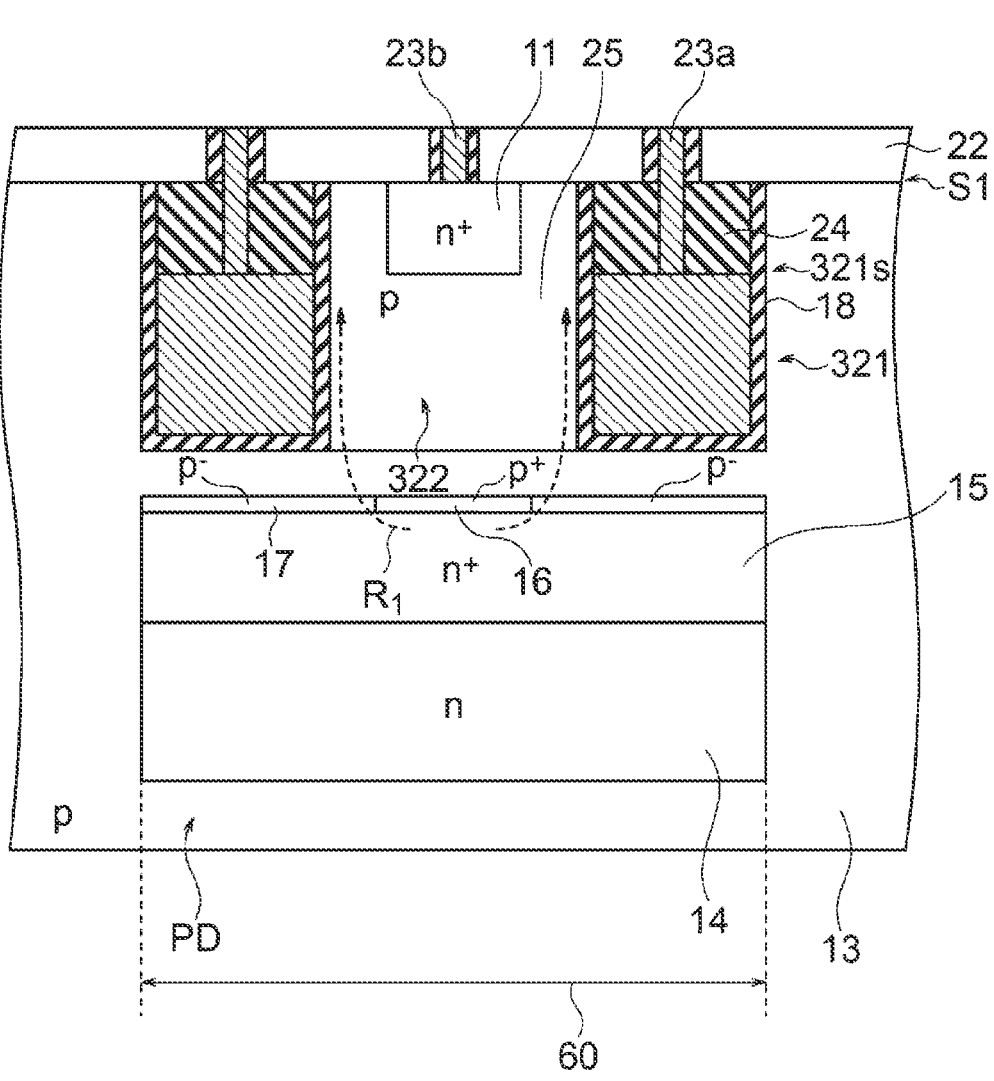
FIG. 33 is a cross-sectional view of a sixth modification of the cross-sectional structure of the solid-state imaging device according to the second embodiment.

FIG. 33 is a cross-sectional view of a sixth modification of the cross-sectional structure of the solid-state imaging device 1 according to the second embodiment.

In the example depicted in FIG. 33, as compared with FIG. 27 of the second modification, a layer different in material from the semiconductor substrate 13 is provided in the electric charge transfer region 322. Therefore, the sixth modification is a combination of the second modification of FIG. 27 and the third modification of FIG. 29. Furthermore, in the example depicted in FIG. 33, the floating diffusion region 11 is provided inside the material layer 25.

FIGS. 34A to 34E are cross-sectional views of the solid-state imaging device 1 in FIG. 33, depicting an example of a method for manufacturing the solid-state imaging device 1.

First, as in FIG. 28A of the second modification, the photodiode PD is formed inside the semiconductor substrate 13.

Figure 34A:
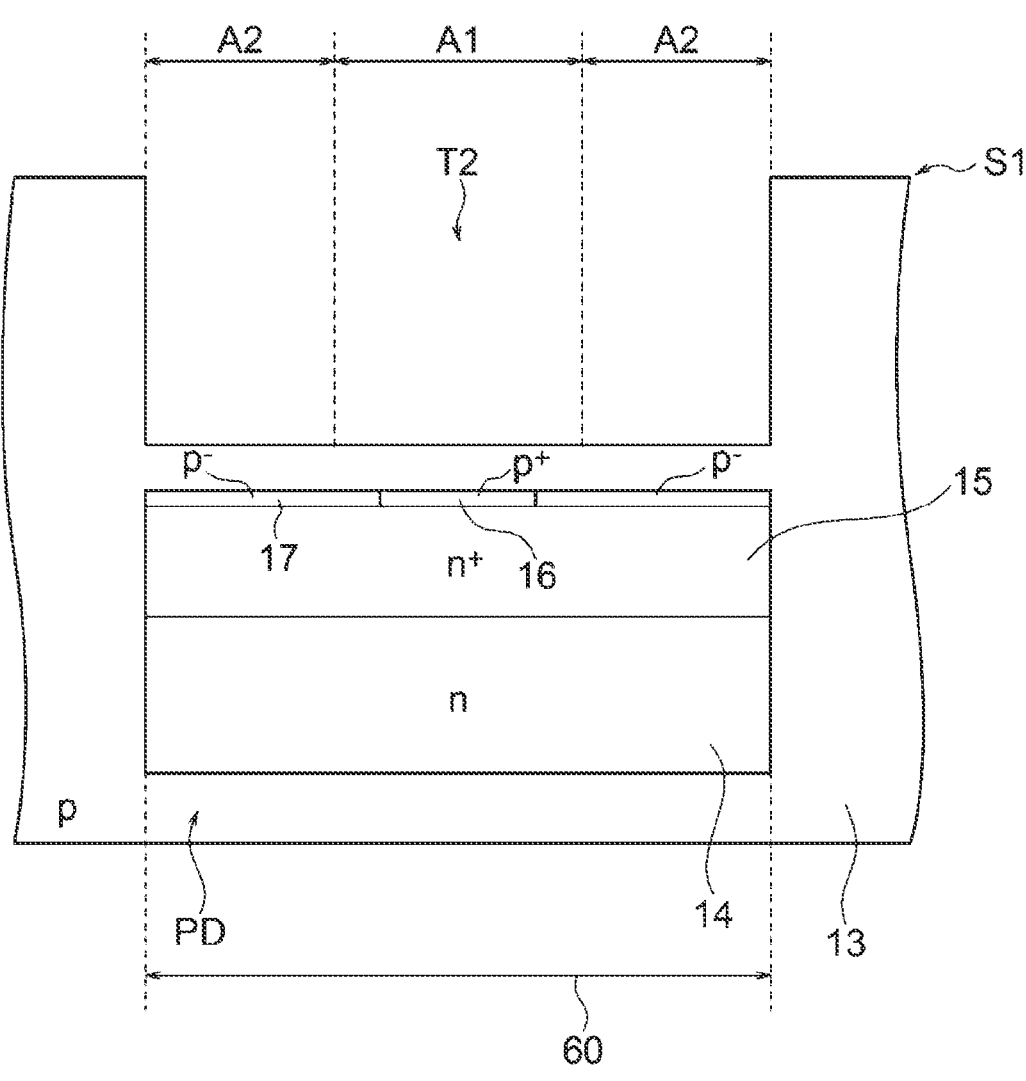
FIG. 34A is a cross-sectional view of the solid-state imaging device in FIG. 33, depicting an example of a method for manufacturing the solid-state imaging device.

Next, as depicted in FIG. 34A, the recess T2 is formed in the one principal surface S1 of semiconductor substrate 13.

Figure 34B:
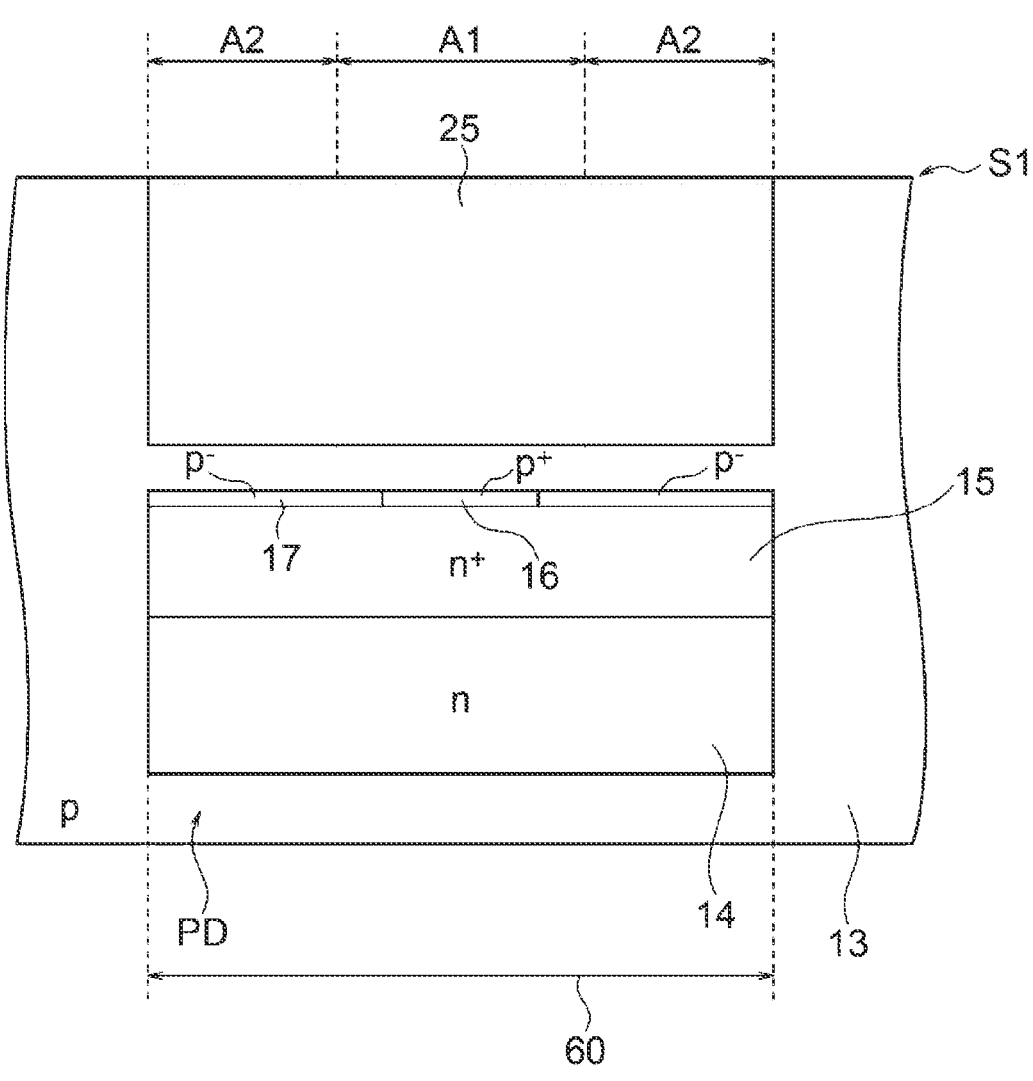
FIG. 34B is a cross-sectional view of the solid-state imaging device, depicting the example of the method for manufacturing the solid-state imaging device, following FIG. 34A.

Next, as depicted in FIG. 34B, the material layer 25 is formed inside the recess T2. The material layer 25 is formed by, for example, CVD.

Figure 34C:
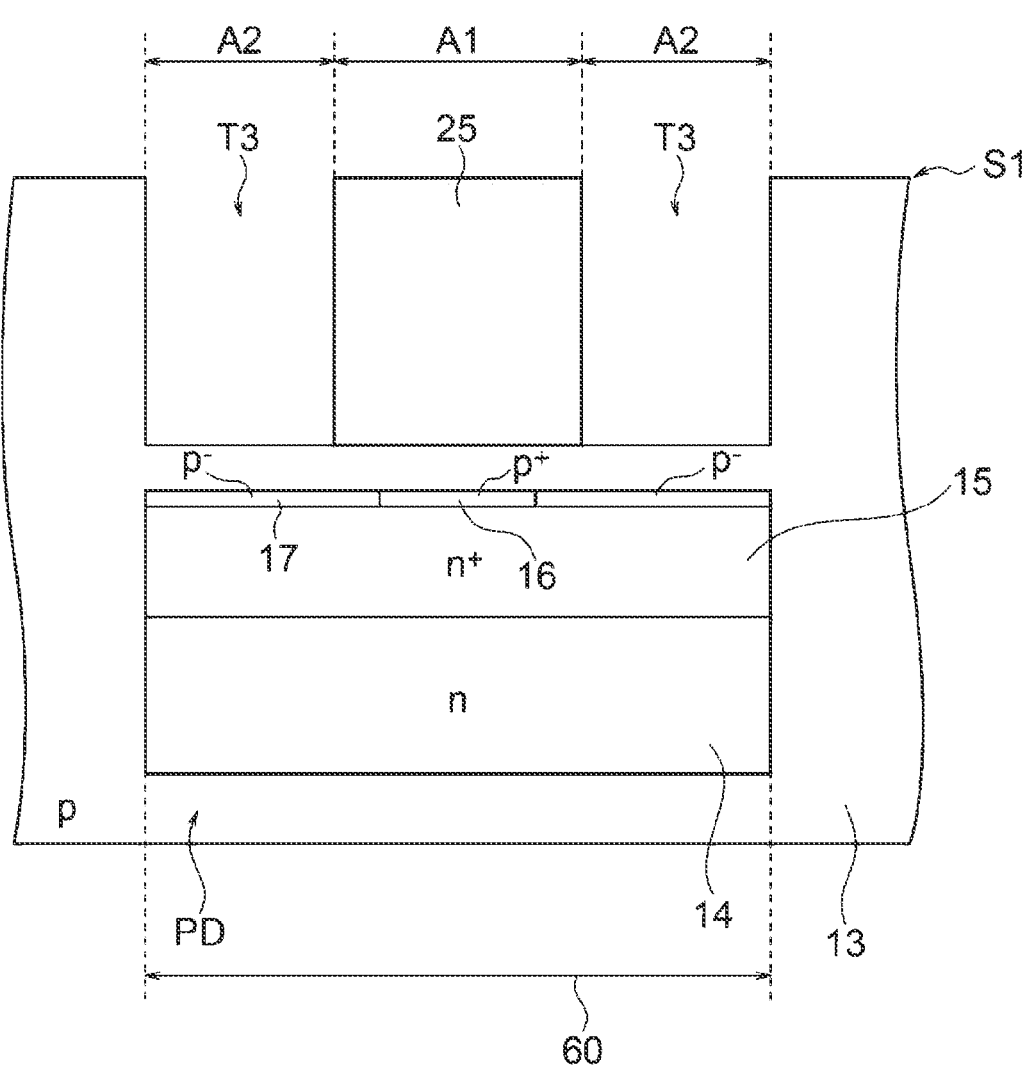
FIG. 34C is a cross-sectional view of the solid-state imaging device, depicting the example of the method for manufacturing the solid-state imaging device, following FIG. 34B.

Next, as depicted in FIG. 34C, the recess T3 is formed in the material layer 25.

Figure 34D:
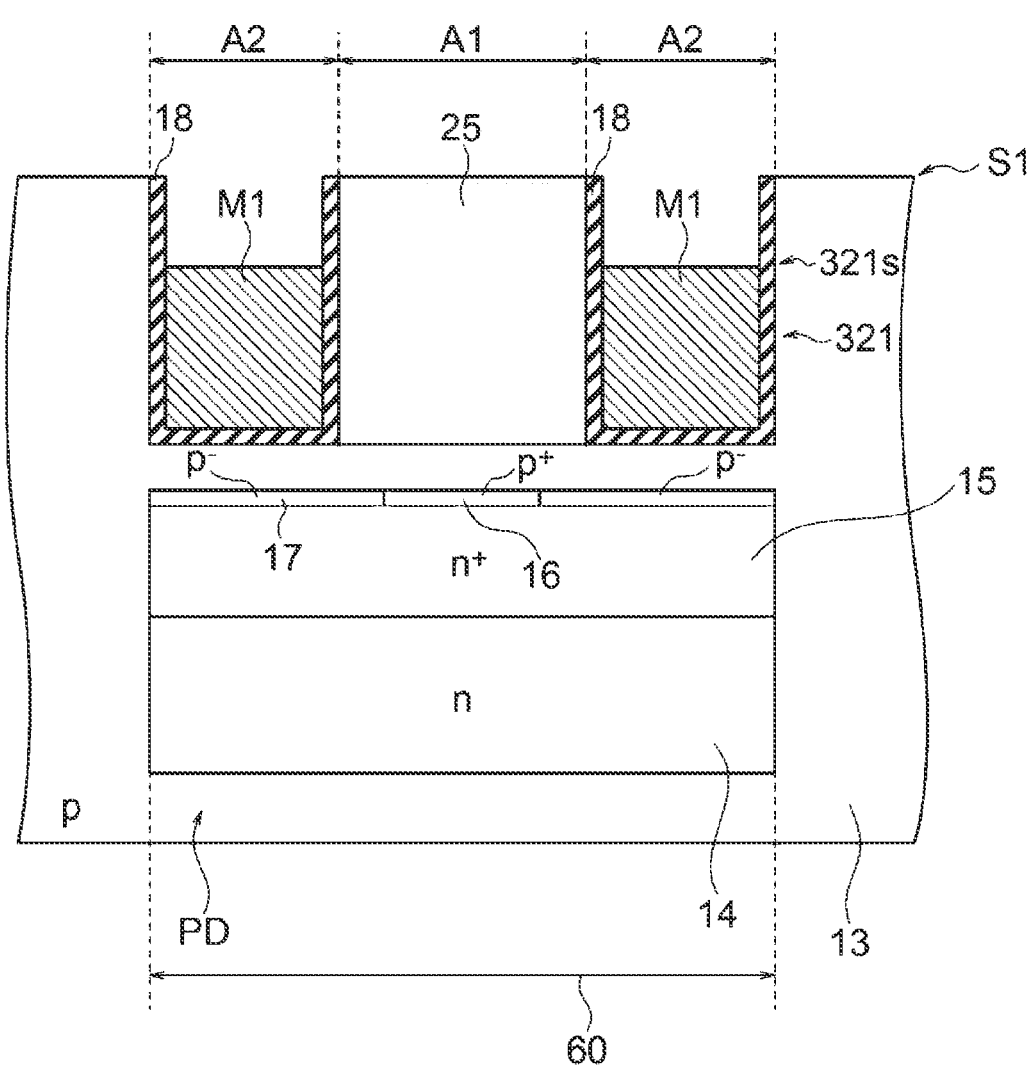
FIG. 34D is a cross-sectional view of the solid-state imaging device, depicting the example of the method for manufacturing the solid-state imaging device, following FIG. 34C.

Next, as depicted in FIG. 34D, the metal layer M1 is formed inside the recess T3. More specifically, the metal layer M1 is formed so as to fill the recess T3 up to a predetermined height lower than the one principal surface S1. As a result, the transfer gate 321 is formed at a position deeper than the one principal surface S1.

Figure 34E:
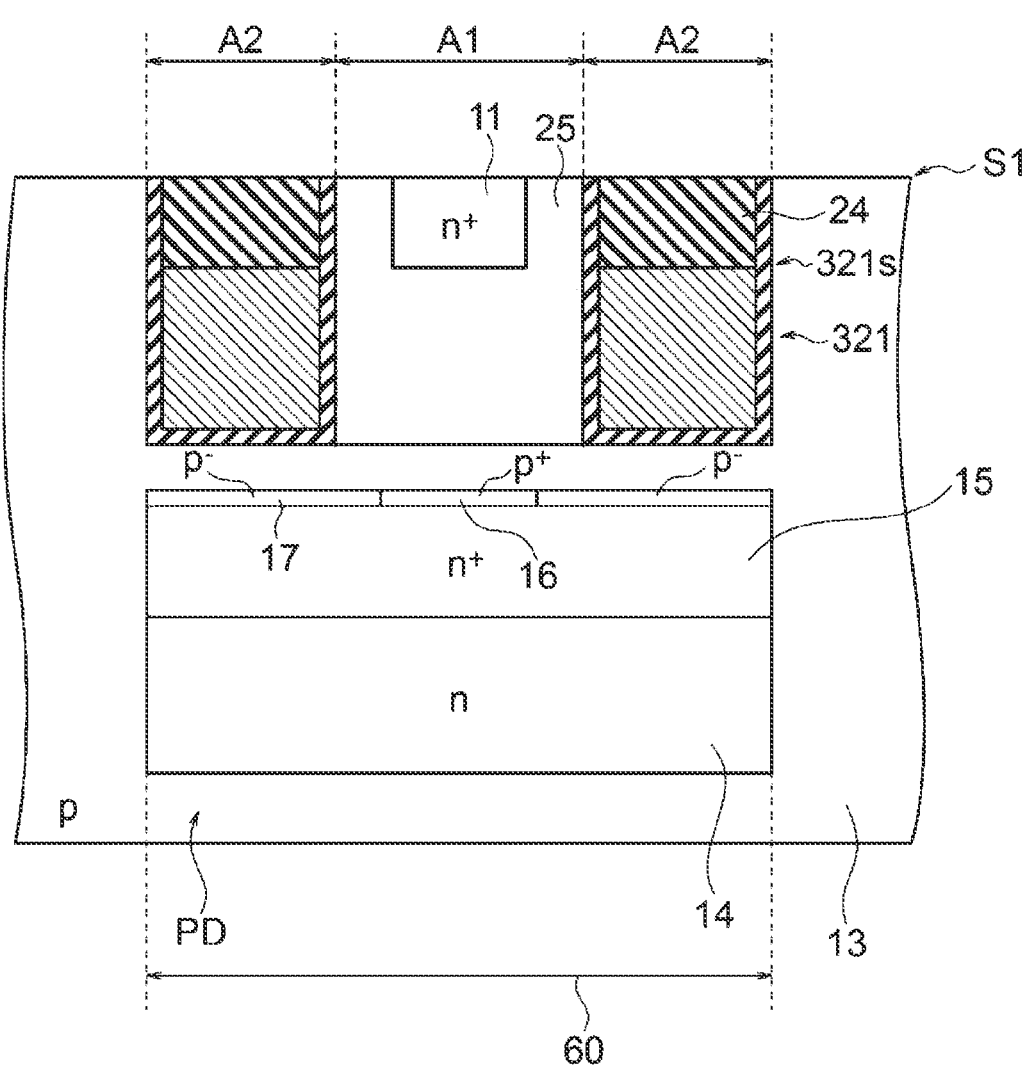
FIG. 34E is a cross-sectional view of the solid-state imaging device, depicting the example of the method for manufacturing the solid-state imaging device, following FIG. 34D.

Next, as depicted in FIG. 34E, the insulating layer 24 is formed above the transfer gate 321 so as to fill the recess T3 up to the one principal surface S1. Next, the floating diffusion region 11 is formed in the first region A1 where the material layer 25 is disposed.

Thereafter, the upper layer film 22 is formed above the one principal surface S1, and the contacts 23a and 23b are formed, thereby reaching completion of the solid-state imaging device 1 depicted in FIG. 33.

Note that, in the second embodiment, the combination of the modifications is not limited to the above-described examples.

The solid-state imaging device 1 according to the present embodiment may be used as a front-side illumination solid-state imaging device in which the front surface side of the semiconductor substrate 13 is illuminated with light, or may be used as a back-side illumination solid-state imaging device in which the back surface side of the semiconductor substrate 13 is illuminated with light. In a case of the front-side illumination, light impinges on the front surface side of the semiconductor substrate 13 through the on-chip lens, a color filter film, and the like, and in a case of the back-side illumination, light impinges on the back surface side of the semiconductor substrate 13 through the on-chip lens, the color filter film, and the like.

<Application Example to Moving Object>

The technology according to the present disclosure (present technology) is applicable to various products. For example, the technology according to the present disclosure may be implemented as a device installed on any type of moving object such as an automobile, an electric automobile, a hybrid electric automobile, a motorcycle, a bicycle, a personal transporter, a plane, a drone, a ship, and a robot.

Figure 35:
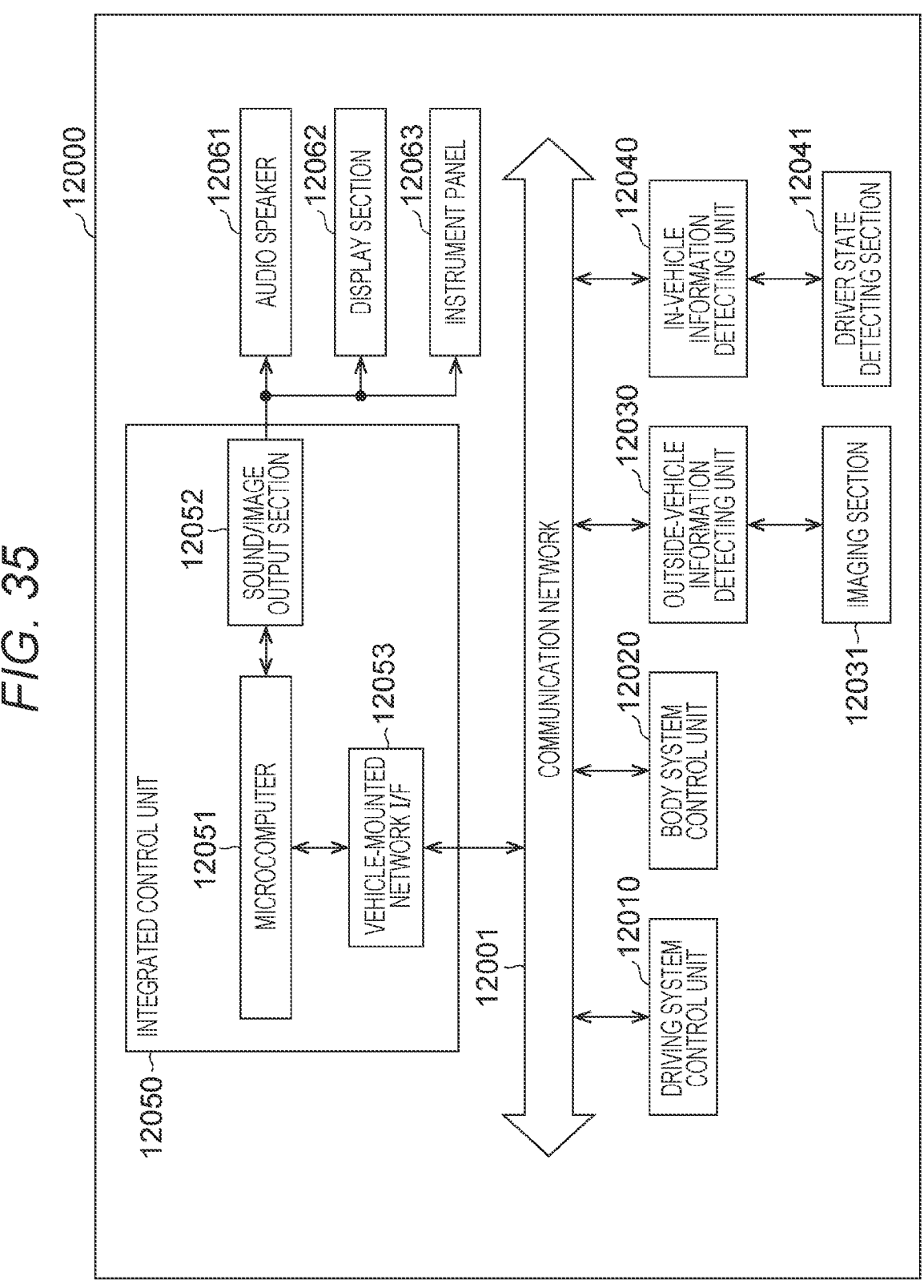
FIG. 35 is a block diagram depicting an example of schematic configuration of a vehicle control system.

FIG. 35 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 35, the vehicle control system 12000 includes a driving system control unit 12010, a body system control unit 12020, an outside-vehicle information detecting unit 12030, an in-vehicle information detecting unit 12040, and an integrated control unit 12050. Furthermore, a microcomputer 12051, a sound/image output section 12052, and a vehicle-mounted network interface (I/F) 12053 are depicted as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

Furthermore, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 35, an audio speaker 12061, a display section 12062, and an instrument panel 12063 are illustrated as the output device. The display section 12062 may, for example, include at least one of an on-board display and a head-up display.

Figure 36:
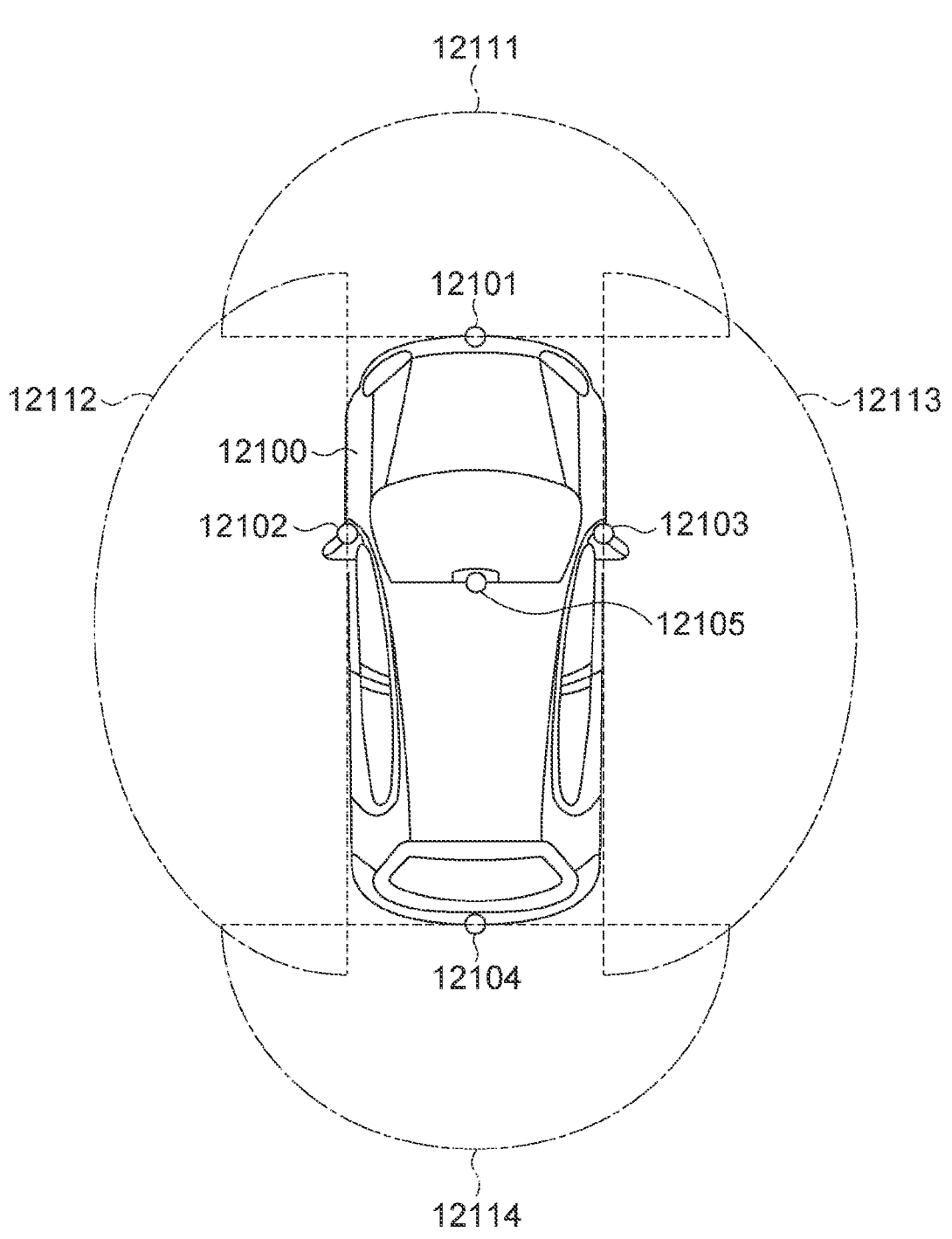
FIG. 36 is a diagram of assistance in explaining an example of installation positions of an outside-vehicle information detecting section and an imaging section.

FIG. 36 is a diagram depicting an example of the installation position of the imaging section 12031.

In FIG. 36, a vehicle 12100 includes imaging sections 12101, 12102, 12103, 12104, 12105 as the imaging section 12031.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The images of the front view acquired by the imaging sections 12101 and 12105 are mainly used for detecting a preceding vehicle, a pedestrian, an obstacle, a traffic light, a traffic sign, a lane, or the like.

Note that FIG. 36 depicts an example of respective imaging ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure is applicable has been described above. The technology according to the present disclosure is applicable to, for example, the imaging sections 12031, 12101, 12102, 12103, 12104, 12105, the driver state detecting section 12041, and the like, among the above-described configurations. Specifically, the solid-state imaging device 1 of the present disclosure is applicable to such imaging sections and detection sections, for example. Then, applying the technology according to the present disclosure makes it possible to suppress deterioration of imaging exceptions, so that it is possible to achieve safer vehicle travel.

Note that the present technology may have the following configurations.

(1) A solid-state imaging device including:

a photoelectric conversion section provided inside a semiconductor substrate, the photoelectric conversion section being configured to generate electric charges in accordance with an amount of received light;

a plurality of vertical transfer gates arranged between the photoelectric conversion section and one principal surface of the semiconductor substrate in a depth direction of the semiconductor substrate and spaced apart from each other in a direction along a substrate surface of the semiconductor substrate, the plurality of vertical transfer gates each being configured to control transfer of the electric charges generated by the photoelectric conversion section; and an electric charge storage section disposed between the plurality of vertical transfer gates, the electric charge storage section being configured to store the electric charges transferred by the plurality of vertical transfer gates.

(2) The solid-state imaging device according to (1), further including a plurality of planar transfer gates arranged on the one principal surface of the semiconductor substrate along the one principal surface, the plurality of planar transfer gates being each electrically connected to a corresponding one of the plurality of vertical transfer gates.

(3) The solid-state imaging device according to (2), in which the plurality of planar transfer gates is arranged to electrically connect to each other so as to cover at least a part of an outer periphery of the electric charge storage section as viewed from a normal direction of the substrate surface of the semiconductor substrate.

(4) The solid-state imaging device according to (3), in which as viewed from the normal direction, an outer edge of the plurality of planar transfer gates electrically connected to each other has a polygonal shape.

(5) A solid-state imaging device including:

a photoelectric conversion section provided inside a semiconductor substrate, the photoelectric conversion section being configured to generate electric charges in accordance with an amount of received light;

a plurality of transfer gates arranged between the photoelectric conversion section and one principal surface of the semiconductor substrate in a depth direction of the semiconductor substrate and spaced apart from each other in a direction along a substrate surface of the semiconductor substrate, the plurality of vertical transfer gates each being configured to control transfer of the electric charges generated by the photoelectric conversion section, the plurality of vertical transfer gates being arranged apart from each other with an electric charge transfer region through which the electric charges generated by the photoelectric conversion section are transferred interposed between the plurality of vertical transfer gates; and an electric charge storage section disposed adjacent to the one principal surface of the semiconductor substrate relative to the plurality of vertical transfer gates, the electric charge storage section being configured to store the electric charges transferred from the electric charge transfer region.

(6) The solid-state imaging device according to (5), further including a semiconductor layer disposed on a side of the one principal surface remote from the plurality of vertical transfer gates, in which the electric charge storage section is disposed inside the semiconductor layer.

(7) The solid-state imaging device according to (6), in which a crystal orientation of a semiconductor crystal of the semiconductor layer corresponds to a crystal orientation of a semiconductor crystal of the semiconductor substrate.

(8) The solid-state imaging device according to (5), in which the plurality of vertical transfer gates is arranged at positions deeper than the one principal surface in the semiconductor substrate, and the electric charge storage section is disposed between the one principal surface and surfaces of the plurality of vertical transfer gates adjacent to the one principal surface.

(9) The solid-state imaging device according to any one of (5) to (8), in which the photoelectric conversion section is provided so as to partially protrude into the electric charge transfer region between the plurality of vertical transfer gates.

(10) The solid-state imaging device according to any one of (5) to (9), in which a material of the electric charge transfer region is higher in mobility of the electric charges than a material of the semiconductor substrate.

(11) The solid-state imaging device according to any one of (5) to (10), in which the plurality of vertical transfer gates is arranged to electrically connect to each other so as to cover at least a part of an outer periphery of the electric charge storage section as viewed from a normal direction of the substrate surface of the semiconductor substrate.

(12) The solid-state imaging device according to any one of (1) to (11), in which the electric charge storage section is disposed inside an outer edge of the photoelectric conversion section as viewed from a normal direction of the substrate surface of the semiconductor substrate.

(13) The solid-state imaging device according to (12), in which the electric charge storage section is disposed approximately at a center of the photoelectric conversion section as viewed from the normal direction.

(14) The solid-state imaging device according to any one of (1) to (13), in which the electric charge storage section and the plurality of vertical transfer gates are provided for each photoelectric conversion section.

(15) A method for manufacturing a solid-state imaging device, the method including:

forming a photoelectric conversion section inside a semiconductor substrate, the photoelectric conversion section being configured to generate electric charges in accordance with an amount of received light;

forming a plurality of transfer gates arranged between the photoelectric conversion section and one principal surface of the semiconductor substrate in a depth direction of the semiconductor substrate and spaced apart from each other in a direction along a substrate surface of the semiconductor substrate, the plurality of vertical transfer gates each being configured to control transfer of the electric charges generated by the photoelectric conversion section, the plurality of vertical transfer gates being arranged apart from each other with an electric charge transfer region through which the electric charges generated by the photoelectric conversion section are transferred interposed between the plurality of vertical transfer gates; and

forming an electric charge storage section disposed adjacent to the one principal surface of the semiconductor substrate relative to the plurality of vertical transfer gates, the electric charge storage section being configured to store the electric charges transferred from the electric charge transfer region.

(16) The method for manufacturing a solid-state imaging device according to (15), the method further including:

forming, before forming the electric charge storage section, a semiconductor layer disposed on a side of the one principal surface remote from the plurality of vertical transfer gates; and forming the electric charge storage section inside the semiconductor layer.

(17) The method for manufacturing a solid-state imaging device according to (16), the method further including epitaxially growing a semiconductor crystal to form the semiconductor layer.

(18) The method for manufacturing a solid-state imaging device according to (15), the method further including: forming the plurality of vertical transfer gates at positions deeper than the one principal surface in the semiconductor substrate; and forming, after forming the plurality of vertical transfer gates, the electric charge storage section between the one principal surface and surfaces of the plurality of vertical transfer gates adjacent to the one principal surface.

(19) The method for manufacturing a solid-state imaging device according to any one of (15) to (18), the method further including forming, before forming the plurality of transfer gates, a material layer higher in mobility of the electric charges than a material of the semiconductor substrate in the electric charge transfer region.

(20) The method for manufacturing a solid-state imaging device according to any one of (15) to (19), the method further including forming the plurality of vertical transfer gates arranged to electrically connect to each other so as to cover an outer periphery of the electric charge storage section as viewed from a normal direction of the substrate surface of the semiconductor substrate.

(21) The method for manufacturing a solid-state imaging device according to any one of (15) to (20), the method further including forming the electric charge storage section inside an outer edge of the photoelectric conversion section as viewed from a normal direction of the semiconductor substrate.

(22) The method for manufacturing a solid-state imaging device according to any one of (15) to (21), the method further including forming the photoelectric conversion section by ion implantation.

Aspects of the present disclosure are not limited to the above-described individual embodiments, and include various modifications that can be conceived by those skilled in the art, and the effects of the present disclosure are not limited to the above-described contents. That is, various additions, modifications, and partial deletions can be made without departing from the conceptual idea and spirit of the present disclosure derived from the contents set forth in the claims and equivalents thereof.

REFERENCE SIGNS LIST

1 Solid-state imaging device
2 Pixel
11 Floating diffusion region
12a to 12d Vertical gate electrode
13 Semiconductor substrate
19 Planar gate electrode

30

21 Semiconductor layer
23a to 23b Contact
24 Insulating layer
25 Material layer
32 Transfer transistor
321 Transfer gate
321s Upper surface
322 Electric charge transfer region
33 FD section
60 Photodiode region
A1 First region
A2 Second region
PD Photodiode
S1 One principal surface
T1 to T3 Recess

What is claimed is:

1. A solid-state imaging device, comprising:
a photoelectric conversion section provided inside a semiconductor substrate, wherein the photoelectric conversion section is configured to generate electric charges in accordance with an amount of received light;
a plurality of vertical transfer gates arranged between the photoelectric conversion section and one principal surface of the semiconductor substrate in a depth direction of the semiconductor substrate and spaced apart from each other in a direction along the one principal surface of the semiconductor substrate, wherein the plurality of vertical transfer gates are each configured to control transfer of the electric charges generated by the photoelectric conversion section, and wherein the one principal surface is opposite a back surface of the semiconductor substrate;
an electric charge storage section disposed between the plurality of vertical transfer gates, the electric charge storage section being configured to store the electric charges transferred by the plurality of vertical transfer gates; and
a plurality of planar transfer gates, wherein the planar transfer gates are disposed on the one principal surface of the semiconductor substrate.

2. The solid-state imaging device according to claim 1, wherein each planar transfer gate in the plurality of planar transfer gates is electrically connected to a corresponding one of the plurality of vertical transfer gates.

3. The solid-state imaging device according to claim 2, wherein the plurality of planar transfer gates is arranged to electrically connect to each other so as to cover at least a part of an outer periphery of the electric charge storage section as viewed from a normal direction of the substrate surface of the semiconductor substrate.

4. The solid-state imaging device according to claim 3, wherein, as viewed from the normal direction, an outer edge of the plurality of planar transfer gates arranged to electrically connect to each other so as to cover the outer periphery of the electric charge storage section has a polygonal shape.

5. The solid-state imaging device according to claim 1, wherein the electric charge storage section is disposed inside an outer edge of the photoelectric conversion section as viewed from a normal direction of the substrate surface of the semiconductor substrate.

6. The solid-state imaging device according to claim 5, wherein the electric charge storage section is disposed approximately at a center of the photoelectric conversion section as viewed from the normal direction.

7. The solid-state imaging device according to claim 1, wherein the electric charge storage section and the plurality of vertical transfer gates are provided for each photoelectric conversion section.

8. A solid-state imaging device, comprising:

a photoelectric conversion section provided inside a semiconductor substrate, wherein the photoelectric conversion section is configured to generate electric charges in accordance with an amount of received light;

a plurality of vertical transfer gates arranged between the photoelectric conversion section and one principal surface of the semiconductor substrate in a depth direction of the semiconductor substrate, wherein the vertical transfer gates are spaced apart from each other in a direction along the one principal surface of the semiconductor substrate, wherein the plurality of vertical transfer gates are configured to control transfer of the electric charges generated by the photoelectric conversion section, wherein an electric charge transfer region through which the electric charges generated by the photoelectric conversion section are transferred is interposed between the vertical transfer gates in the plurality of vertical transfer gates, wherein the one principal surface is opposite a back surface of the semiconductor substrate, wherein the vertical transfer gates extend from the one principal surface to a point between the one principal surface and the photoelectric conversion section in the depth direction, and wherein the vertical transfer gates are spaced apart from the photoelectric conversion section in the depth direction of the semiconductor substrate; and an electric charge storage section disposed adjacent to the one principal surface of the semiconductor substrate relative to the plurality of vertical transfer gates, wherein the electric charge storage section is configured to store the electric charges transferred from the electric charge transfer region.

9. The solid-state imaging device according to claim 8, further comprising a semiconductor layer disposed on a side of the one principal surface remote from the plurality of vertical transfer gates, wherein the electric charge storage section is disposed inside the semiconductor layer.

10. The solid-state imaging device according to claim 9, wherein a crystal orientation of a semiconductor crystal of the semiconductor layer corresponds to a crystal orientation of a semiconductor crystal of the semiconductor substrate.

11. The solid-state imaging device according to claim 8, wherein the plurality of vertical transfer gates is arranged at positions deeper than the one principal surface in the semiconductor substrate, and the electric charge storage section is disposed between the one principal surface and surfaces of the plurality of vertical transfer gates adjacent to the one principal surface.

12. The solid-state imaging device according to claim 8, wherein the photoelectric conversion section is provided so as to partially protrude into the electric charge transfer region between the plurality of vertical transfer gates.

13. The solid-state imaging device according to claim 8, wherein a material of the electric charge transfer region is higher in mobility of the electric charges than a material of the semiconductor substrate.

14. The solid-state imaging device according to claim 8, wherein the plurality of vertical transfer gates is arranged to electrically connect to each other so as to cover at least a part of an outer periphery of the electric charge storage section as viewed from a normal direction of the substrate surface of the semiconductor substrate.

15. A method for manufacturing a solid-state imaging device, the method comprising:

forming a photoelectric conversion section inside a semiconductor substrate, wherein the photoelectric conversion section is configured to generate electric charges in accordance with an amount of received light;

forming a plurality of vertical transfer gates arranged between the photoelectric conversion section and one principal surface of the semiconductor substrate in a depth direction of the semiconductor substrate, wherein the vertical transfer gates are spaced apart from each other in a direction along the one principal surface of the semiconductor substrate, wherein the plurality of vertical transfer gates are configured to control transfer of the electric charges generated by the photoelectric conversion section, wherein an electric charge transfer region through which the electric charges generated by the photoelectric conversion section are transferred is interposed between the vertical transfer gates in the plurality of vertical transfer gates, wherein the one principal surface is opposite a back surface of the semiconductor substrate, wherein the vertical transfer gates extend from the one principal surface to a point between the one principal surface and the photoelectric conversion section in the depth direction, and wherein the vertical transfer gates are spaced apart from the photoelectric conversion section in the depth direction of the semiconductor substrate; and forming an electric charge storage section disposed adjacent to the one principal surface of the semiconductor substrate relative to the plurality of vertical transfer gates, wherein the electric charge storage section is configured to store the electric charges transferred from the electric charge transfer region.

16. The method for manufacturing a solid-state imaging device according to claim 15, the method further comprising:

forming, before forming the electric charge storage section, a semiconductor layer disposed on a side of the one principal surface remote from the plurality of vertical transfer gates; and forming the electric charge storage section inside the semiconductor layer.

17. The method for manufacturing a solid-state imaging device according to claim 16, the method further comprising epitaxially growing a semiconductor crystal to form the semiconductor layer.

18. The method for manufacturing a solid-state imaging device according to claim 15, the method further comprising: forming the plurality of vertical transfer gates at positions deeper than the one principal surface in the semiconductor substrate; and forming, after forming the plurality of vertical transfer gates, the electric charge storage section between the one principal surface and surfaces of the plurality of vertical transfer gates adjacent to the one principal surface.

19. The method for manufacturing a solid-state imaging device according to claim 15, the method further comprising forming, before forming the plurality of transfer gates, a material layer higher in mobility of the electric charges than a material of the semiconductor substrate in the electric charge transfer region.

20. The method for manufacturing a solid-state imaging device according to claim 15, the method further comprising forming the plurality of vertical transfer gates arranged to electrically connect to each other so as to cover at least a part of an outer periphery of the electric charge storage section as viewed from a normal direction of the substrate surface of the semiconductor substrate.

21. The method for manufacturing a solid-state imaging device according to claim 15, the method further comprising forming the electric charge storage section inside an outer edge of the photoelectric conversion section as viewed from a normal direction of the semiconductor substrate.

22. The method for manufacturing a solid-state imaging device according to claim 15, the method further comprising forming the photoelectric conversion section by ion implantation.

* * * * *